US008575686B2

(12) United States Patent
Masuoka et al.

(10) Patent No.: US 8,575,686 B2
(45) Date of Patent: Nov. 5, 2013

(54) NONVOLATILE SEMICONDUCTOR MEMORY TRANSISTOR, NONVOLATILE SEMICONDUCTOR MEMORY, AND METHOD FOR MANUFACTURING NONVOLATILE SEMICONDUCTOR MEMORY

(75) Inventors: Fujio Masuoka, Tokyo (JP); Hiroki Nakamura, Tokyo (JP)

(73) Assignee: Unisantis Electronics Singapore Pte Ltd., Peninsula Plaza (SG)

( * ) Notice: Subject to any disclaimer, the term of this patent is extended or adjusted under 35 U.S.C. 154(b) by 0 days.

(21) Appl. No.: 13/114,681

(22) Filed: May 24, 2011

(65) Prior Publication Data

US 2011/0303966 A1 Dec. 15, 2011

Related U.S. Application Data

(60) Provisional application No. 61/353,303, filed on Jun. 10, 2010.

(30) Foreign Application Priority Data

Jun. 10, 2010 (JP) ................................ 2010-133057

(51) Int. Cl.
*H01L 29/66* (2006.01)

(52) U.S. Cl.
USPC ............ 257/329; 257/321; 438/156; 438/268

(58) Field of Classification Search
USPC ......... 257/202, 296, 315, 316, 324, 329, 321; 438/152, 197, 257, 268
See application file for complete search history.

(56) References Cited

U.S. PATENT DOCUMENTS

| | | | | |
|---|---|---|---|---|
| 6,433,382 | B1 * | 8/2002 | Orlowski et al. | 257/315 |
| 6,933,556 | B2 | 8/2005 | Endoh et al. | |
| 7,371,639 | B2 | 5/2008 | Shin | |

(Continued)

FOREIGN PATENT DOCUMENTS

| | | | |
|---|---|---|---|
| CN | 101147266 | A | 3/2008 |
| CN | 101490838 | A | 7/2009 |

(Continued)

OTHER PUBLICATIONS

Ohba et al., "A novel tri-control gate surrounding transistor (TCG-SGT) nonvolatile memory cell for flash memory," Solid-State Electronics, vol. 50, No. 6, pp. 924-928, Jun. 2006.

(Continued)

*Primary Examiner* — Kimberly Rizkallah
*Assistant Examiner* — Errol Fernandes
(74) *Attorney, Agent, or Firm* — Brinks Hofer Gilson & Lione

(57) ABSTRACT

A nonvolatile semiconductor memory transistor included in a nonvolatile semiconductor memory includes an island-shaped semiconductor having a source region, a channel region, and a drain region formed in this order from the substrate side, a hollow pillar-shaped floating gate arranged so as to surround the outer periphery of the channel region in such a manner that a tunnel insulating film is interposed between the floating gate and the channel region, and a hollow pillar-shaped control gate arranged so as to surround the outer periphery of the floating gate in such a manner that an inter-polysilicon insulating film is interposed between the control gate and the floating gate. The inter-polysilicon insulating film is arranged so as to be interposed between the floating gate and the upper, lower, and inner side surfaces of the control gate.

3 Claims, 113 Drawing Sheets

(56) References Cited

U.S. PATENT DOCUMENTS

| | | | | |
|---|---|---|---|---|
| 7,589,372 | B2 | 9/2009 | Shin | |
| 7,940,573 | B2 | 5/2011 | Masuoka et al. | |
| 2006/0223262 | A1 * | 10/2006 | Zheng et al. | 438/257 |
| 2008/0277720 | A1 * | 11/2008 | Youn et al. | 257/324 |
| 2010/0003795 | A1 * | 1/2010 | Park et al. | 438/266 |

FOREIGN PATENT DOCUMENTS

| | | | |
|---|---|---|---|
| JP | 04-079369 | A | 3/1992 |
| JP | 05-251710 | A | 9/1993 |
| JP | 2003-068886 | A | 3/2003 |
| JP | 2006-054466 | A | 2/2006 |
| JP | 2008-021781 | A | 1/2008 |
| TW | 200810095 | A | 2/2008 |

OTHER PUBLICATIONS

Office Action from counterpart Korean Application No. 10-2011-0041313, dated Jul. 13, 2012, 5 pages.

* cited by examiner

NONVOLATILE SEMICONDUCTOR MEMORY TRANSISTOR, NONVOLATILE SEMICONDUCTOR MEMORY, AND METHOD FOR MANUFACTURING NONVOLATILE SEMICONDUCTOR MEMORY

RELATED APPLICATIONS

This patent application claims the benefit of U.S. Patent Provisional Application 61/353,303, filed Jun. 10, 2010, and Japanese Patent Application 2010-133057, filed Jun. 10, 2010, the entire disclosures of which are incorporated herein.

BACKGROUND OF THE INVENTION

1. Field of the Invention

The present invention relates to a nonvolatile semiconductor memory transistor, a nonvolatile semiconductor memory, and a method for manufacturing a nonvolatile semiconductor memory.

2. Description of the Related Art

A flash memory including a control gate and a charge storage layer and designed to inject electric charge into the charge storage layer using hot electron injection, Fowler-Nordheim current, or the like is known. Memory cells of the flash memory record unit data "1" or "0" using the difference in threshold voltage, which depends on the charge storage state of the charge storage layer.

In order to efficiently perform injection of electrons into the charge storage layer and emission of electrons from the charge storage layer, that is, writing and erasing of unit data, the capacitive coupling relationship between a floating gate and a control gate is important. The greater the capacitance between the floating gate and the control gate is, the more effectively the potential of the control gate can be transmitted to the floating gate. Therefore, writing and erasing are facilitated.

In order to increase the capacitance between the floating gate and the control gate, a Tri-Control Gate Surrounding Gate Transistor (TCG-SGT) Flash Memory Cell illustrated in FIG. 57 has been proposed (for example, see Takuya Ohba, Hiroki Nakamura, Hiroshi Sakuraba, Fujio Masuoka, "A novel tri-control gate surrounding gate transistor (TCG-SGT) nonvolatile memory cell for flash memory", Solid-State Electronics, Vol. 50, No. 6, pp. 924-928, June 2006). Since the control gate of the TCG-SGT flash memory cell has a structure that covers, in addition to the side surface of the floating gate, the upper and lower surfaces of the floating gate, the capacitance between the floating gate and the control gate can be increased, and writing and erasing are facilitated.

However, in the TCG-SGT flash memory cell illustrated in FIG. 57, since the upper and lower portions of the control gate and the outer peripheral wall surface of an island-shaped semiconductor are brought into close proximity to each other with insulating films therebetween, a parasitic capacitance is generated between the control gate and the island-shaped semiconductor. Such a parasitic capacitance between the control gate and the island-shaped semiconductor may cause a reduction in the operating speed of the transistor and is therefore unnecessary.

SUMMARY OF THE INVENTION

Accordingly, the present invention provides a nonvolatile semiconductor memory transistor having a structure utilizing an island-shaped semiconductor, in which the capacitance between a floating gate and a control gate can be increased and in which the parasitic capacitance between the control gate and the island-shaped semiconductor can be reduced, a nonvolatile semiconductor memory, and a method for manufacturing the nonvolatile semiconductor memory.

A nonvolatile semiconductor memory transistor according to a first aspect of the present invention includes an island-shaped semiconductor, a hollow pillar-shaped floating gate, and a hollow pillar-shaped control gate. The island-shaped semiconductor has a source region, a channel region, and a drain region formed in the order of the source region, the channel region, and the drain region from the side of a substrate. The hollow pillar-shaped floating gate is arranged so as to surround an outer periphery of the channel region in such a manner that a tunnel insulating film is interposed between the floating gate and the channel region. The hollow pillar-shaped control gate is arranged so as to surround an outer periphery of the floating gate in such a manner that an inter-polysilicon insulating film is interposed between the control gate and the floating gate. The inter-polysilicon insulating film is arranged so as to be interposed between the floating gate and an upper surface, a lower surface, and an inner side surface of the control gate.

Preferably, the nonvolatile semiconductor memory transistor further includes a first insulating film arranged on the substrate so as to be located below the floating gate, the first insulating film being thicker than at least one of the tunnel oxide film and the inter-polysilicon insulating film.

A nonvolatile semiconductor memory according to a second aspect of the present invention includes the nonvolatile semiconductor memory transistor described above. The nonvolatile semiconductor memory transistor includes a plurality of nonvolatile semiconductor memory transistors arranged in a row direction among row and column directions of the substrate, and a drain region of at least one of the plurality of nonvolatile semiconductor memory transistors is electrically connected to a second source line arranged in a column direction among the row and column directions of the substrate.

A method for manufacturing a nonvolatile semiconductor memory according to a third aspect of the present invention is a method for manufacturing a nonvolatile semiconductor memory including a plurality of nonvolatile semiconductor memory transistors each including an island-shaped semiconductor having a hard mask formed in an upper portion thereof. Each of the island-shaped semiconductors has a source region, a channel region, and a drain region formed in the order of the source region, the channel region, and the drain region from the side of a substrate, a floating gate and a control gate being arranged in the vicinity of the channel region in the order of the floating gate and the control gate from the side of the channel region. The method includes a step of forming a first source line on the substrate; a step of forming the island-shaped semiconductors on the first source line; a step of forming the hard masks on the island-shaped semiconductors; a step of forming insulating film side walls on outer peripheral wall surfaces of the island-shaped semiconductors; a step of forming insulating films on bottom portions of the island-shaped semiconductors and on the first source line; a step of forming a floating gate film on the insulating films; and a step of forming the floating gates in the vicinity of the channel regions by etching the floating gate film.

According to the present invention, it is possible to provide a nonvolatile semiconductor memory transistor having a structure using an island-shaped semiconductor, in which the capacitance between a floating gate and a control gate can be increased and in which the parasitic capacitance between the control gate and the island-shaped semiconductor is reduced, a nonvolatile semiconductor memory, and a method for manufacturing the nonvolatile semiconductor memory.

BRIEF DESCRIPTION OF THE DRAWINGS

FIG. 41A is a plan view illustrating the method for manufacturing the nonvolatile semiconductor memory according to the embodiment of the present invention.

FIG. 41B is a cross-sectional view taken along line X-X' of FIG. 41A.

FIG. 41C is a cross-sectional view taken along line Y-Y' of FIG. 41A.

FIG. 42A is a plan view illustrating the method for manufacturing the nonvolatile semiconductor memory according to the embodiment of the present invention.

FIG. 42B is a cross-sectional view taken along line X-X' of FIG. 42A.

FIG. 42C is a cross-sectional view taken along line Y-Y' of FIG. 42A.

FIG. 43A is a plan view illustrating the method for manufacturing the nonvolatile semiconductor memory according to the embodiment of the present invention.

FIG. 43B is a cross-sectional view taken along line X-X' of FIG. 43A.

FIG. 43C is a cross-sectional view taken along line Y-Y' of FIG. 43A.

FIG. 44A is a plan view illustrating the method for manufacturing the nonvolatile semiconductor memory according to the embodiment of the present invention.

FIG. 44B is a cross-sectional view taken along line X-X of FIG. 44A.

FIG. 44C is a cross-sectional view taken along line Y-Y' of FIG. 44A.

Figure 45A:
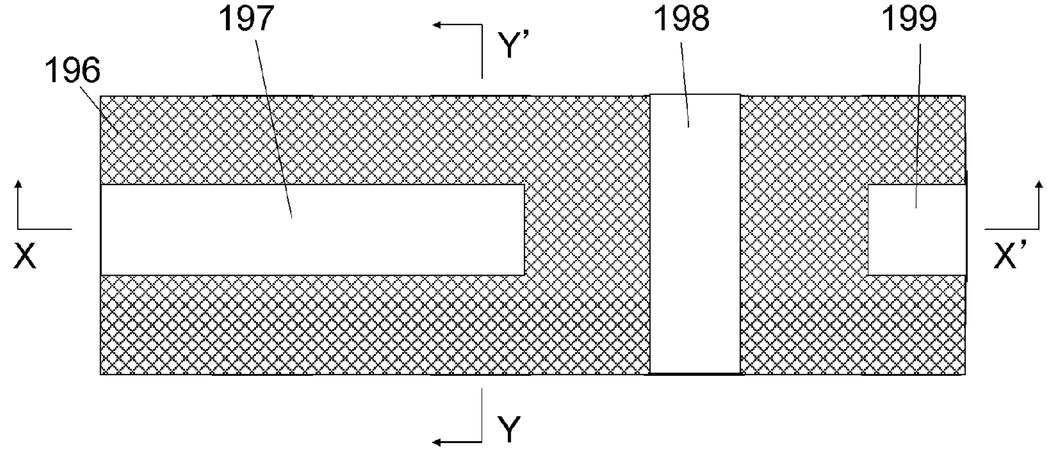

FIG. 45A is a plan view illustrating the method for manufacturing the nonvolatile semiconductor memory according to the embodiment of the present invention.

Figure 45B:
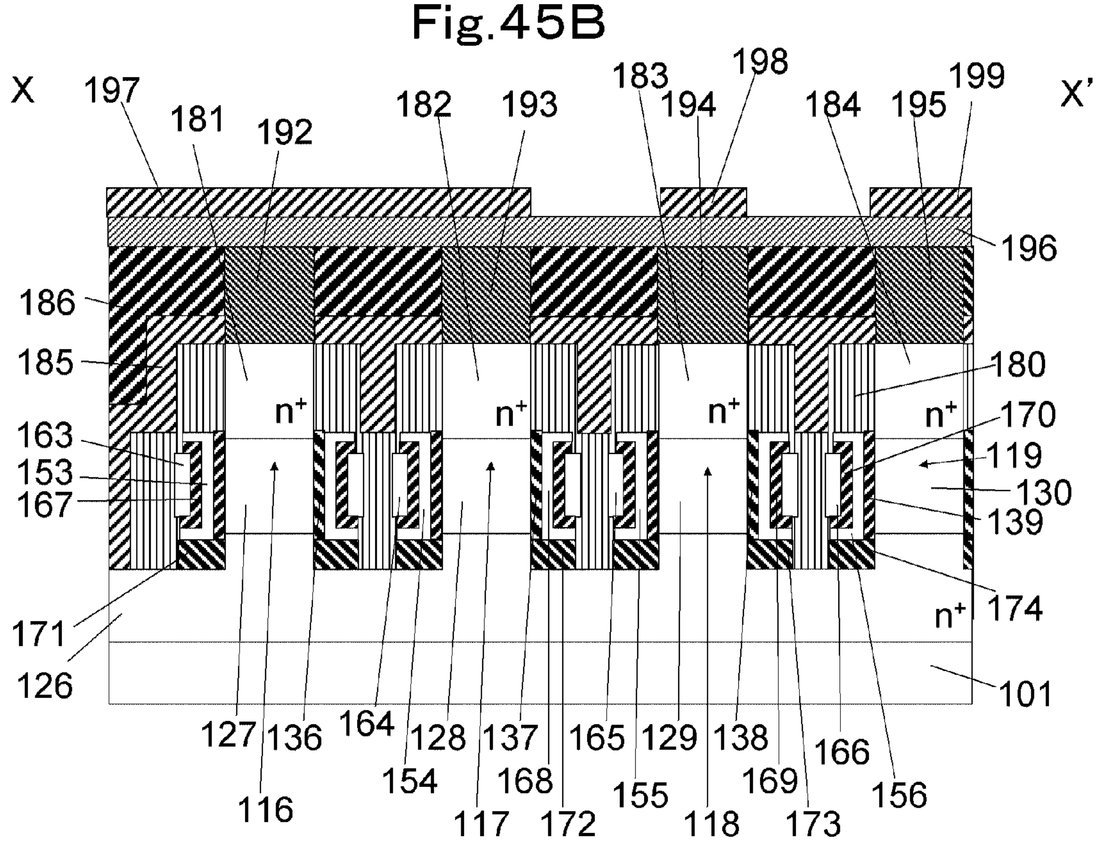

FIG. 45B is a cross-sectional view taken along line X-X' of FIG. 45A.

Figure 45C:
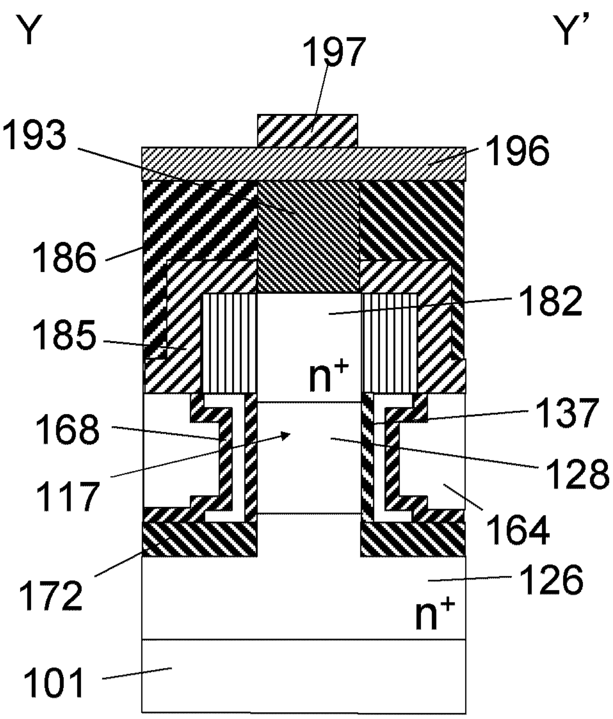

FIG. 45C is a cross-sectional view taken along line Y-Y' of FIG. 45A.

Figure 46A:
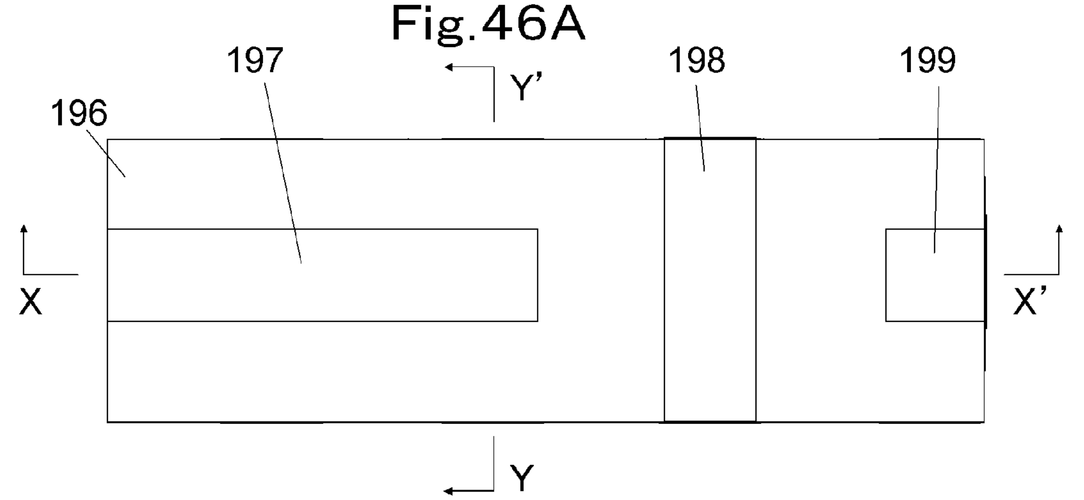

FIG. 46A is a plan view illustrating the method for manufacturing the nonvolatile semiconductor memory according to the embodiment of the present invention.

Figure 46B:
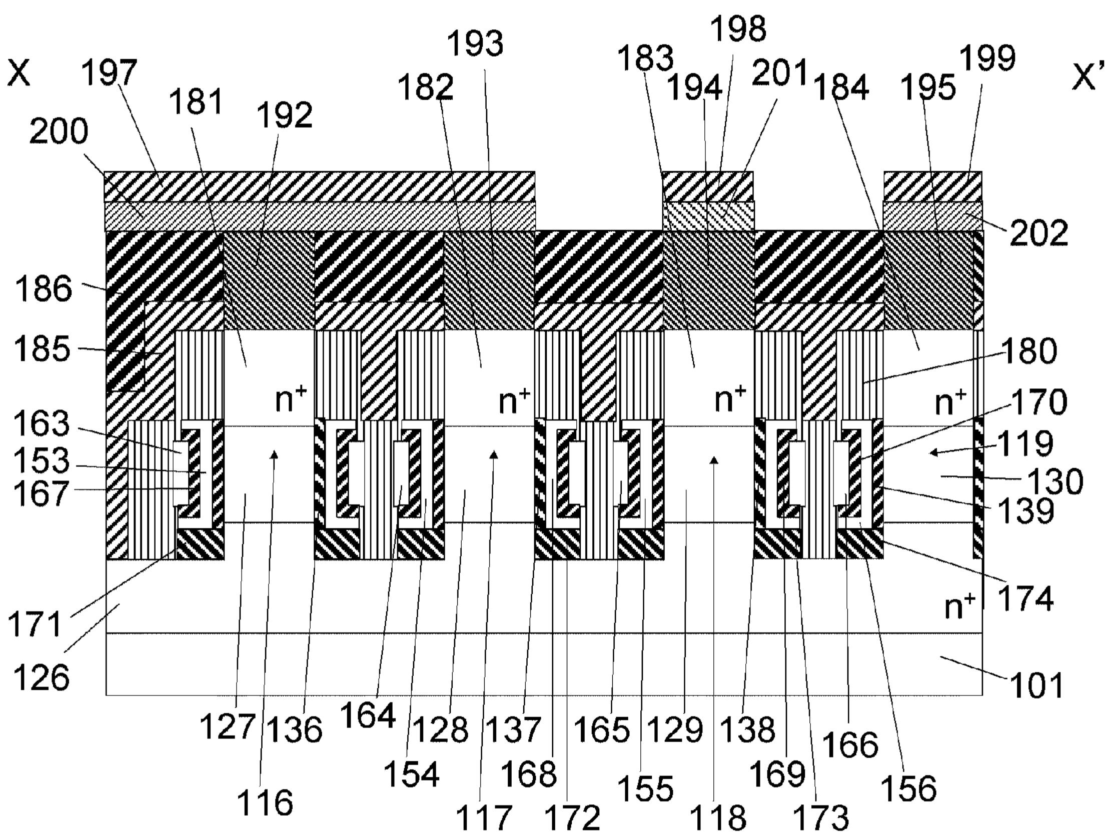

FIG. 46B is a cross-sectional view taken along line X-X' of FIG. 46A.

Figure 46C:
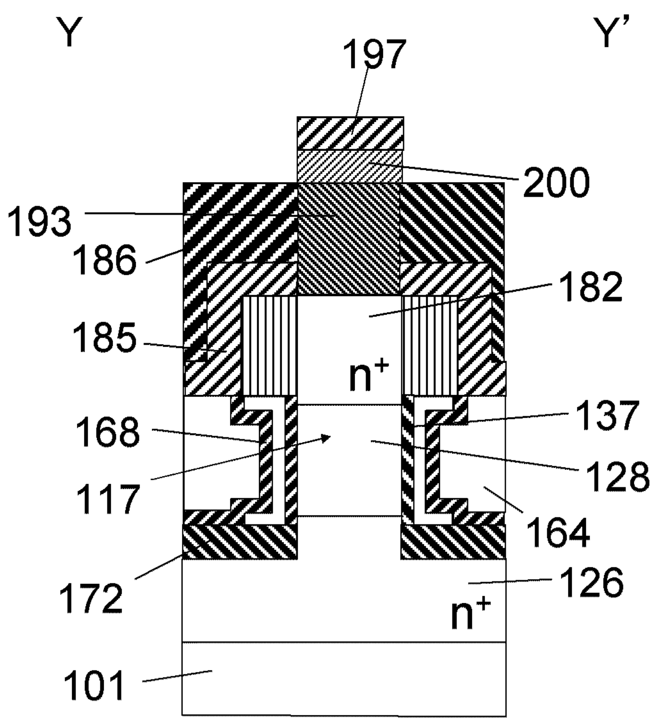

FIG. 46C is a cross-sectional view taken along line Y-Y' of FIG. 46A.

Figure 47A:
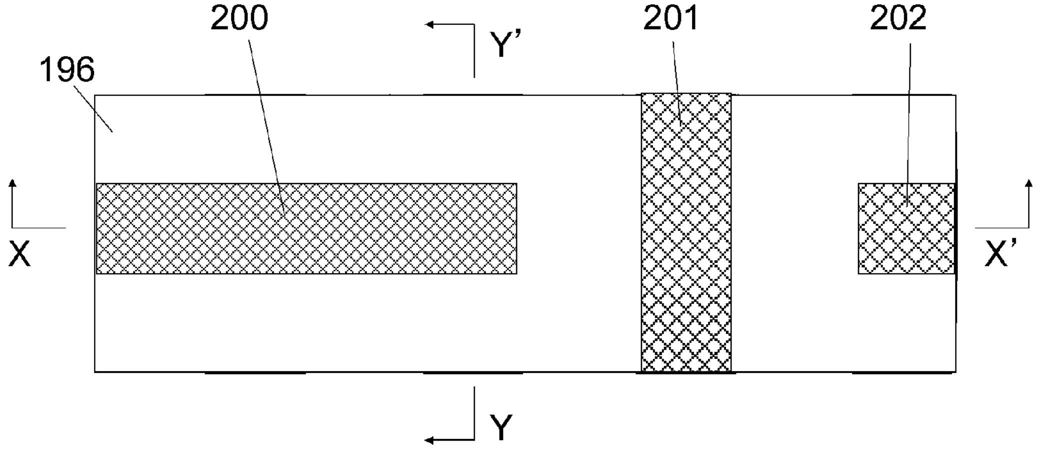

FIG. 47A is a plan view illustrating the method for manufacturing the nonvolatile semiconductor memory according to the embodiment of the present invention.

Figure 47B:
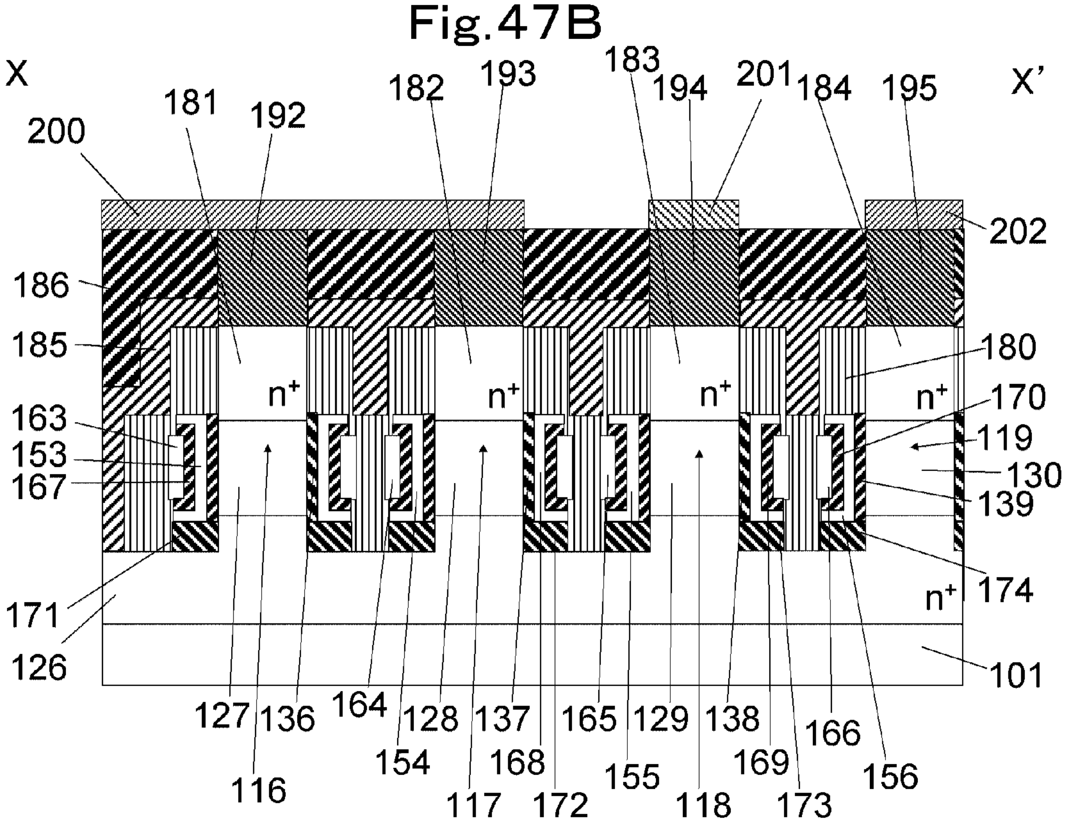

FIG. 47B is a cross-sectional view taken along line X-X' of FIG. 47A.

Figure 47C:
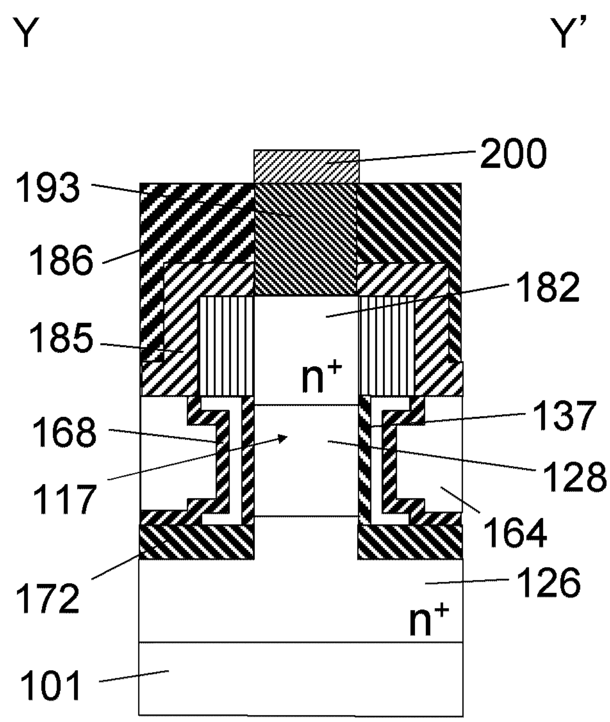

FIG. 47C is a cross-sectional view taken along line Y-Y' of FIG. 47A.

Figure 48A:
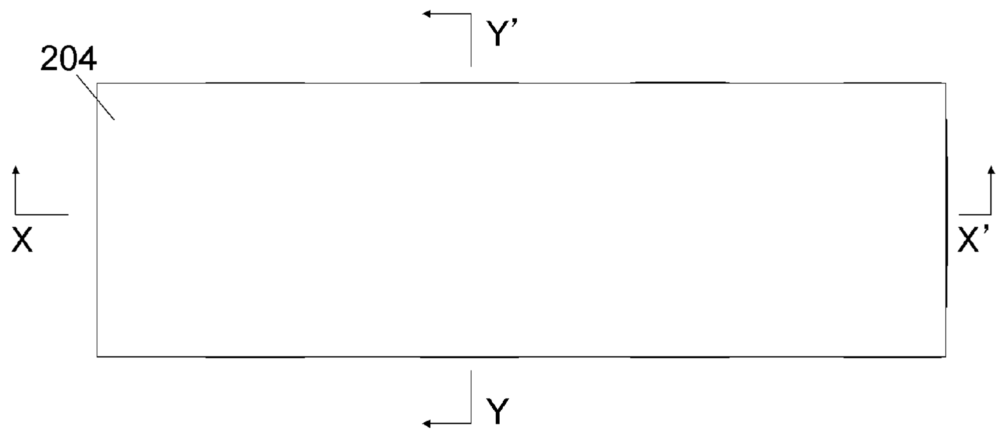

FIG. 48A is a plan view illustrating the method for manufacturing the nonvolatile semiconductor memory according to the embodiment of the present invention.

Figure 48B:
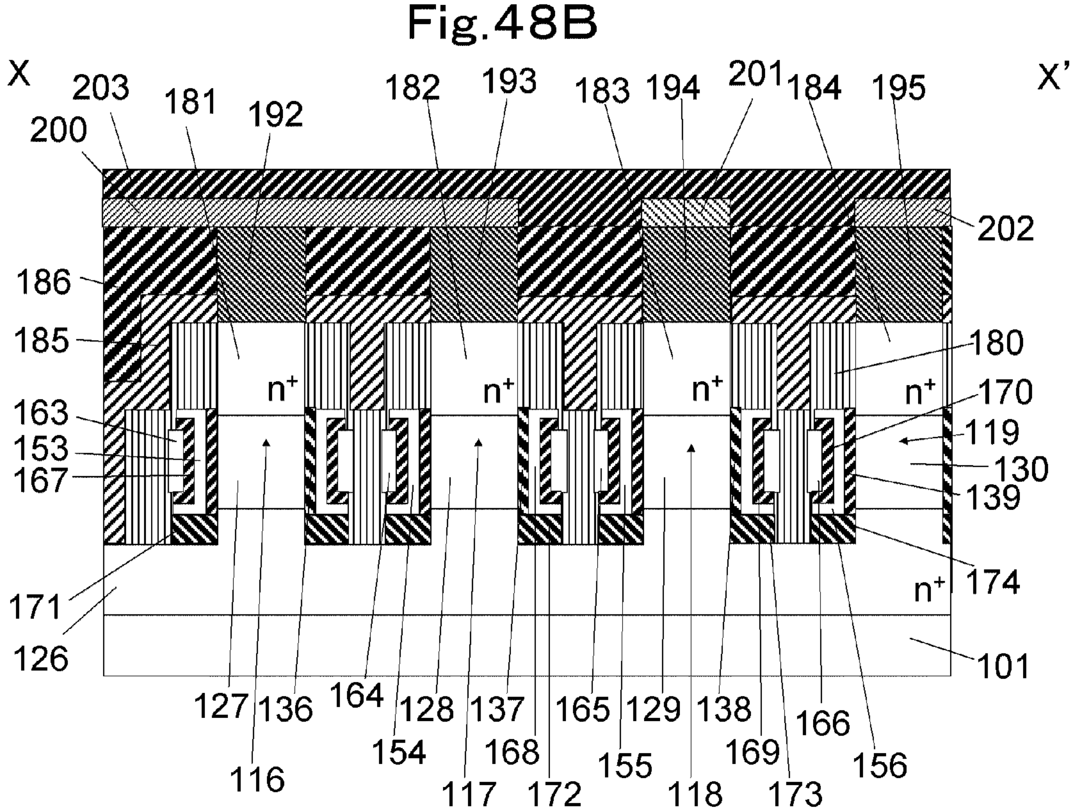

FIG. 48B is a cross-sectional view taken along line X-X' of FIG. 48A.

Figure 48C:
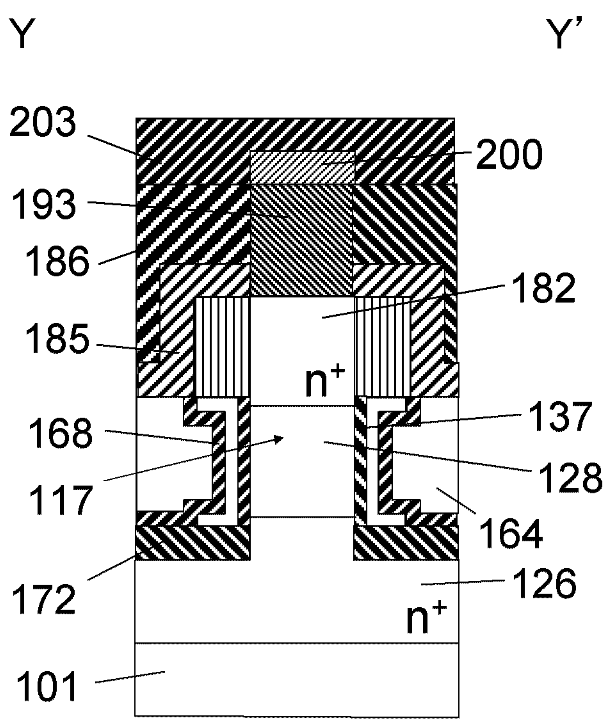

FIG. 48C is a cross-sectional view taken along line Y-Y' of FIG. 48A.

Figure 49A:
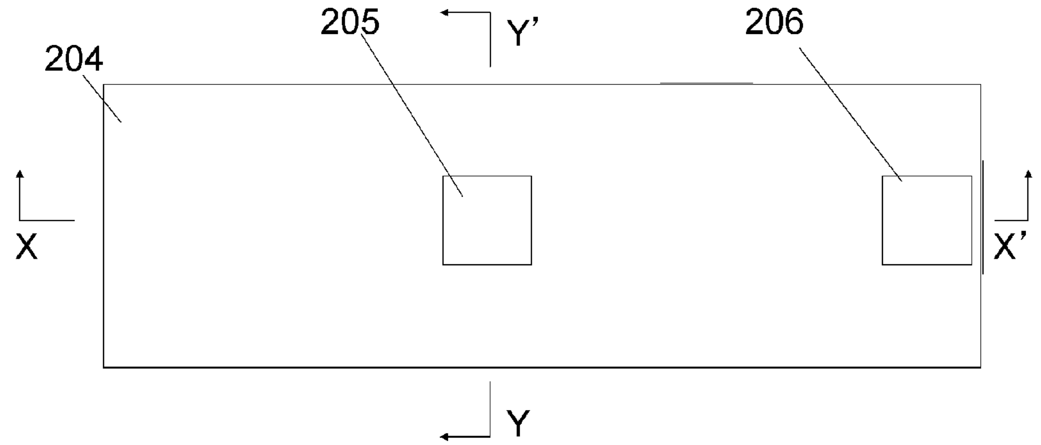

FIG. 49A is a plan view illustrating the method for manufacturing the nonvolatile semiconductor memory according to the embodiment of the present invention.

Figure 49B:
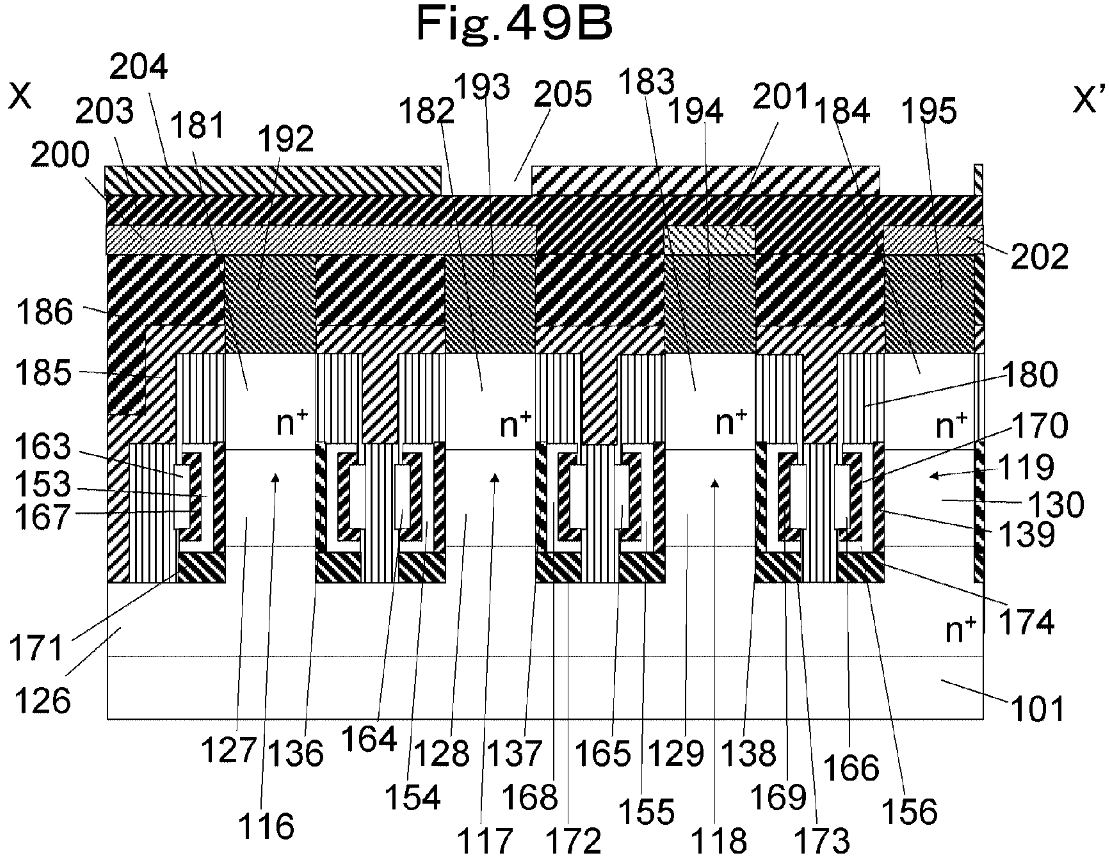

FIG. 49B is a cross-sectional view taken along line X-X' of FIG. 49A.

Figure 49C:
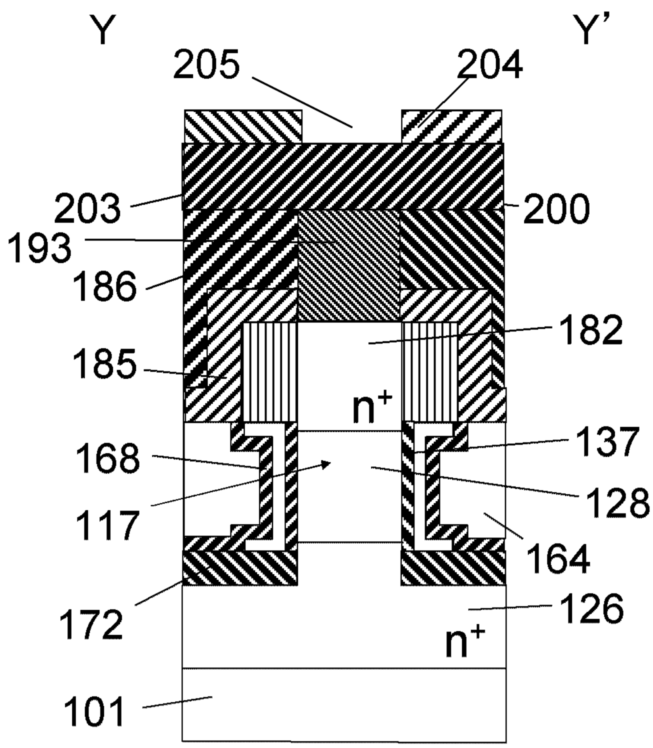

FIG. 49C is a cross-sectional view taken along line Y-Y' of FIG. 49A.

Figure 50A:
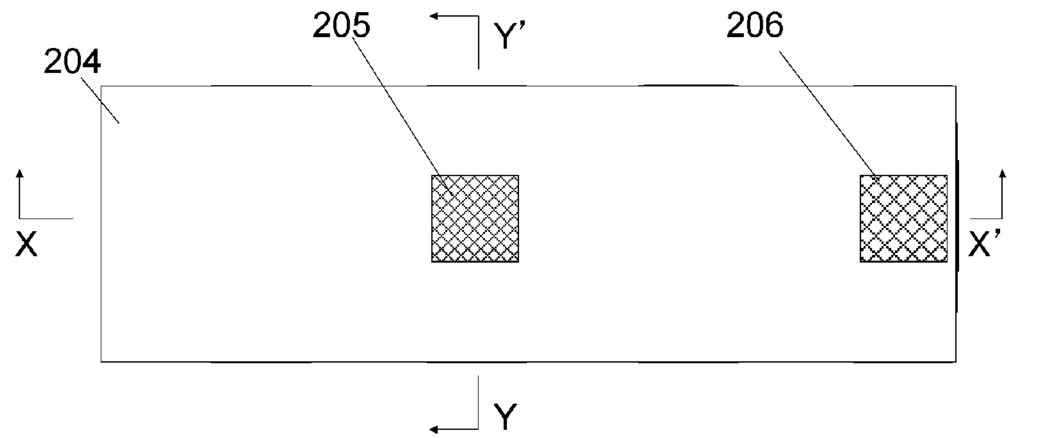

FIG. 50A is a plan view illustrating the method for manufacturing the nonvolatile semiconductor memory according to the embodiment of the present invention.

Figure 50B:
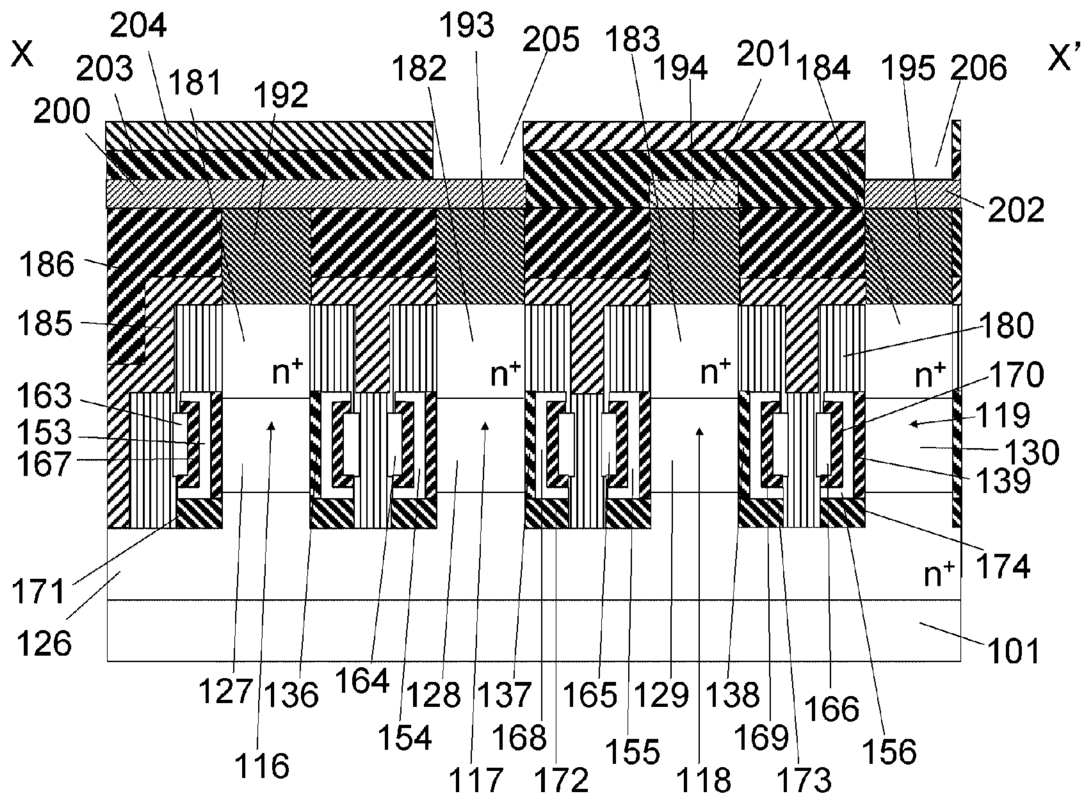

FIG. 50B is a cross-sectional view taken along line X-X' of FIG. 50A.

Figure 50C:
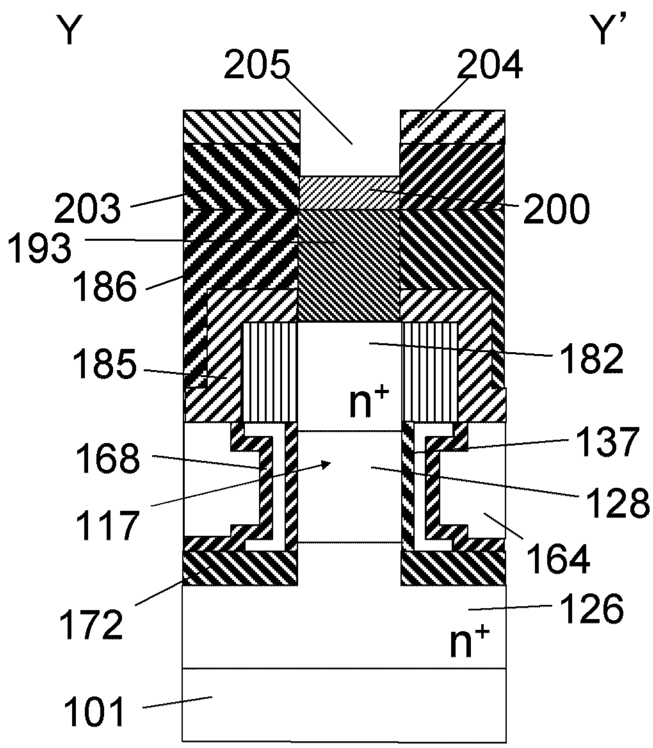

FIG. 50C is a cross-sectional view taken along line Y-Y' of FIG. 50A.

Figure 51A:
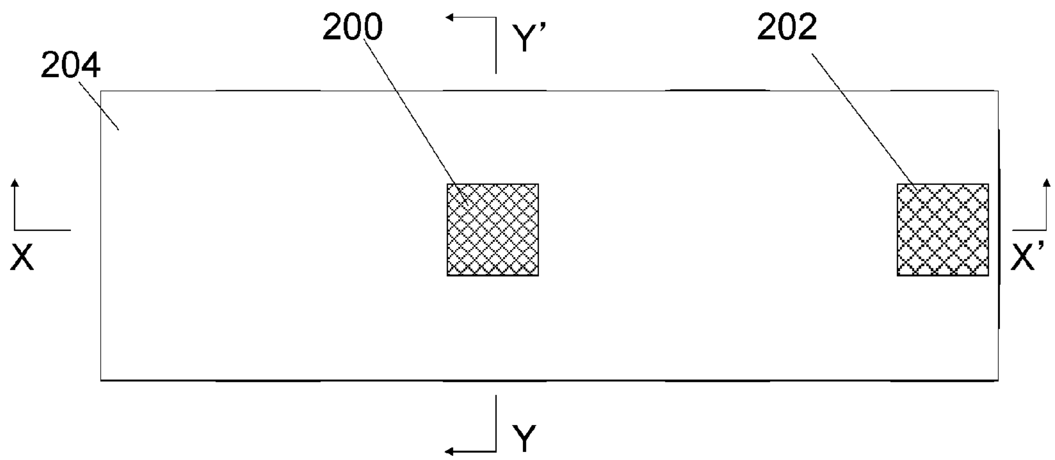

FIG. 51A is a plan view illustrating the method for manufacturing the nonvolatile semiconductor memory according to the embodiment of the present invention.

Figure 51B:
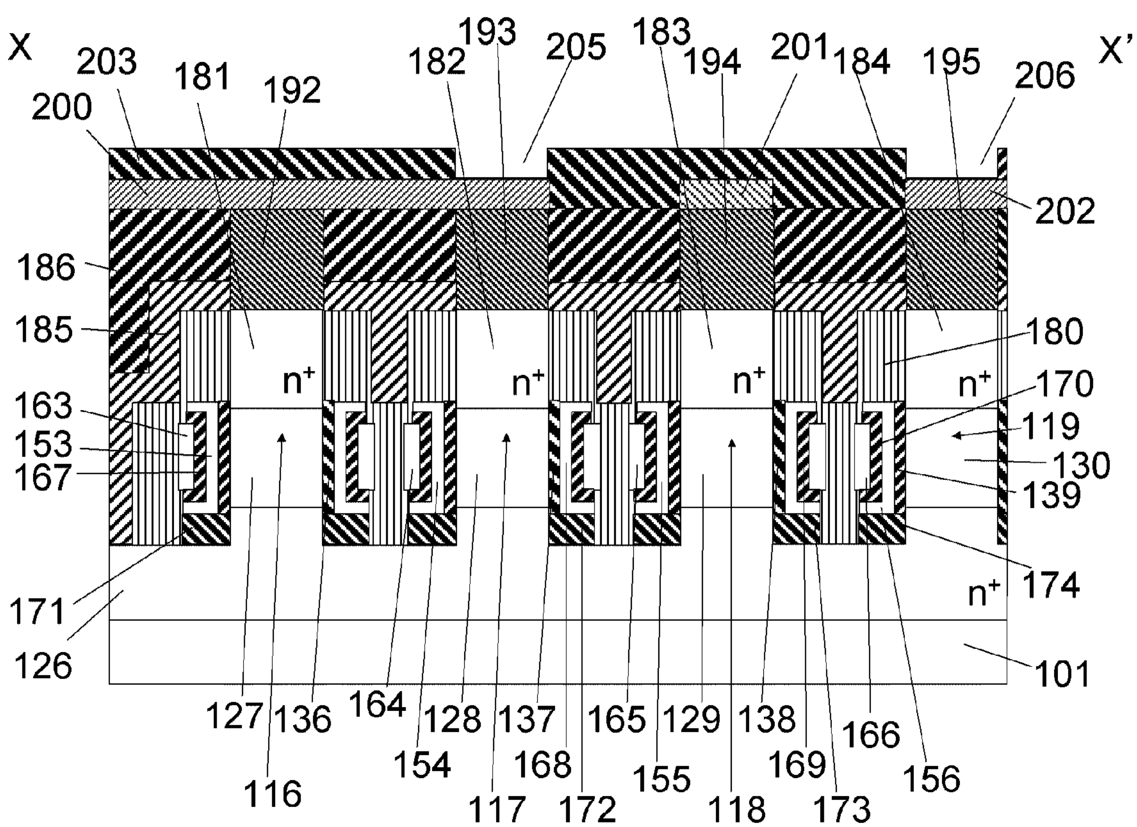

FIG. 51B is a cross-sectional view taken along line X-X' of FIG. 51A.

Figure 51C:
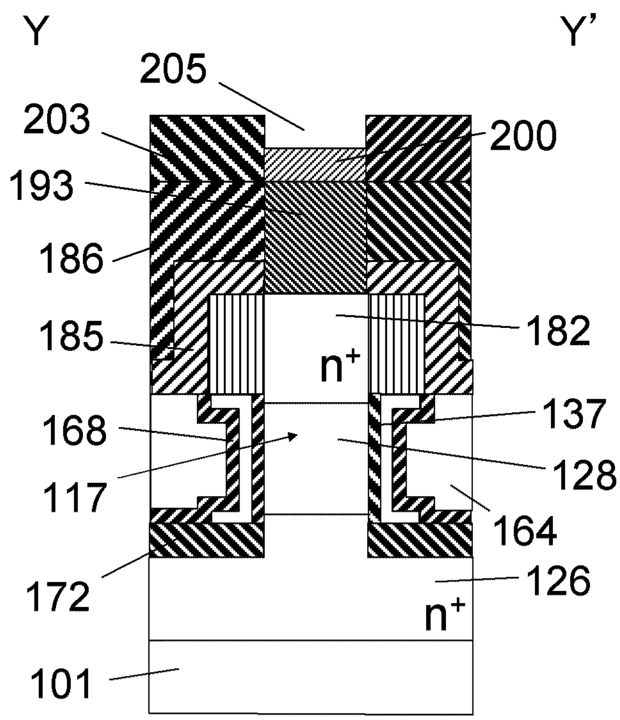

FIG. 51C is a cross-sectional view taken along line Y-Y' of FIG. 51A.

Figure 52A:
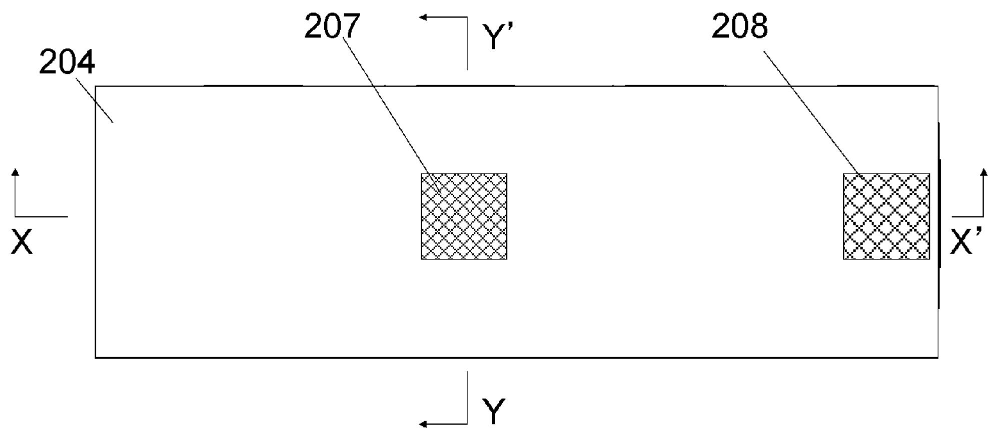

FIG. 52A is a plan view illustrating the method for manufacturing the nonvolatile semiconductor memory according to the embodiment of the present invention.

Figure 52B:
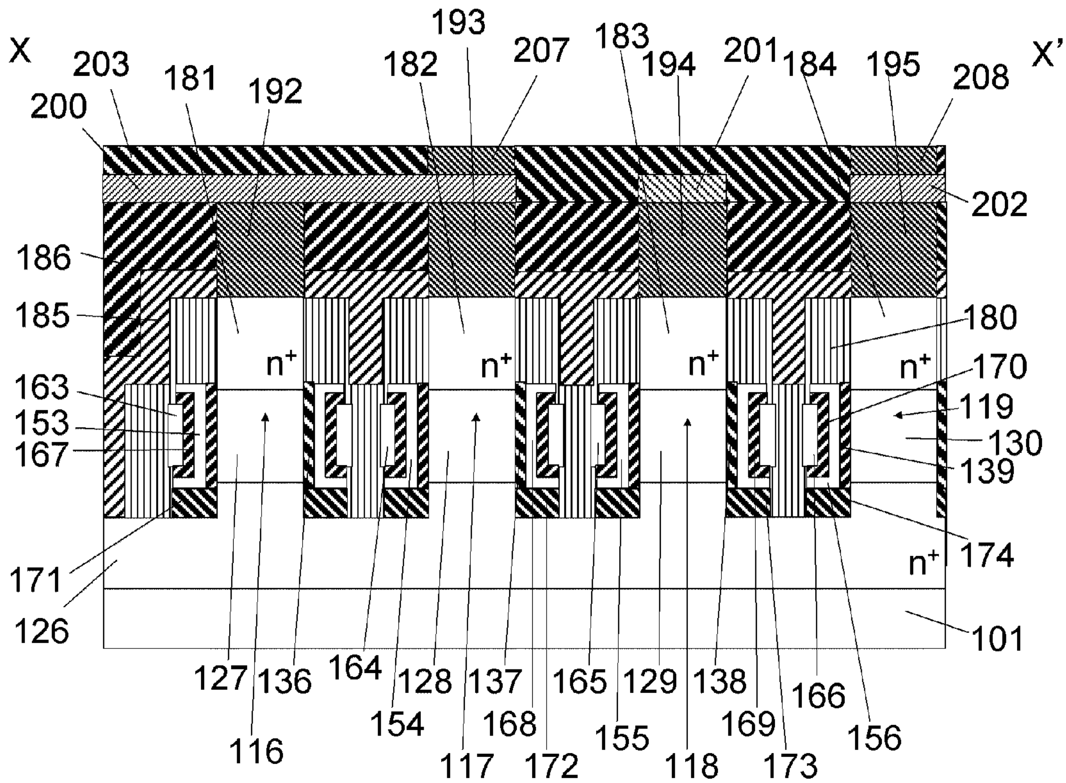

FIG. 52B is a cross-sectional view taken along line X-X' of FIG. 52A.

Figure 52C:
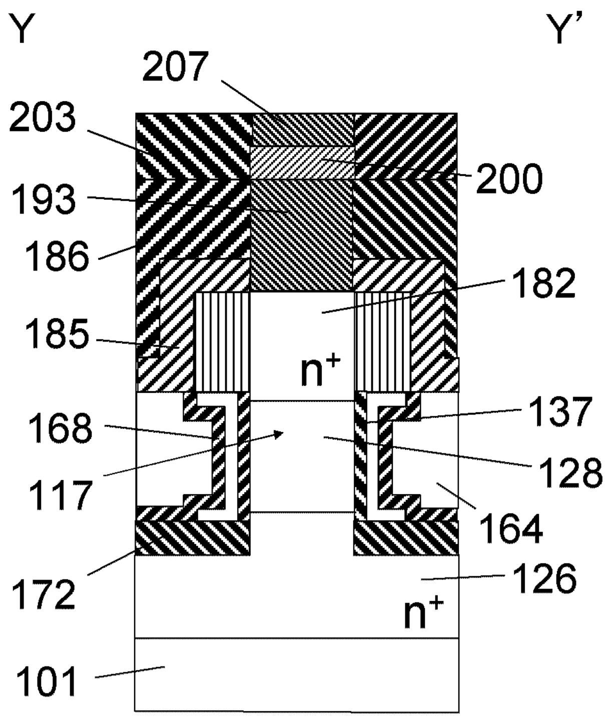

FIG. 52C is a cross-sectional view taken along line Y-Y' of FIG. 52A.

Figure 53A:
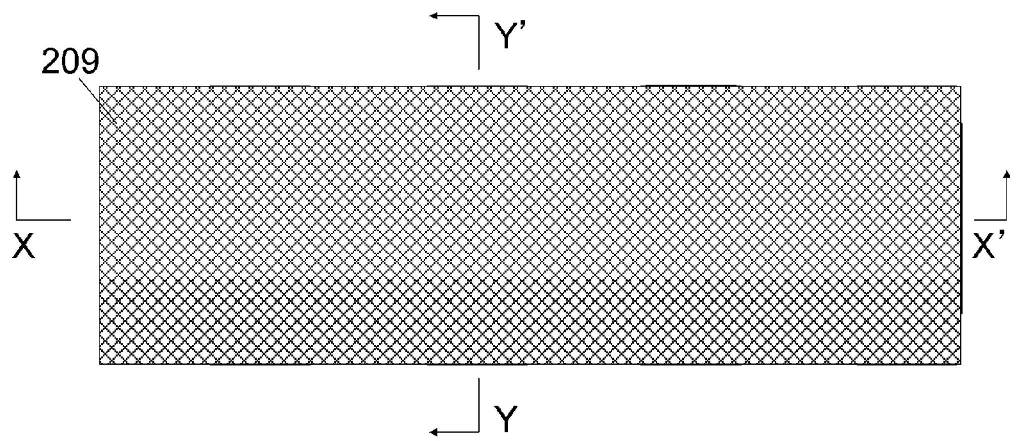

FIG. 53A is a plan view illustrating the method for manufacturing the nonvolatile semiconductor memory according to the embodiment of the present invention.

Figure 53B:
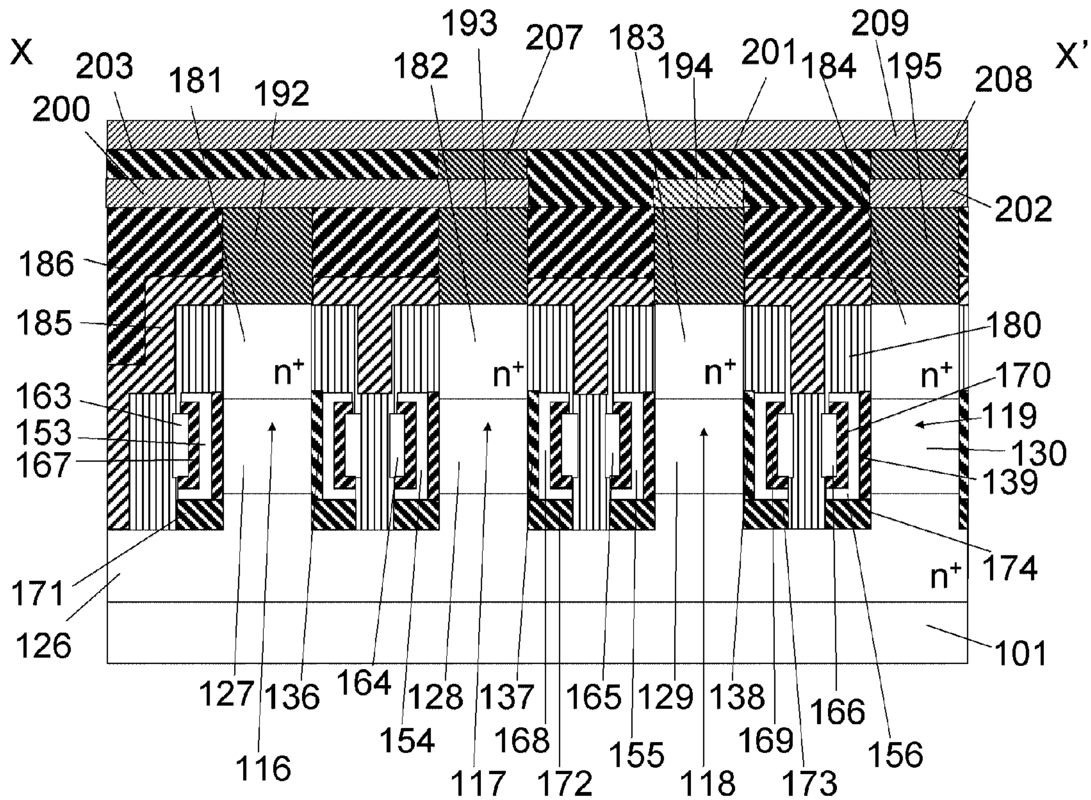

FIG. 53B is a cross-sectional view taken along line X-X' of FIG. 53A.

Figure 53C:
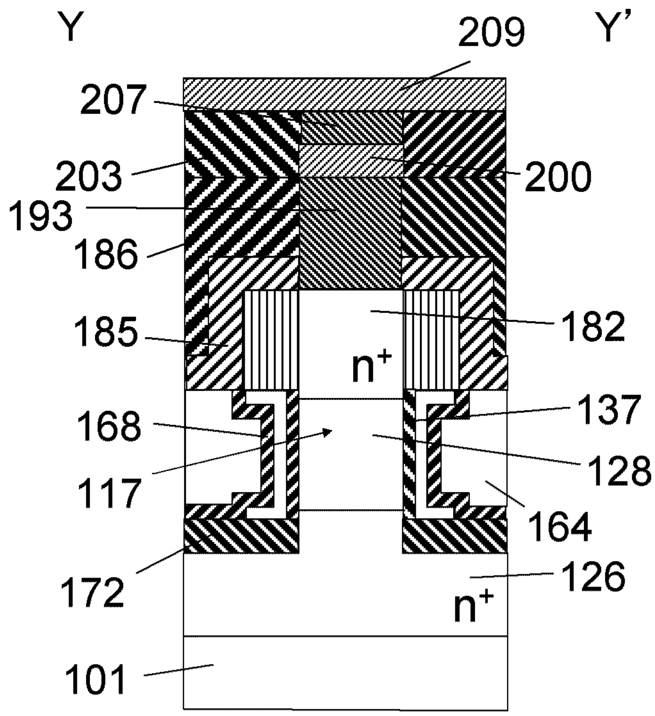

FIG. 53C is a cross-sectional view taken along line Y-Y' of FIG. 53A.

Figure 54A:
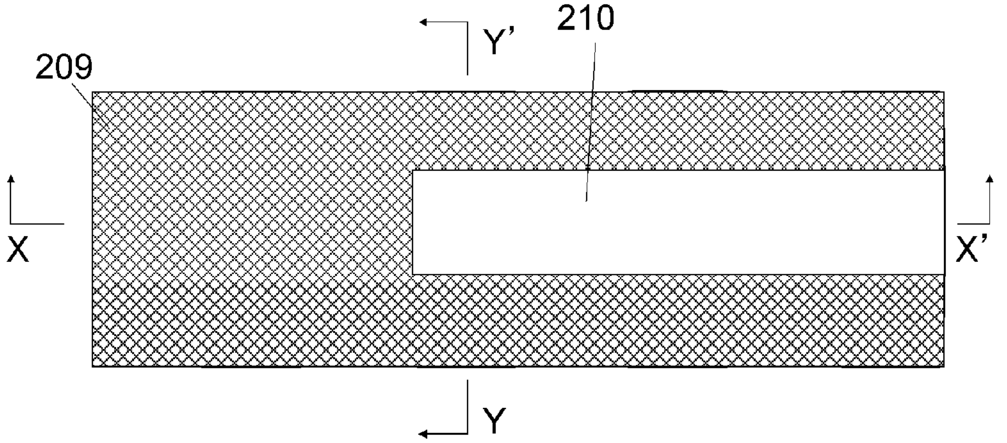

FIG. 54A is a plan view illustrating the method for manufacturing the nonvolatile semiconductor memory according to the embodiment of the present invention.

Figure 54B:
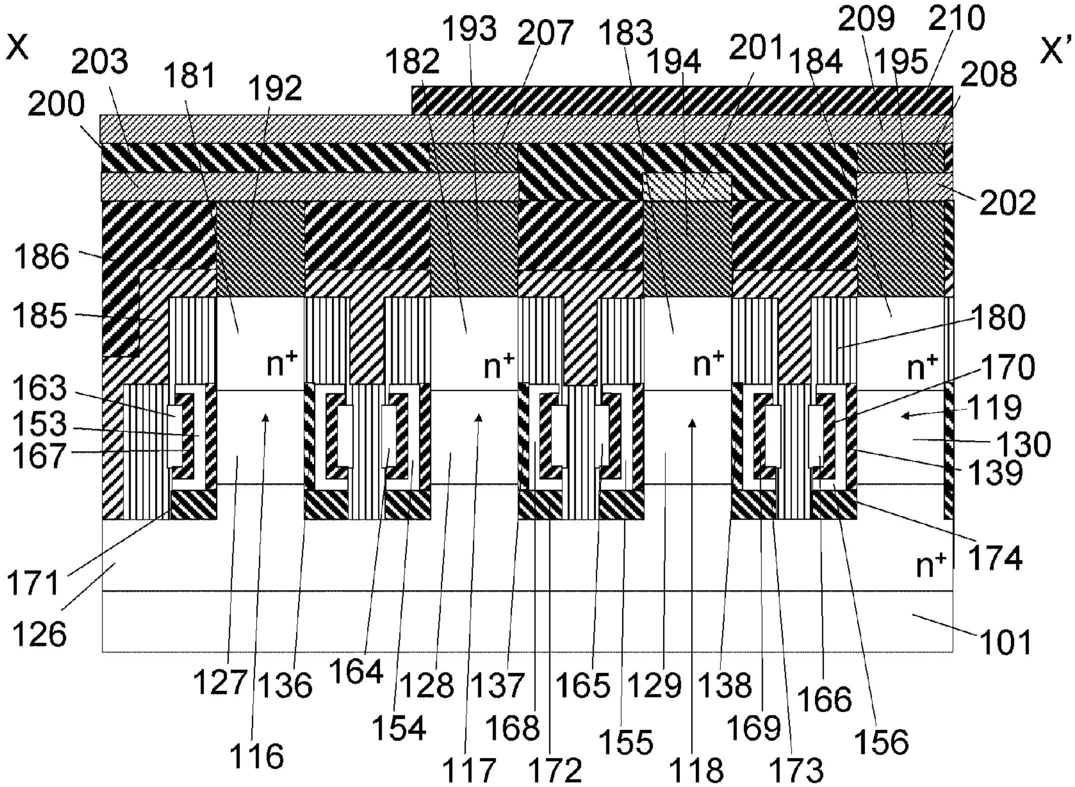

FIG. 54B is a cross-sectional view taken along line X-X' of FIG. 54A.

Figure 54C:
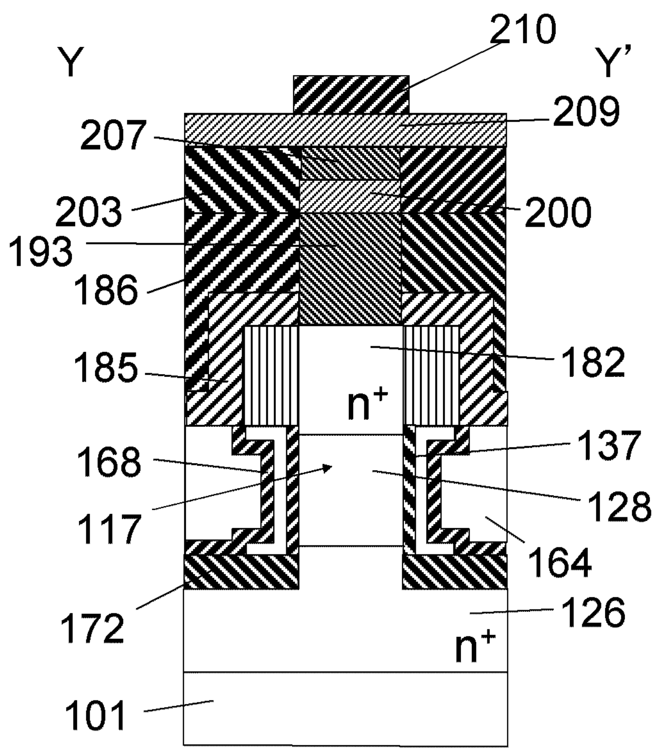

FIG. 54C is a cross-sectional view taken along line Y-Y' of FIG. 54A.

Figure 55A:
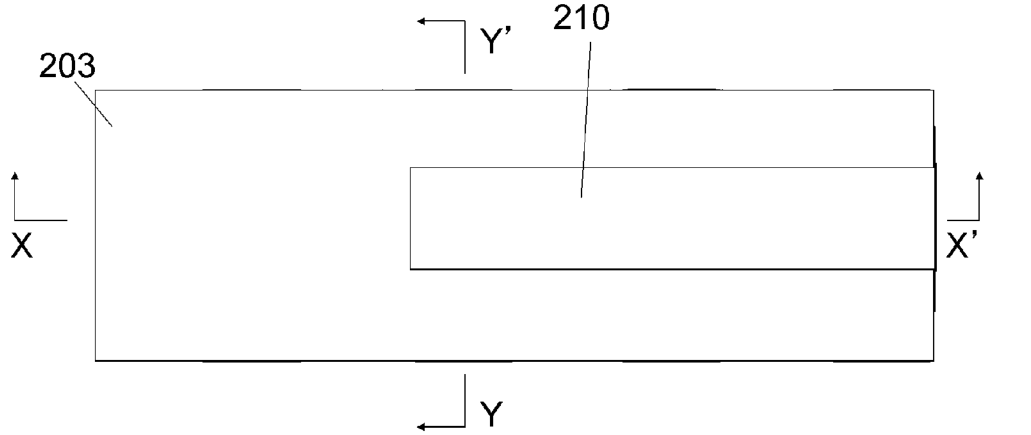

FIG. 55A is a plan view illustrating the method for manufacturing the nonvolatile semiconductor memory according to the embodiment of the present invention.

Figure 55B:
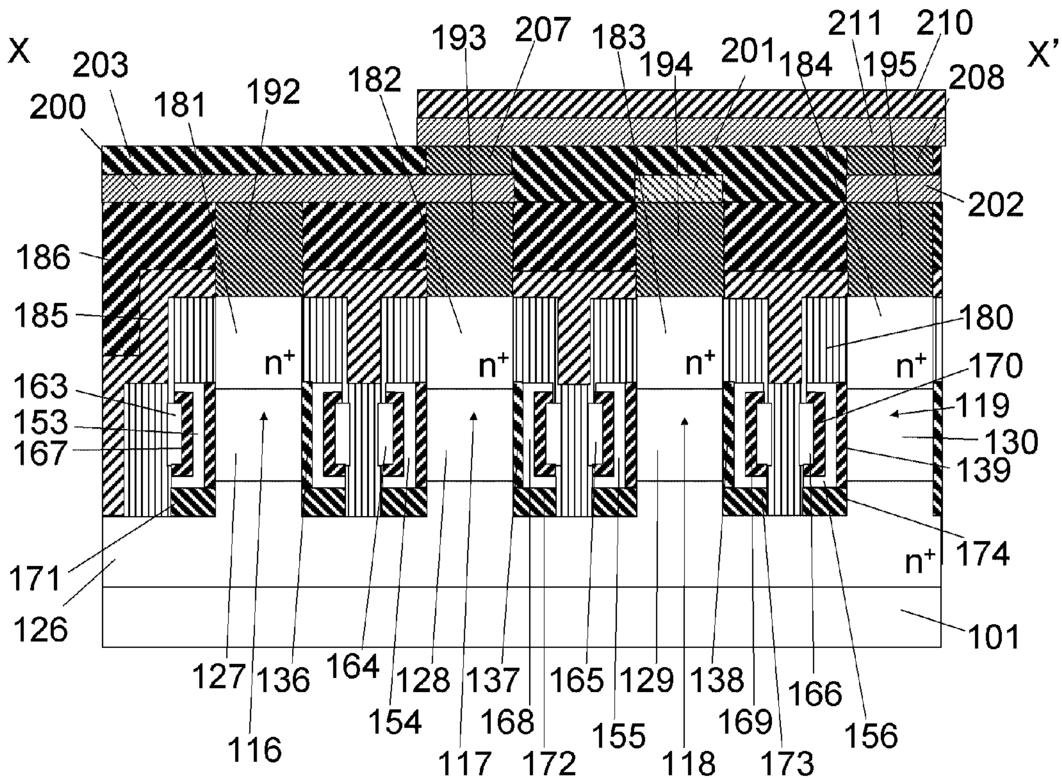

FIG. 55B is a cross-sectional view taken along line X-X' of FIG. 55A.

Figure 55C:
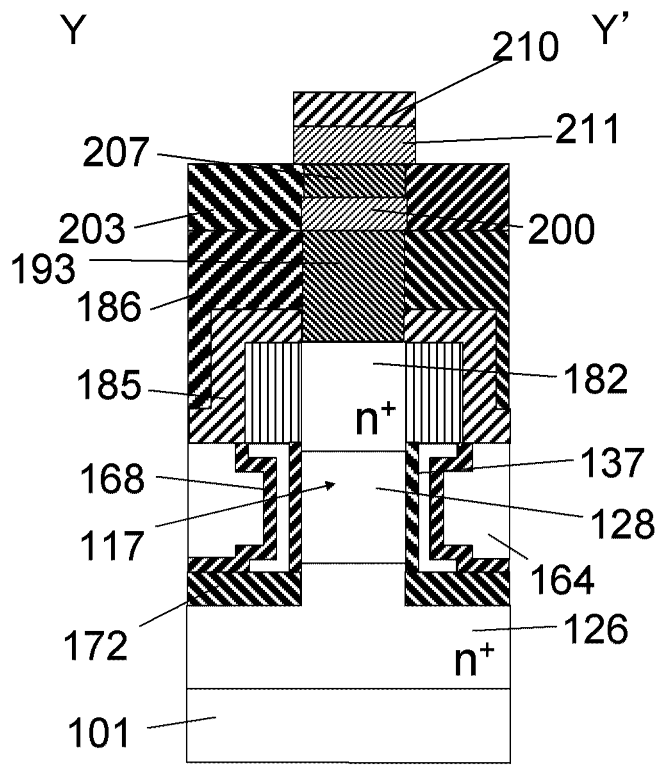

FIG. 55C is a cross-sectional view taken along line Y-Y' of FIG. 55A.

Figure 56A:
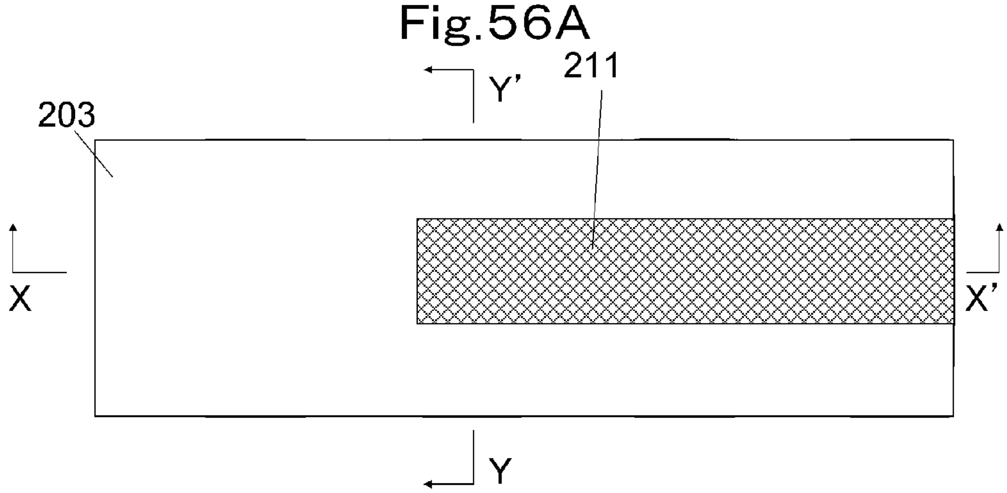

FIG. 56A is a plan view illustrating the method for manufacturing the nonvolatile semiconductor memory according to the embodiment of the present invention.

Figure 56B:
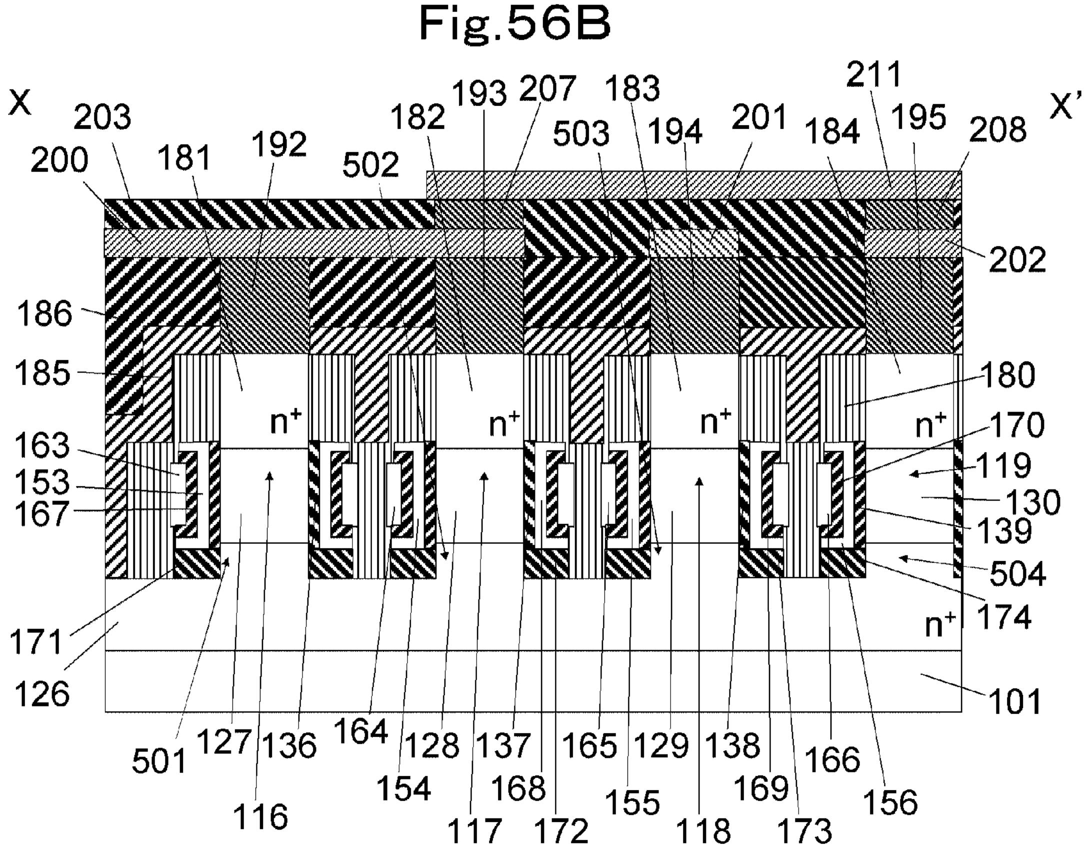

FIG. 56B is a cross-sectional view taken along line X-X' of FIG. 56A.

Figure 56C:
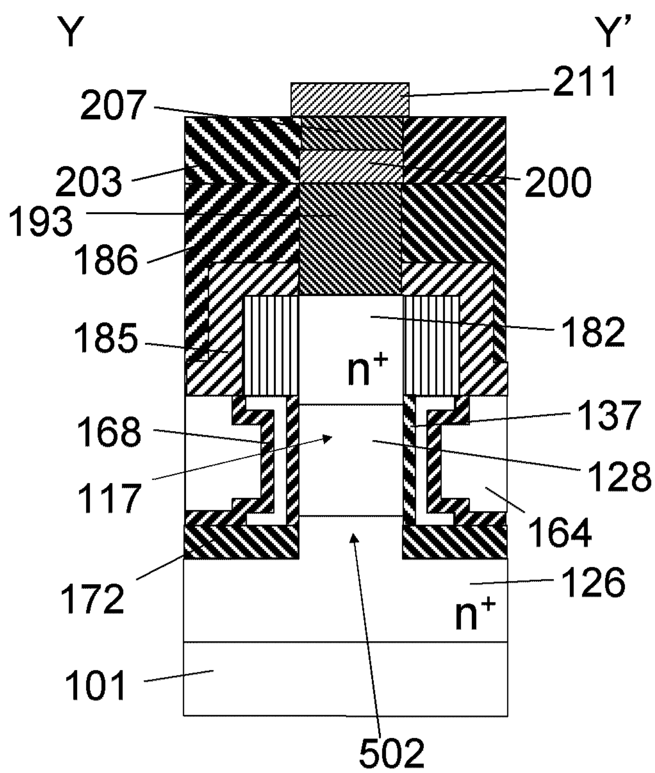

FIG. 56C is a cross-sectional view taken along line Y-Y' of FIG. 56A.

Figure 57:
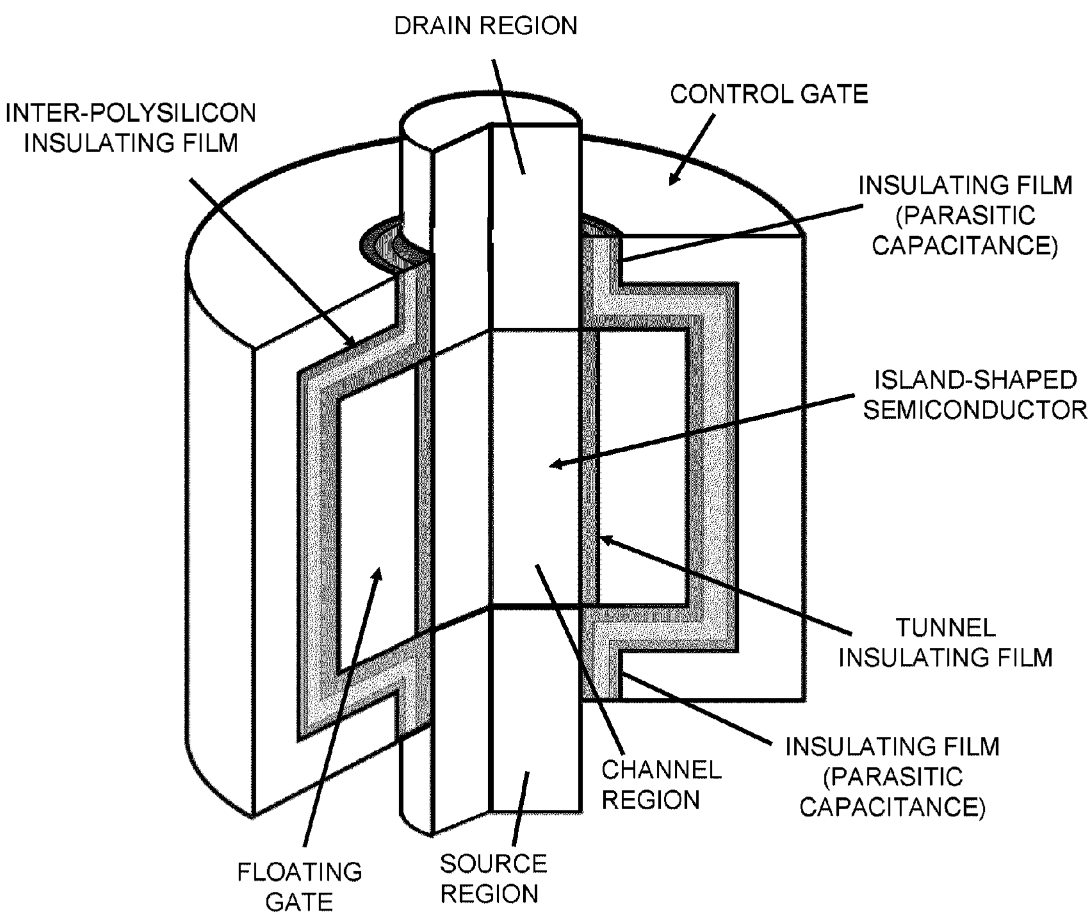

FIG. 57 is a cross-sectional view of an SGT flash memory of the related art.

DETAILED DESCRIPTION OF THE PREFERRED EMBODIMENTS

An embodiment of the present invention will be described hereinafter with reference to the drawings. The present invention is not limited to the following embodiment.

Figure 1:
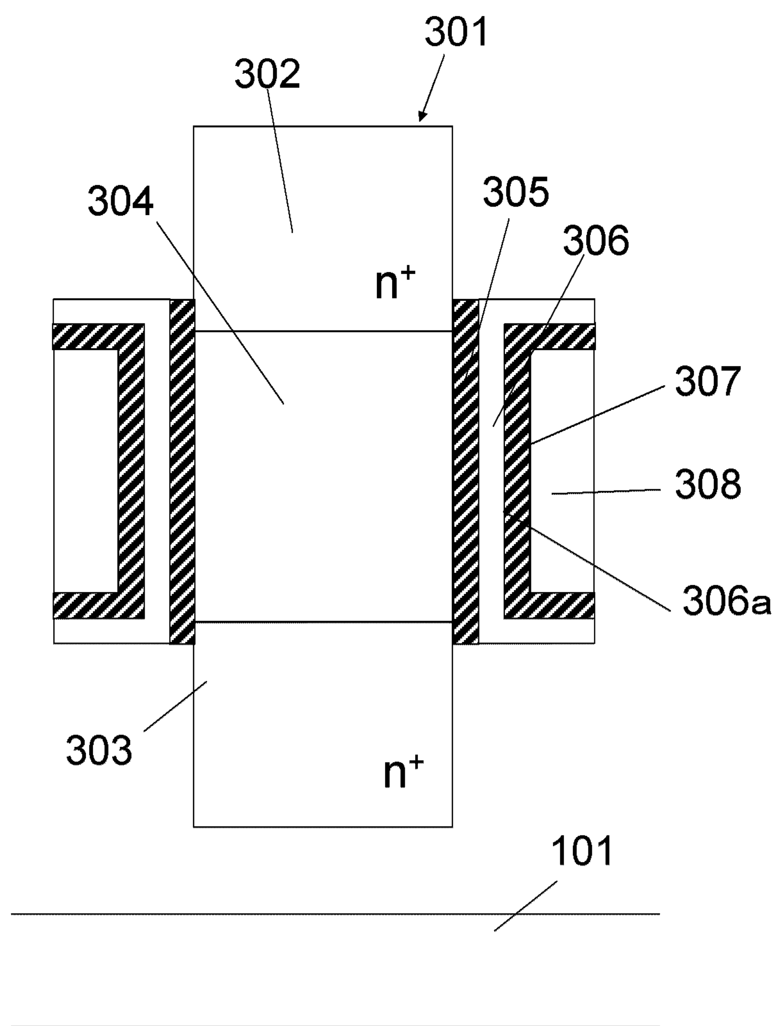
FIG. 1 is a cross-sectional view illustrating a main part of a nonvolatile semiconductor memory transistor according to an embodiment of the present invention.

FIG. 1 illustrates a cross-sectional view of a nonvolatile semiconductor memory transistor according to an embodiment of the present invention.

As illustrated in FIG. 1, the nonvolatile semiconductor memory transistor is configured such that a source region 303, a channel region 304, and a drain region 302 constitute a cylindrical island-shaped semiconductor 301, and are formed in this order from the silicon substrate 101 side. The nonvolatile semiconductor memory transistor further includes a hollow pillar-shaped floating gate 306 arranged so as to surround the outer periphery of the channel region 304, and a hollow pillar-shaped control gate 308 that is located around the outer periphery of the floating gate 306 and that is arranged so as to face (enclose) the floating gate 306. Here, a tunnel insulating film 305 is arranged so as to be interposed between the floating gate 306 and the channel region 304. Further, an inter-polysilicon insulating film 307 is arranged so as to be interposed between the control gate 308 and the floating gate 306.

As illustrated in FIG. 1, the floating gate 306 has a ring-shaped recess **306*a* formed along the outer peripheral wall thereof. The hollow pillar-shaped control gate 308 is arranged in the recess 306*a* in such a manner that the inter-polysilicon insulating film 307 is interposed between the recess 306*a* and the up, lower, and inner side surfaces of the control gate 308. With this arrangement configuration, the inter-polysilicon insulating film 307 which serves as a dielectric is formed to be thin and is also formed to have a wide area, as compared to the size (volume) of the control gate 308, between the control gate 308 and the floating gate 306. Thus, the capacitance (electrostatic capacitance) between the floating gate 306 and the control gate 308 can be increased. In addition, with this arrangement configuration, the upper, lower, and inner side surfaces of the control gate 308 are covered with the floating gate 306 which is a conductor. Thus, the control gate 308 and the island-shaped semiconductor 301 are prevented from being brought into close proximity to each other with an insulating film therebetween, and the parasitic capacitance between the control gate 308 and the island-shaped semiconductor 301** can be made substantially 0 (zero).

Figure 2A:
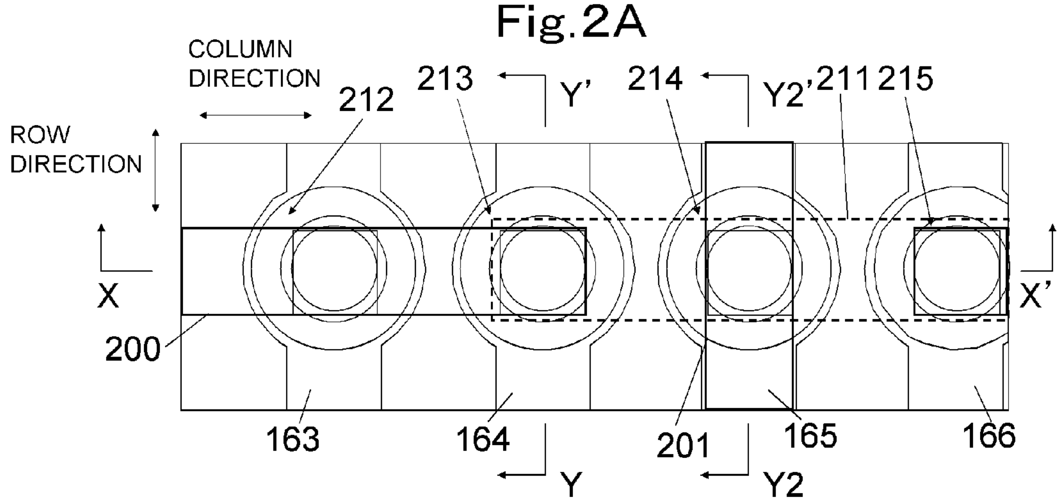
FIG. 2A is a plan view of a nonvolatile semiconductor memory according to an embodiment of the present invention.

FIGS. 2A, 2B, 2C, and 2D illustrate respectively a plan view of a nonvolatile semiconductor memory according to this embodiment, a cross-sectional view taken along line X-X' of FIG. 2A, a cross-sectional view taken along line Y-Y' of FIG. 2A, and a cross-sectional view taken along line Y2-Y2' of FIG. 2A.

Figure 2B:
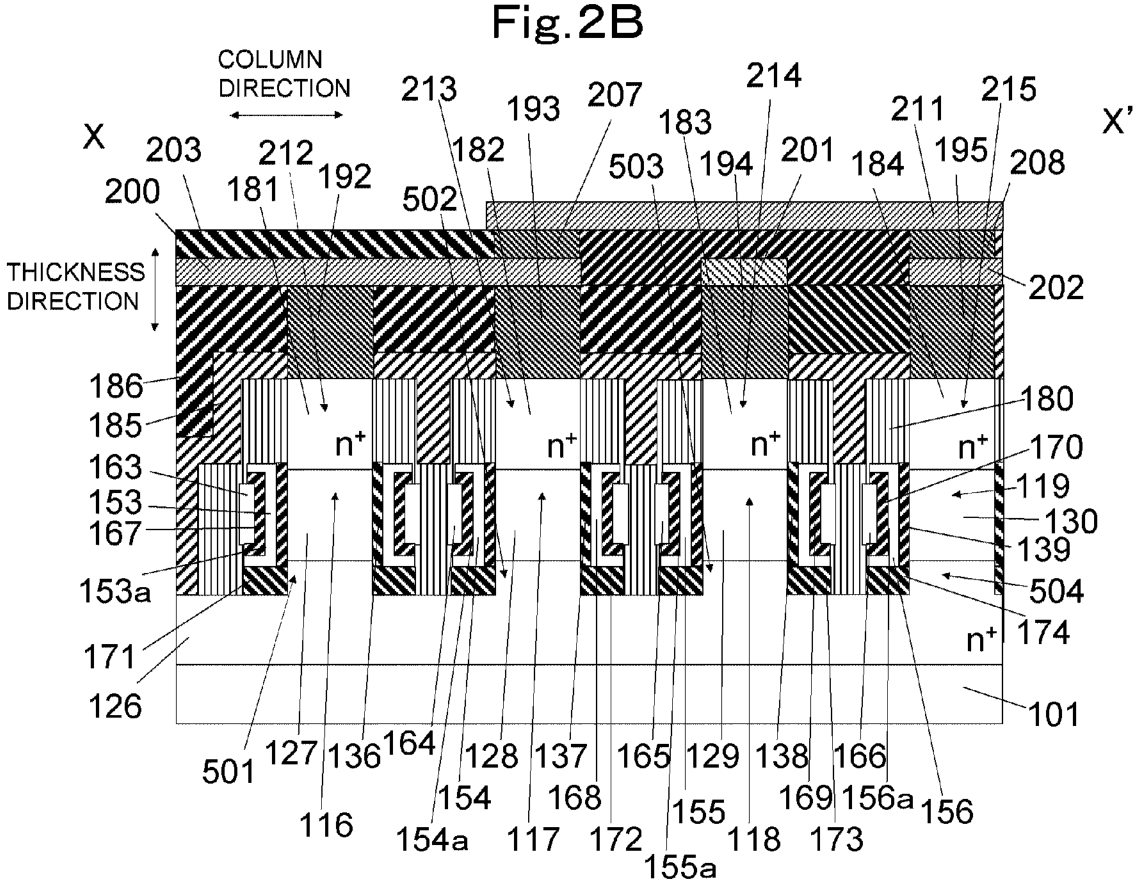
FIG. 2B is a cross-sectional view taken along line X-X' of FIG. 2A.

As illustrated in FIGS. 2A and 2B, the nonvolatile semiconductor memory is configured such that a plurality of (in the figures, four) nonvolatile semiconductor memory transistors 212, 213, 214, and 215 each having the structure illustrated in FIG. 1 are arranged in a plurality of row directions in row and column directions on the silicon substrate 101 so as to be aligned in a straight line at substantially equal angles and intervals.

In the nonvolatile semiconductor memory illustrated in FIGS. 2A to 2D, the nonvolatile semiconductor memory transistor 212 is arranged in the first column in the column direction among the row and column directions on the silicon substrate 101.

As illustrated in FIGS. 2A and 2B, in the nonvolatile semiconductor memory transistor 212, a source region 501, a channel region 127, and a drain region 181 constitute an island-shaped semiconductor 116, and are formed in this order from the silicon substrate 101 side.

The nonvolatile semiconductor memory transistor 212 further includes a hollow pillar-shaped floating gate 153 that is arranged so as to surround the outer periphery of the channel region 127 in such a manner that a tunnel insulating film 136 is interposed between the floating gate 153 and the channel region 127, and a hollow pillar-shaped control gate 163 that is arranged so as to surround the outer periphery of the floating gate 153 in such a manner that an inter-polysilicon insulating film 167 is interposed between the control gate 163 and the floating gate 153.

As illustrated in FIG. 2B, the floating gate 153 has a ring-shaped recess **153*a* formed along the outer peripheral wall thereof. The hollow pillar-shaped control gate 163 is received in the recess 153*a* in such a manner that the inter-polysilicon insulating film 167 is interposed between the recess 153*a* and the upper, lower, and inner side surfaces of the control gate 163**.

In the nonvolatile semiconductor memory transistor 212, a first insulating film 171 that is thicker than the tunnel insulating film 136 and the inter-polysilicon insulating film 167 is arranged on the lower surface of the floating gate 153. Here, the thickness of the first insulating film 171 is larger than the thickness of the tunnel insulating film 136 and the inter-polysilicon insulating film 167. However, this is not meant to be limiting, and the first insulating film 171 may be thicker than at least one of the tunnel insulating film 136 and the inter-polysilicon insulating film 167.

In the nonvolatile semiconductor memory illustrated in FIGS. 2A, 2B, 2C, and 2D, the nonvolatile semiconductor memory transistor 213 is arranged in the second column in the column direction among the row and column directions on the silicon substrate 101.

Figure 2C:
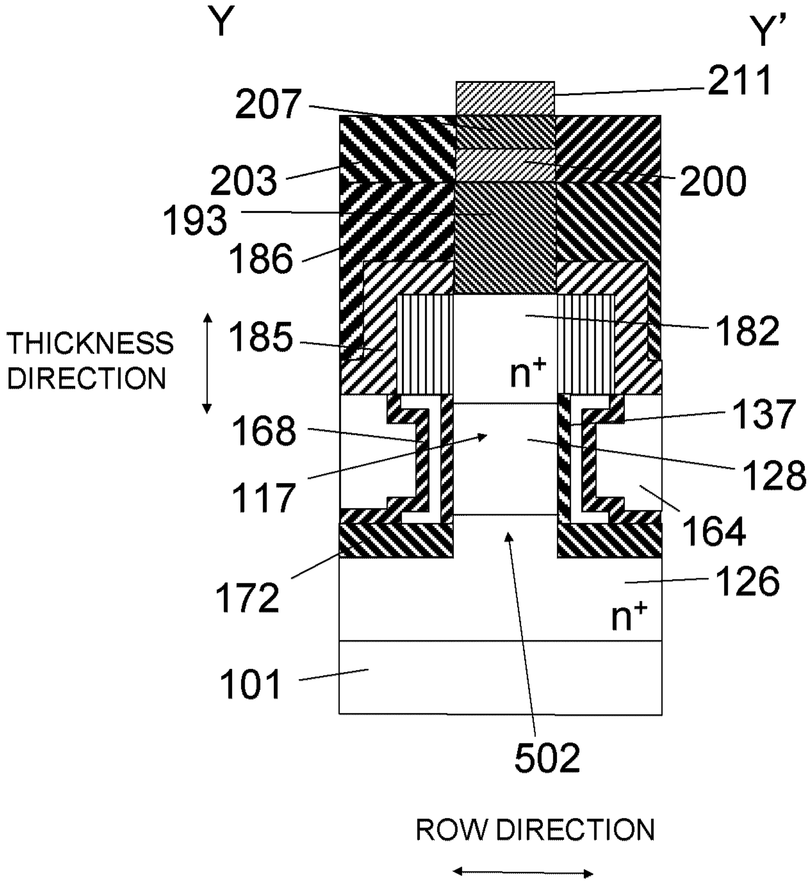
FIG. 2C is a cross-sectional view taken along line Y-Y' of FIG. 2A.

As illustrated in FIGS. 2A, 2B, and 2C, in the nonvolatile semiconductor memory transistor 213, a source region 502, a channel region 128, and a drain region 182 constitute an island-shaped semiconductor 117, and are formed in this order from the silicon substrate 101 side.

The nonvolatile semiconductor memory transistor 213 includes a hollow pillar-shaped floating gate 154 that is arranged so as to surround the outer periphery of the channel region 128 in such a manner that a tunnel insulating film 137 is interposed between the floating gate 154 and the channel region 128, and a hollow pillar-shaped control gate 164 that is arranged so as to surround the outer periphery of the floating gate 154 in such a manner that an inter-polysilicon insulating film 168 is interposed between the control gate 164 and the floating gate 154.

As illustrated in FIGS. 2B and 2C, the floating gate 154 has a ring-shaped recess **154*a* formed along the outer peripheral wall thereof. The hollow pillar-shaped control gate 164 is received in the recess 154*a* in such a manner that the inter-polysilicon insulating film 168 is interposed between the recess 154*a* and the upper, lower, and inner side surfaces of the control gate 164**.

In the nonvolatile semiconductor memory transistor 213, a first insulating film 172 that is thicker than the tunnel insulating film 137 and the inter-polysilicon insulating film 168 is arranged on the lower surface of the floating gate 154. Here, the thickness of the first insulating film 172 is larger than the thickness of the tunnel insulating film 137 and the inter-polysilicon insulating film 168. However, this is not meant to be limiting, and the first insulating film 172 may be thicker than at least one of the tunnel insulating film 137 and the inter-polysilicon insulating film 168.

In the nonvolatile semiconductor memory illustrated in FIGS. 2A to 2D, the nonvolatile semiconductor memory transistor 214 is arranged in the third column in the column direction among the row and column directions on the silicon substrate 101.

Figure 2D:
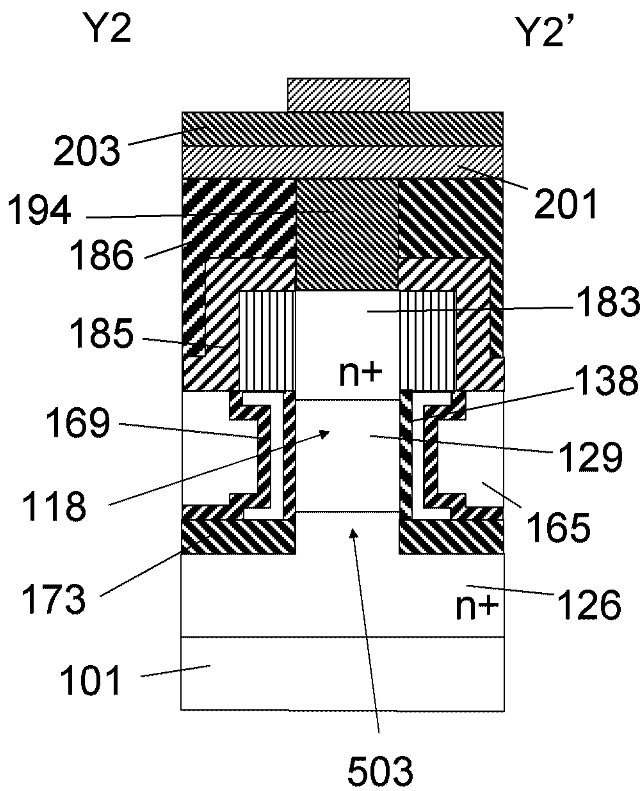
FIG. 2D is a cross-sectional view taken along line Y2-Y2' of FIG. 2A.

As illustrated in FIGS. 2A, 2B, and 2D, in the nonvolatile semiconductor memory transistor 214, a source region 503, a channel region 129, and a drain region 183 constitute an island-shaped semiconductor 118, and are formed in this order from the silicon substrate 101.

The nonvolatile semiconductor memory transistor 214 includes a hollow pillar-shaped floating gate 155 that is arranged so as to surround the outer periphery of the channel region 129 in such a manner that a tunnel insulating film 138 is interposed between the floating gate 155 and the channel region 129, and a hollow pillar-shaped control gate 165 that is arranged so as to surround the outer periphery of the floating gate 155 in such a manner that an inter-polysilicon insulating film 169 is interposed between the control gate 165 and the floating gate 155.

As illustrated in FIGS. 2B and 2D, the floating gate 155 has a ring-shaped recess 155*a* formed along the outer peripheral wall thereof. The hollow pillar-shaped control gate 165 is received in the recess 155*a* in such a manner that the inter-polysilicon insulating film 169 is interposed between the recess 155*a* and the upper, lower, and inner side surfaces of the control gate 165.

In the nonvolatile semiconductor memory transistor 214, a first insulating film 173 that is thicker than the tunnel insulating film 138 and the inter-polysilicon insulating film 169 is arranged on the lower surface of the floating gate 155. Here, the thickness of the first insulating film 173 is larger than the thickness of the tunnel insulating film 138 and the inter-polysilicon insulating film 169. However, this is not meant to be limiting, and the first insulating film 173 may be thicker than at least one of the tunnel insulating film 138 and the inter-polysilicon insulating film 169.

In the nonvolatile semiconductor memory illustrated in FIGS. 2A to 2D, the nonvolatile semiconductor memory transistor 215 is arranged in the fourth column in the column direction among the row and column directions on the silicon substrate 101.

As illustrated in FIGS. 2A and 2B, in the nonvolatile semiconductor memory transistor 215, a source region 504, a channel region 130, and a drain region 184 constitute an island-shaped semiconductor 119, and are formed in this order from the silicon substrate 101 side.

The nonvolatile semiconductor memory transistor 215 includes a hollow pillar-shaped floating gate 156 that is arranged so as to surround the outer periphery of the channel region 130 in such a manner that a tunnel insulating film 139 is interposed between the floating gate 156 and the channel region 130, and a hollow pillar-shaped control gate 166 that is arranged so as to surround the outer periphery of the floating gate 156 in such a manner that an inter-polysilicon insulating film 170 is interposed between the control gate 166 and the floating gate 156.

As illustrated in FIG. 2B, the floating gate 156 has a ring-shaped recess 156*a* formed along the outer peripheral wall thereof. The hollow pillar-shaped control gate 166 is received in the recess 156*a* in such a manner that the inter-polysilicon insulating film 170 is interposed between the recess 156*a* and the upper, lower, and inner side surfaces of the control gate 166.

In the nonvolatile semiconductor memory transistor 215, a first insulating film 174 that is thicker than the tunnel insulating film 139 and the inter-polysilicon insulating film 170 is arranged on the lower surface of the floating gate 156. Here, the thickness of the first insulating film 174 is larger than the thickness of the tunnel insulating film 139 and the inter-polysilicon insulating film 170. However, this is not meant to be limiting, and the first insulating film 174 may be thicker than at least one of the tunnel insulating film 139 and the inter-polysilicon insulating film 170.

In the nonvolatile semiconductor memory illustrated in FIGS. 2A to 2D, the source regions 501, 502, 503, and 504 of the nonvolatile semiconductor memory transistors 212, 213, 214, and 215 are formed in lower portions of the island-shaped semiconductors 116, 117, 118, and 119 of the nonvolatile semiconductor memory transistors 212, 213, 214, and 215, respectively, and are electrically connected to a first source line 126 arranged in the column direction among the row and column directions on the silicon substrate 101. Further, the drain regions 181, 182, and 184 of the nonvolatile semiconductor memory transistors 212, 213, and 215 are electrically connected to main metal wiring lines 200 and 202 which serve as drain wiring lines arranged in the column direction among the row and column directions on the silicon substrate 101. Further, the drain region 183 of the nonvolatile semiconductor memory transistor 214 is electrically connected to a second source line 201 arranged in the row direction among the row and column directions on the silicon substrate 101.

In the nonvolatile semiconductor memory illustrated in FIGS. 2A to 2D, the first insulating films 171, 172, 173, and 174 that are thicker than the tunnel insulating films 136, 137, 138, and 139 and the inter-polysilicon insulating films 167, 168, 169, and 170 are arranged below the floating gates 153, 154, 155, and 156 of the nonvolatile semiconductor memory transistors 212, 213, 214, and 215, respectively. Therefore, in the nonvolatile semiconductor memory transistors 212, 213, 214, and 215, the parasitic capacitance between the floating gates 153, 154, 155, and 156 and the first source line 126 is reduced. Consequently, a voltage applied from an external power source (not illustrated in the figures) to the control gates 163, 164, 165, and 166 is more efficiently transmitted to the floating gates 153, 154, 155, and 156 than when the first insulating films 171, 172, 173, and 174 are not arranged. Therefore, more reliable writing, erasing, and reading of information such as "1" or "0" are achievable in the nonvolatile semiconductor memory transistors 212, 213, 214, and 215.

In the nonvolatile semiconductor memory illustrated in FIGS. 2A to 2D, furthermore, the drain region 183 of the nonvolatile semiconductor memory transistor 214 arranged in the third column on the top of the silicon substrate 101 is connected via a contact 194 to the second source line 201 arranged in the column direction among the row and column directions on the silicon substrate 101. The nonvolatile semiconductor memory transistor 214 is used for applying a voltage to the first source line 126 from the second source line 201 via the transistor 214. For this purpose, a repeated pattern of nonvolatile semiconductor memory transistors 214 may be used. The use of such a repeated pattern of nonvolatile semiconductor memory transistors 214 provides enhanced resolution of exposure and uniformity of processing shape at the time of manufacturing.

An example of a manufacturing step for forming a memory cell array structure of the nonvolatile semiconductor memory according to the embodiment of the present invention will be described hereinafter with reference to FIGS. 3A to 56C.

Figure 3A:
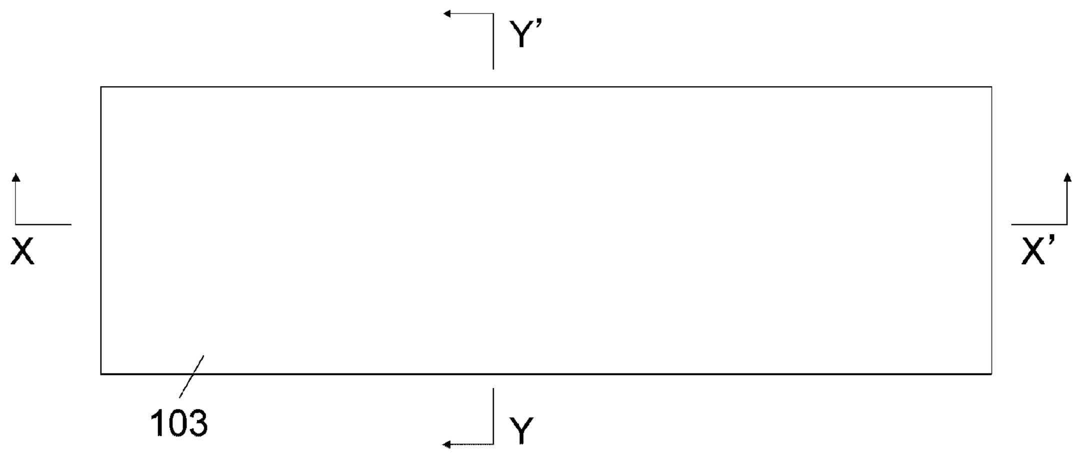
FIG. 3A is a plan view illustrating a method for manufacturing the nonvolatile semiconductor memory according to an embodiment of the present invention.
Figure 3B:
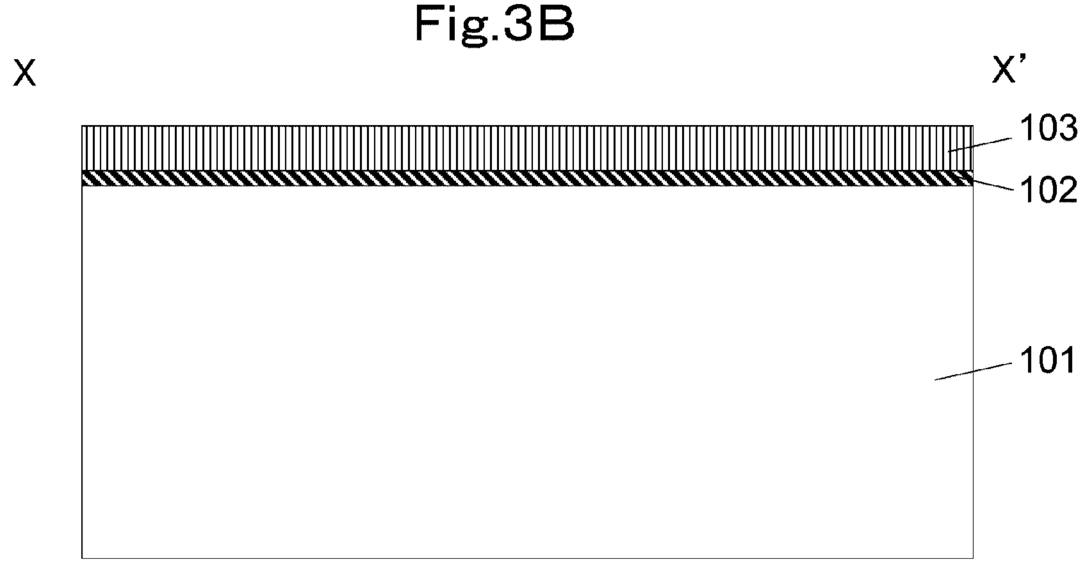
FIG. 3B is a cross-sectional view taken along line X-X' of FIG. 3A.
Figure 3C:
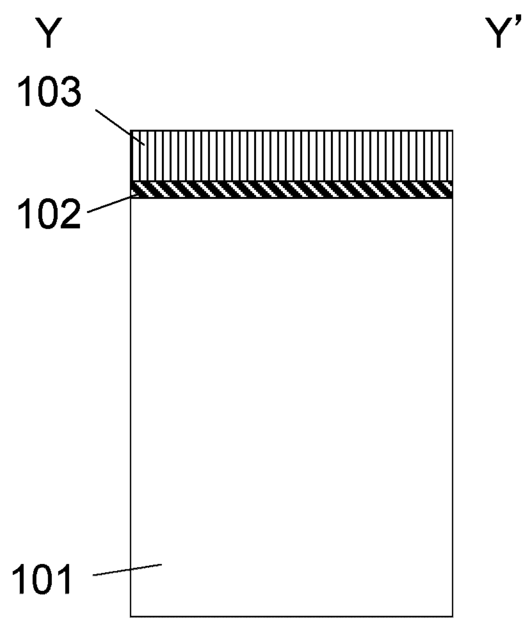
FIG. 3C is a cross-sectional view taken along line Y-Y' of FIG. 3A.

Referring to FIGS. 3A to 3C, an oxide film 102 is deposited on the top of a silicon substrate 101. After that, a nitride film 103 is deposited from above the oxide film 102.

Figure 4A:
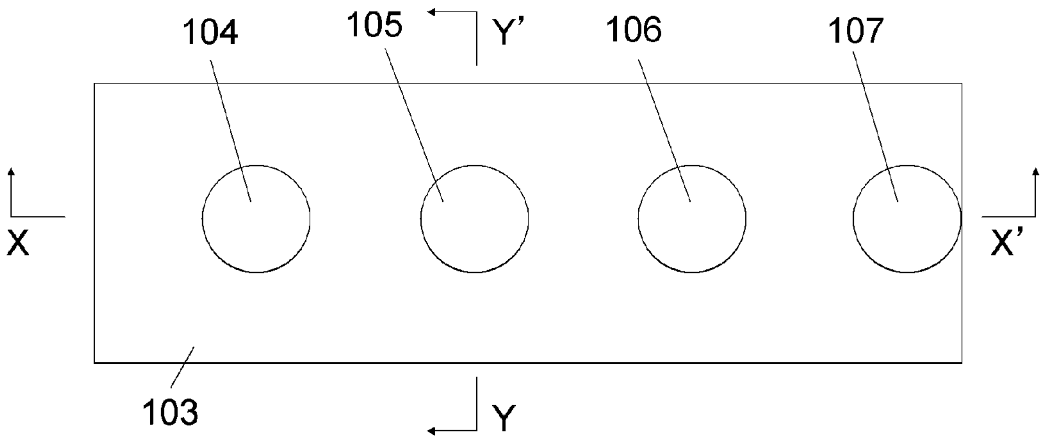
FIG. 4A is a plan view illustrating the method for manufacturing the nonvolatile semiconductor memory according to the embodiment of the present invention.
Figure 4B:
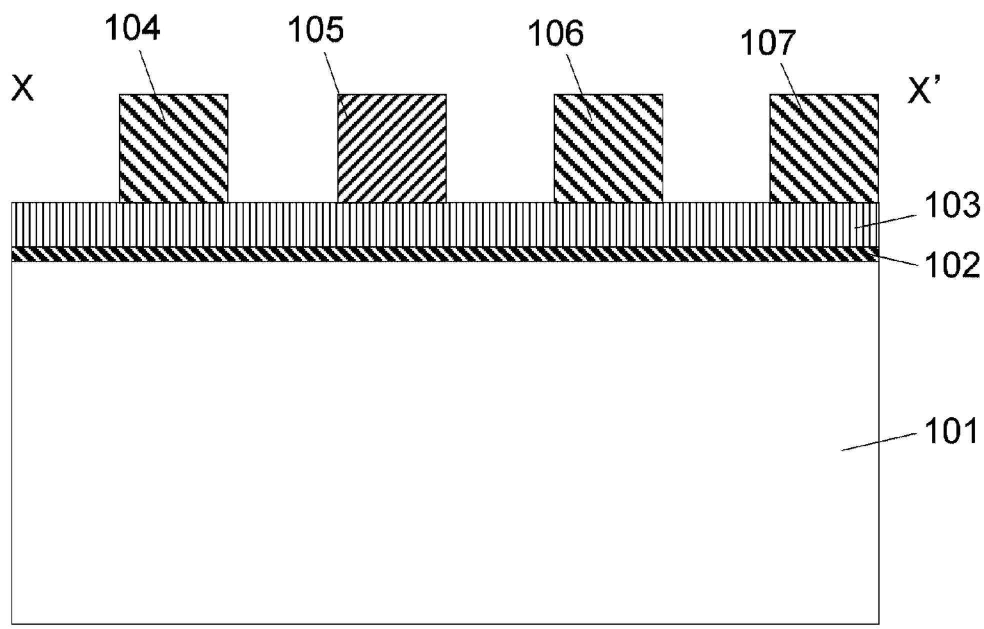
FIG. 4B is a cross-sectional view taken along line X-X' of FIG. 4A.
Figure 4C:
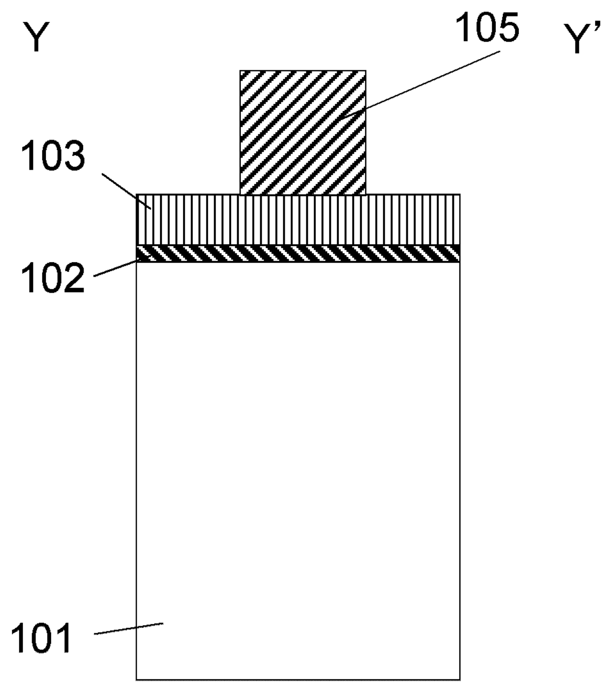
FIG. 4C is a cross-sectional view taken along line Y-Y' of FIG. 4A.

Subsequently, referring to FIGS. 4A to 4C, resists 104, 105, 106, and 107 for forming the island-shaped semiconductors 116, 117, 118, and 119 are formed at predetermined positions on the nitride film 103.

Figure 5A:
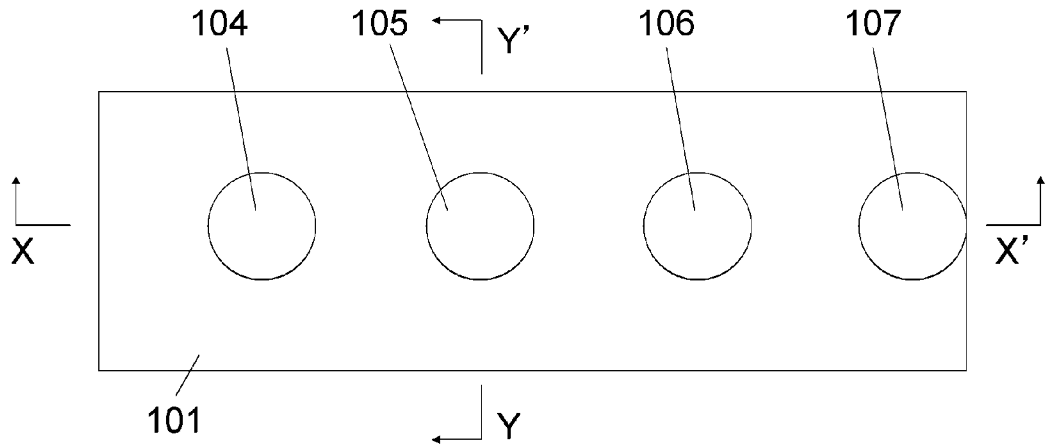
FIG. 5A is a plan view illustrating the method for manufacturing the nonvolatile semiconductor memory according to the embodiment of the present invention.
Figure 5B:
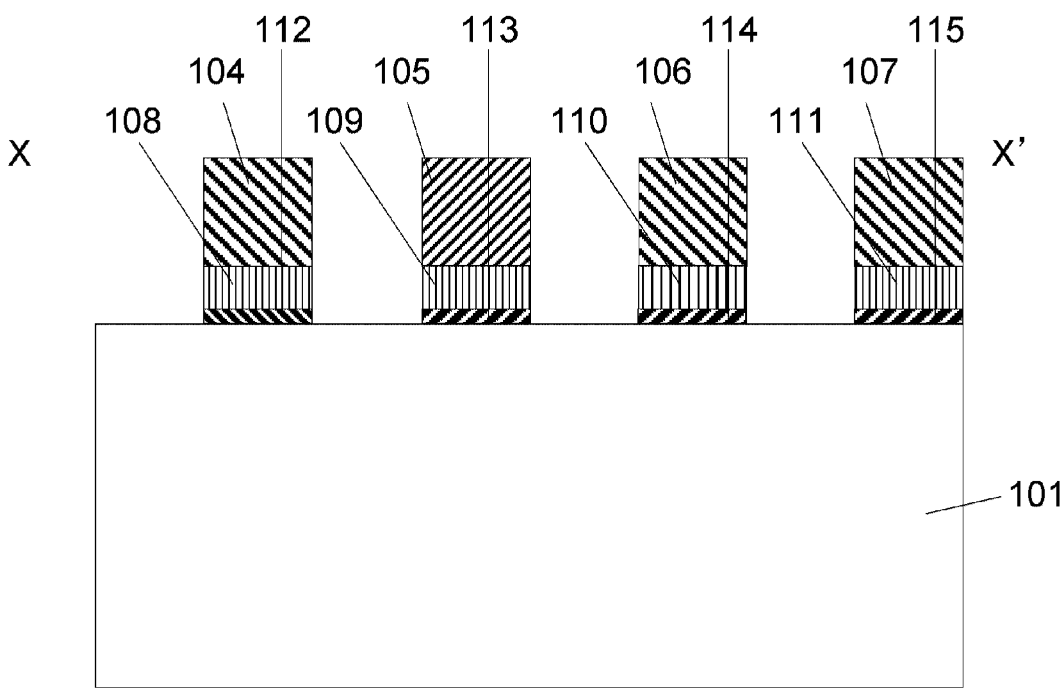
FIG. 5B is a cross-sectional view taken along line X-X' of FIG. 5A.
Figure 5C:
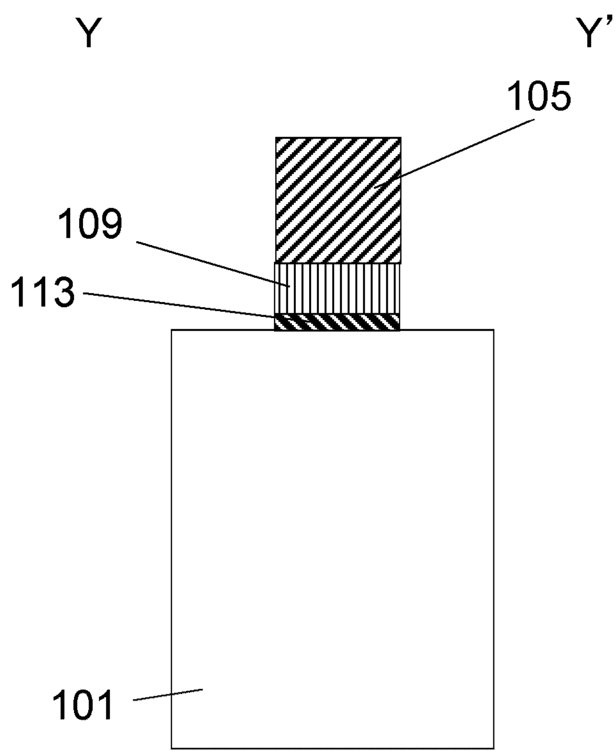
FIG. 5C is a cross-sectional view taken along line Y-Y' of FIG. 5A.

Subsequently, referring to FIGS. 5A to 5C, the nitride film 103 and the oxide film 102 are etched by reactive ion etching (RIE) using the resists 104, 105, 106, and 107 as masks. Thereby, a hard mask made of a nitride film 108 and an oxide film 112, a hard mask made of a nitride film 109 and an oxide film 113, a hard mask made of a nitride film 110 and an oxide film 114, and a hard mask made of a nitride film 111 and an oxide film 115 are formed on the top of the silicon substrate 101.

Figure 6A:
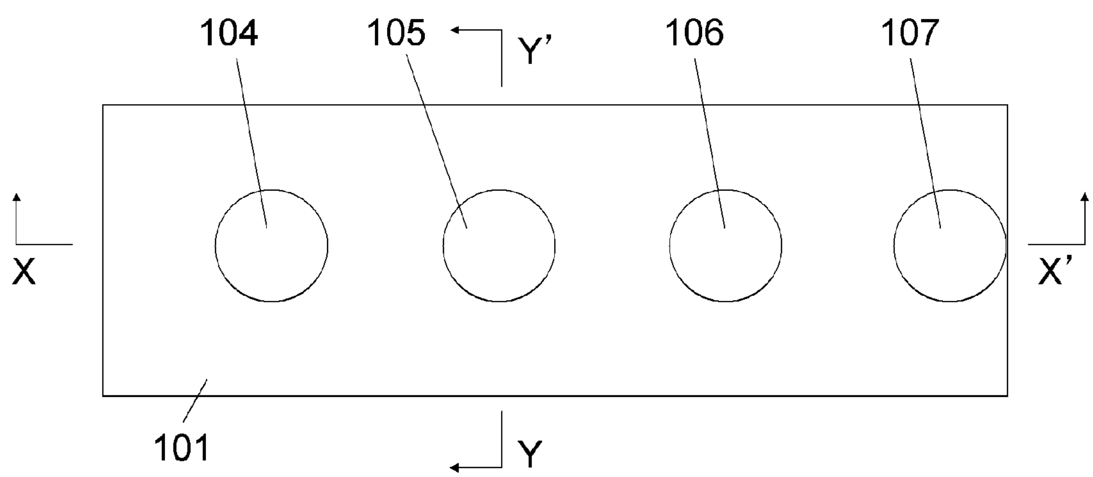
FIG. 6A is a plan view illustrating the method for manufacturing the nonvolatile semiconductor memory according to the embodiment of the present invention.
Figure 6B:
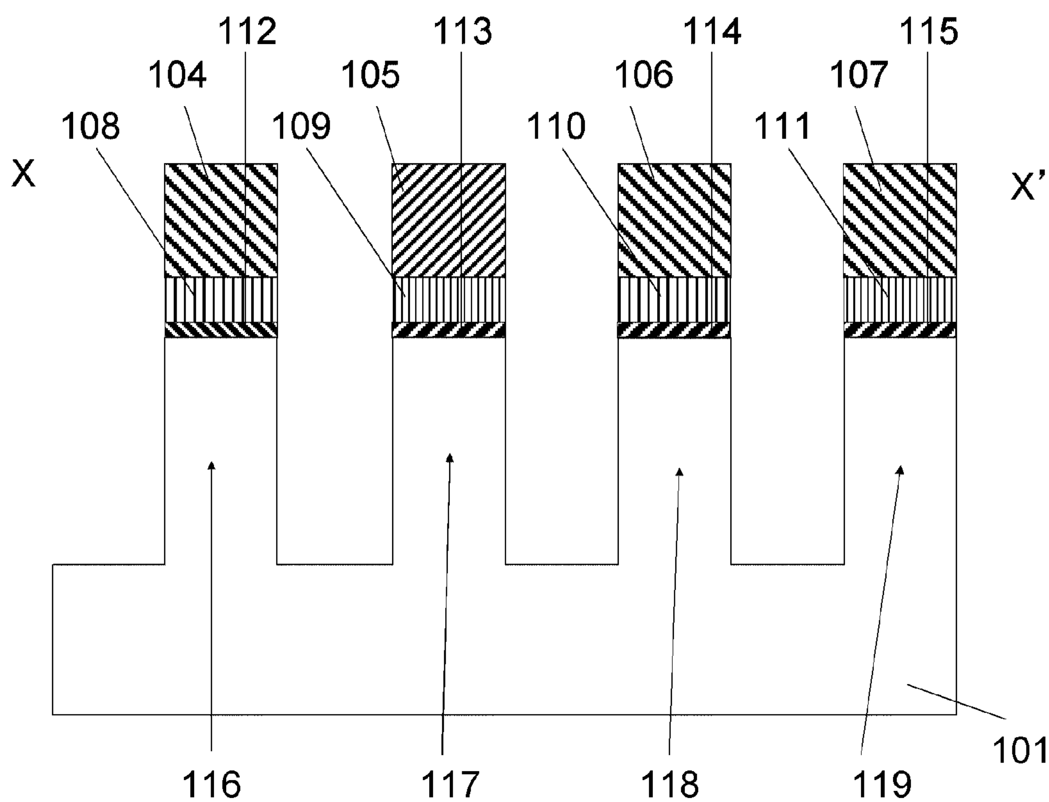
FIG. 6B is a cross-sectional view taken along line X-X' of FIG. 6A.
Figure 6C:
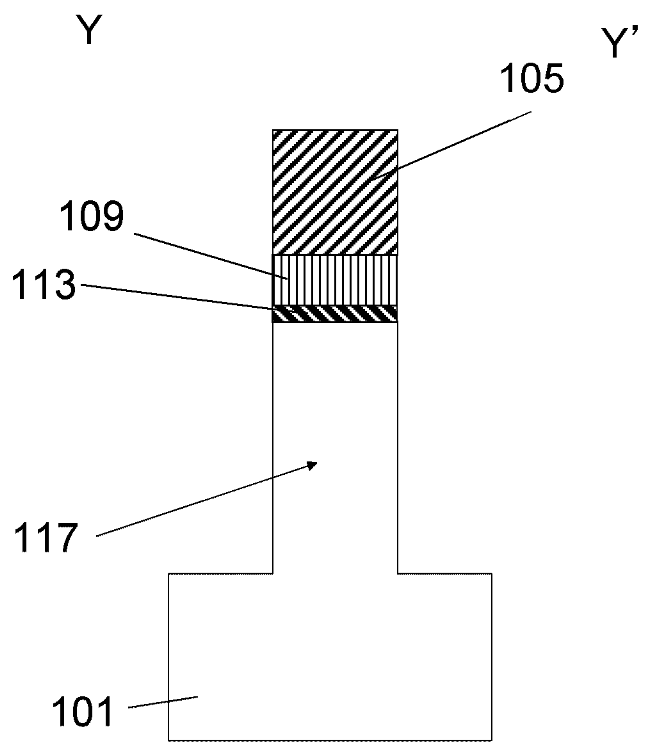
FIG. 6C is a cross-sectional view taken along line Y-Y' of FIG. 6A.

Subsequently, referring to FIGS. 6A to 6C, further, the silicon substrate 101 is etched by reactive ion etching using the resists 104, 105, 106, and 107 as masks, and the island-shaped semiconductors 116, 117, 118, and 119 are formed.

Figure 7A:
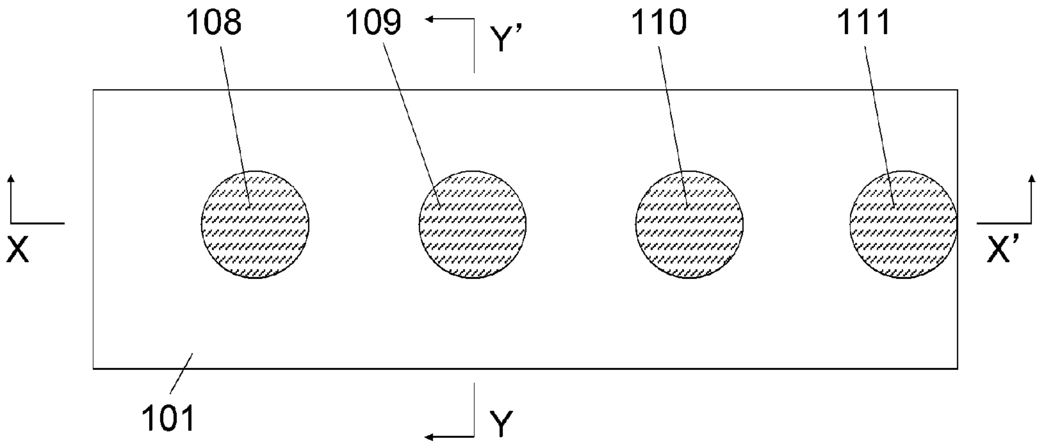
FIG. 7A is a plan view illustrating the method for manufacturing the nonvolatile semiconductor memory according to the embodiment of the present invention.
Figure 7B:
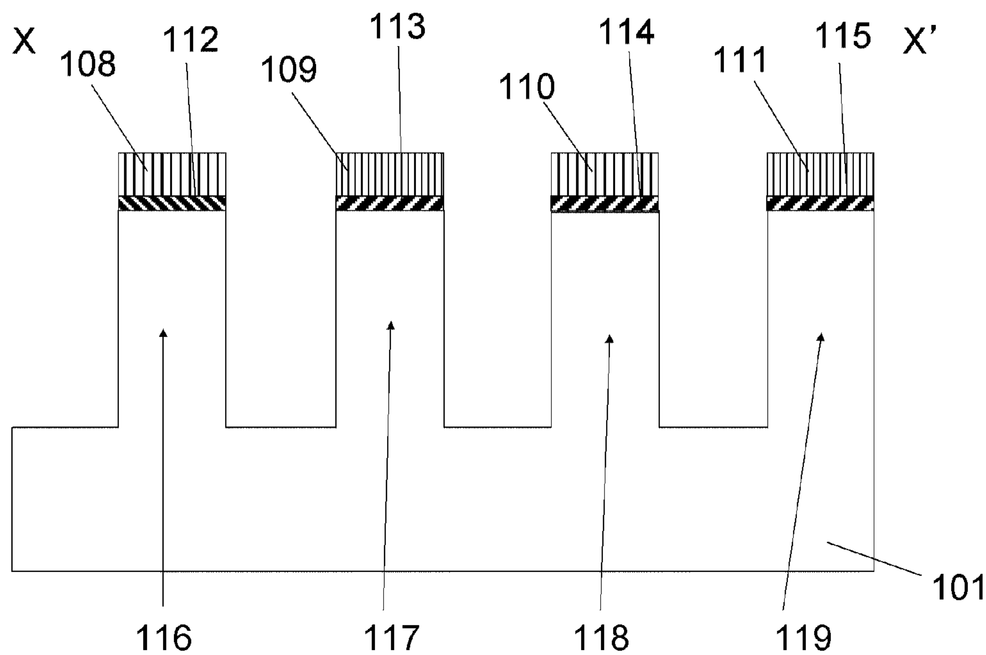
FIG. 7B is a cross-sectional view taken along line X-X' of FIG. 7A.
Figure 7C:
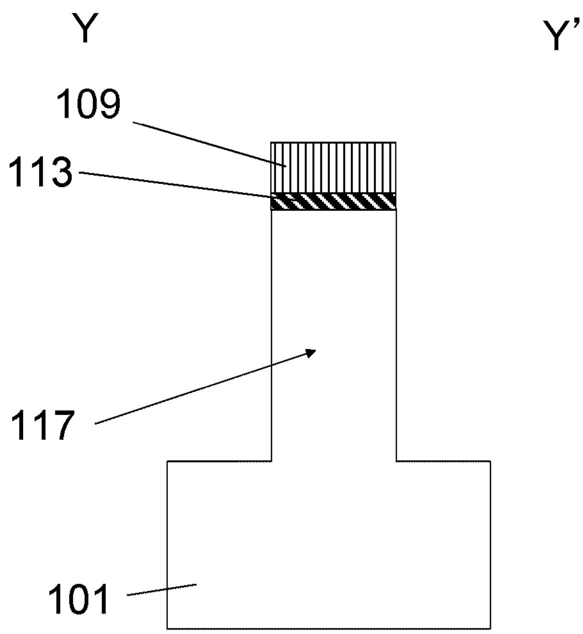
FIG. 7C is a cross-sectional view taken along line Y-Y' of FIG. 7A.

Subsequently, referring to FIGS. 7A to 7C, the resists 104, 105, 106, and 107 are stripped.

Figure 8A:
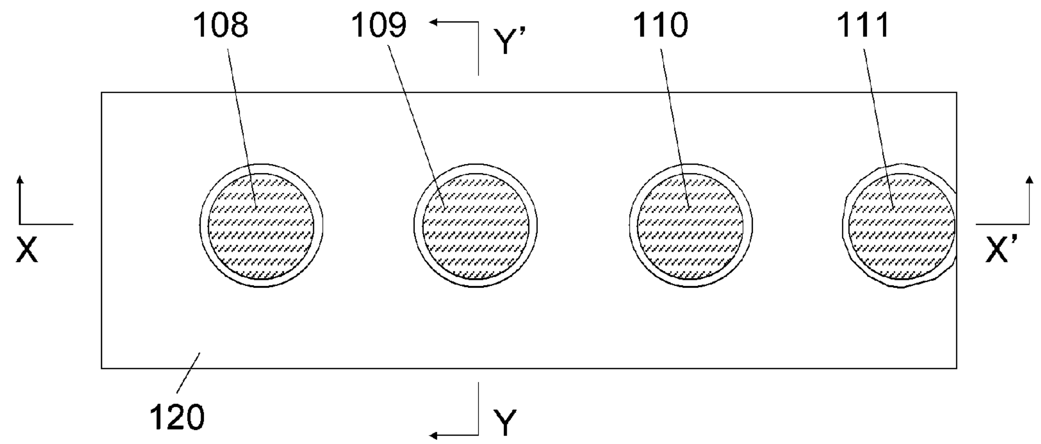
FIG. 8A is a plan view illustrating the method for manufacturing the nonvolatile semiconductor memory according to the embodiment of the present invention.
Figure 8B:
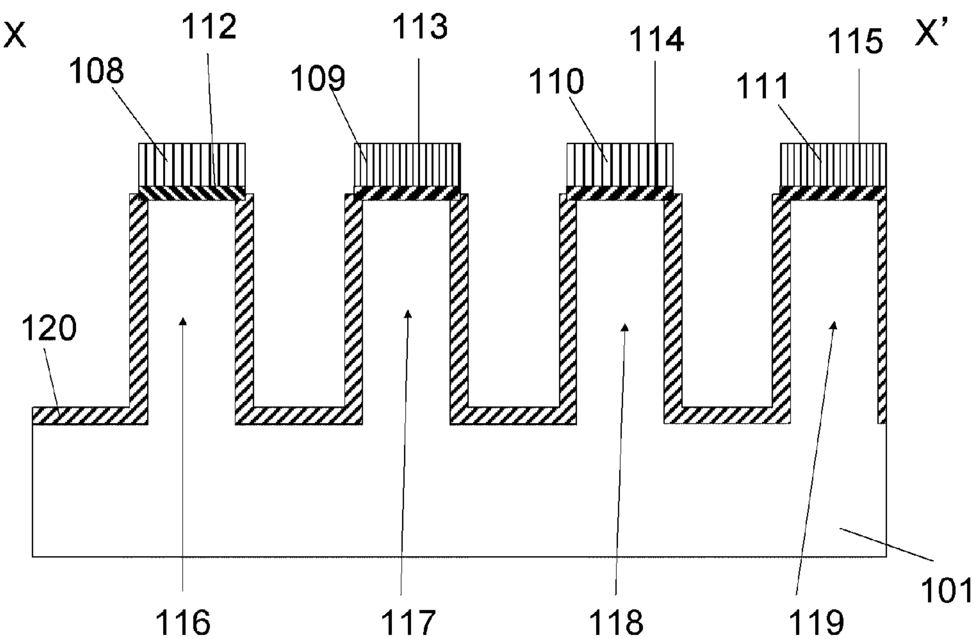
FIG. 8B is a cross-sectional view taken along line X-X' of FIG. 8A.
Figure 8C:
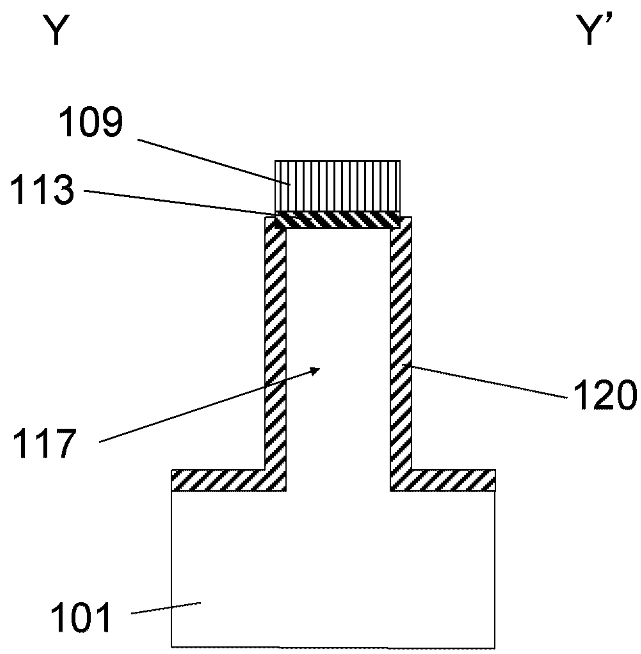
FIG. 8C is a cross-sectional view taken along line Y-Y' of FIG. 8A.

Subsequently, referring to FIGS. 8A to 8C, a sacrificial oxide film 120 is formed on the outer peripheral wall surfaces of the island-shaped semiconductors 116, 117, 118, and 119, on the bottom surfaces of the gaps between the island-shaped semiconductors 116, 117, 118, and 119, and on the portion between the island-shaped semiconductor 116 and the corresponding edge of the silicon substrate 101 by performing sacrificial oxidation on the island-shaped semiconductors 116, 117, 118, and 119.

Figure 9A:
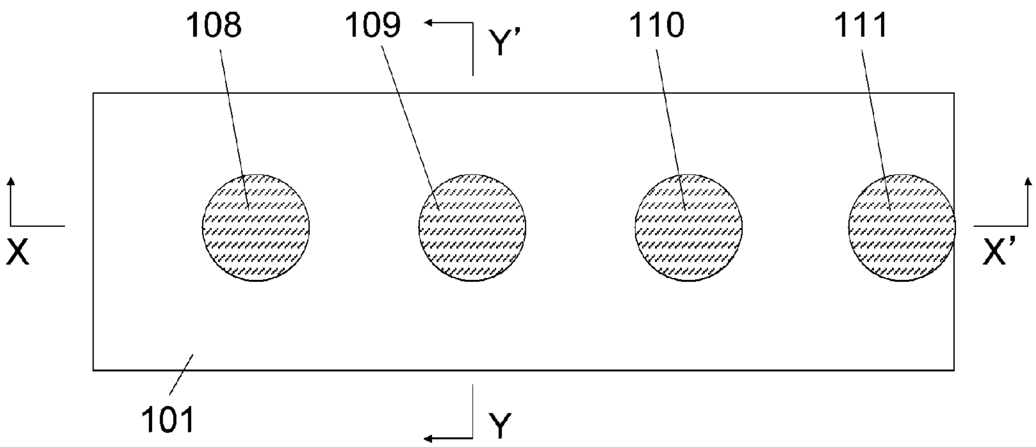
FIG. 9A is a plan view illustrating the method for manufacturing the nonvolatile semiconductor memory according to the embodiment of the present invention.
Figure 9B:
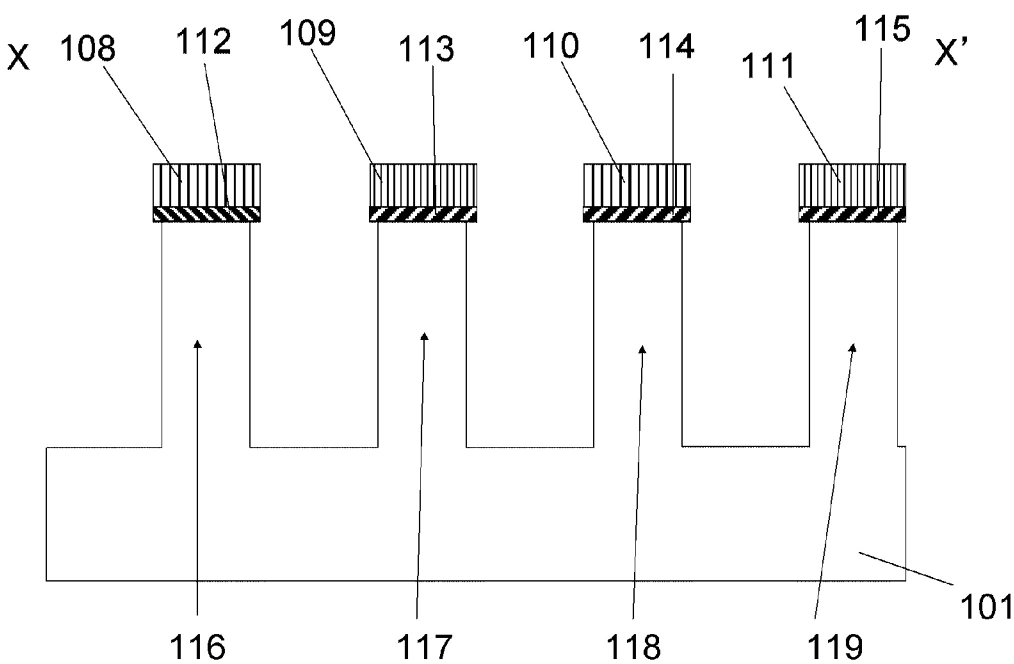
FIG. 9B is a cross-sectional view taken along line X-X' of FIG. 9A.
Figure 9C:
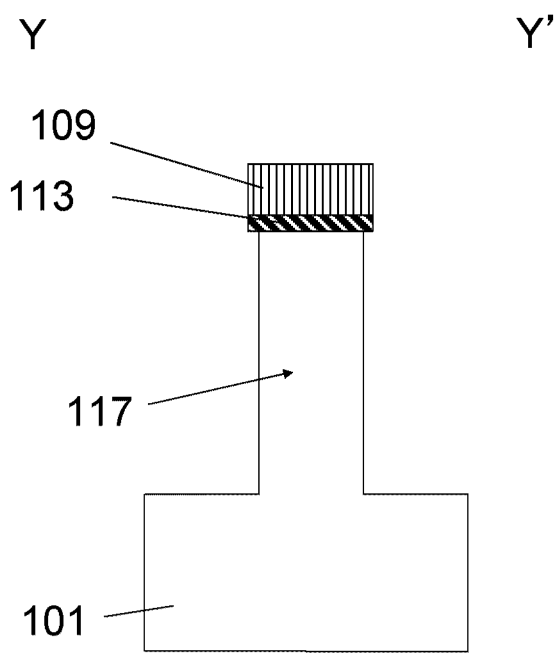
FIG. 9C is a cross-sectional view taken along line Y-Y' of FIG. 9A.

Subsequently, referring to FIGS. 9A to 9C, the sacrificial oxide film 120 is removed from the outer peripheral wall surfaces of the island-shaped semiconductors 116, 117, 118, and 119, from the bottom surfaces of the gaps between the island-shaped semiconductors 116, 117, 118, and 119, and from the portion between the island-shaped semiconductor 116 and the corresponding edge of the silicon substrate 101 so that silicon surfaces of the silicon substrate 101 and the island-shaped semiconductors 116, 117, 118, and 119 are exposed.

Figure 10A:
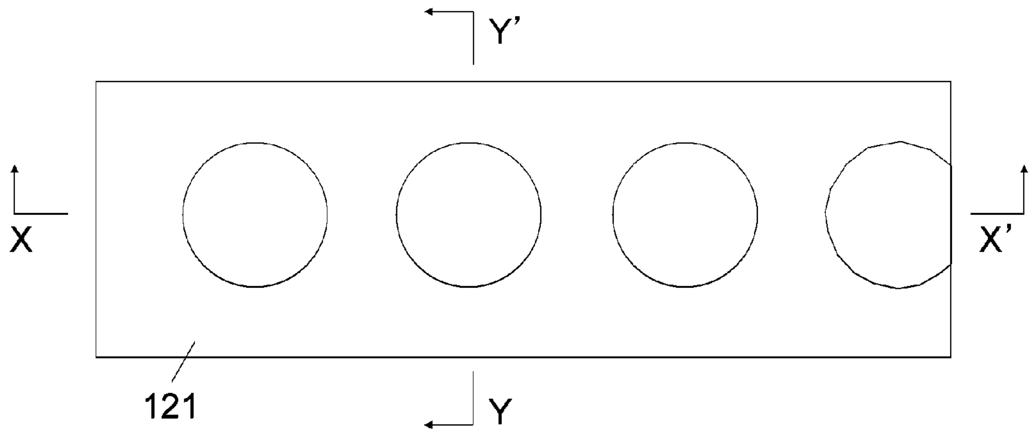
FIG. 10A is a plan view illustrating the method for manufacturing the nonvolatile semiconductor memory according to the embodiment of the present invention.
Figure 10B:
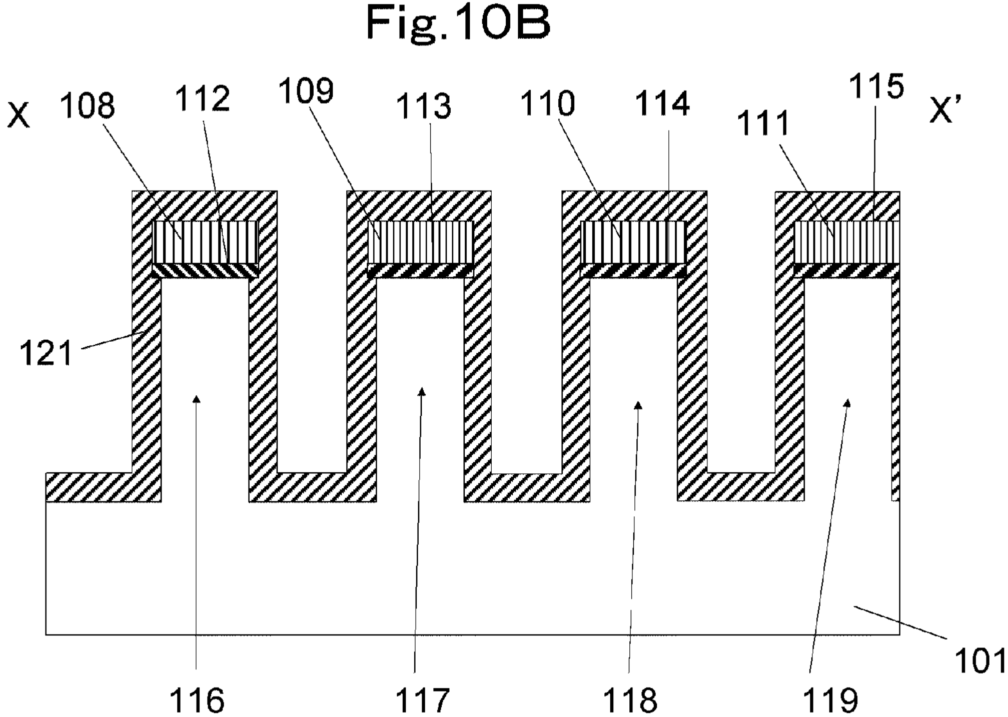
FIG. 10B is a cross-sectional view taken along line X-X' of FIG. 10A.
Figure 10C:
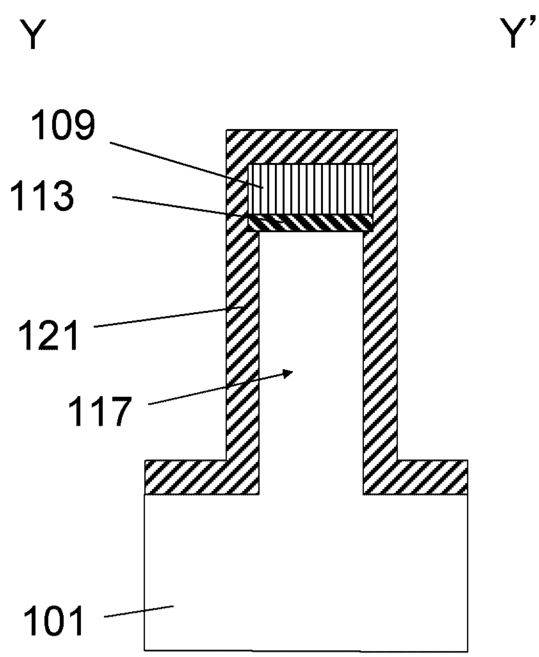
FIG. 10C is a cross-sectional view taken along line Y-Y' of FIG. 10A.

Subsequently, referring to FIGS. 10A to 10C, an oxide film 121 is deposited on the outer peripheral wall surfaces of the island-shaped semiconductors 116, 117, 118, and 119, on the bottom surfaces of the gaps between the island-shaped semiconductors 116, 117, 118, and 119, and on the portion between the island-shaped semiconductor 116 and the corresponding edge of the silicon substrate 101.

Figure 11A:
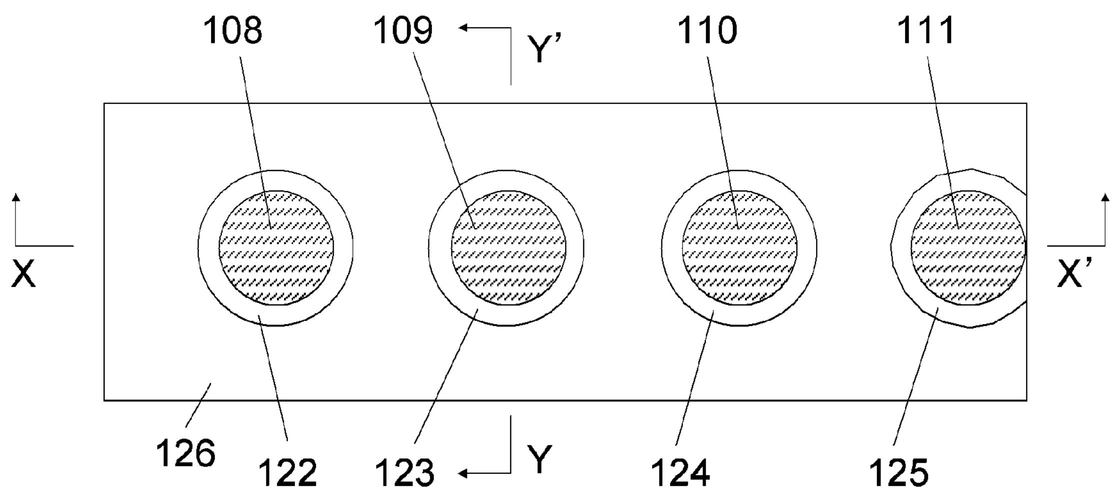
FIG. 11A is a plan view illustrating the method for manufacturing the nonvolatile semiconductor memory according to the embodiment of the present invention.
Figure 11B:
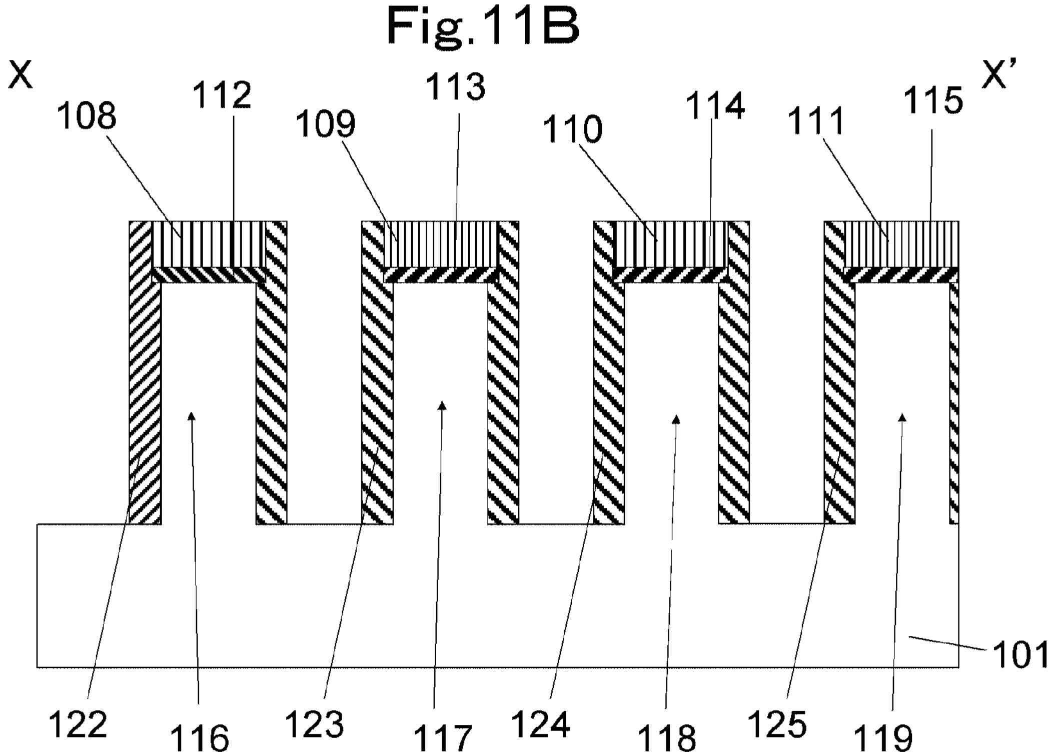
FIG. 11B is a cross-sectional view taken along line X-X' of FIG. 11A.
Figure 11C:
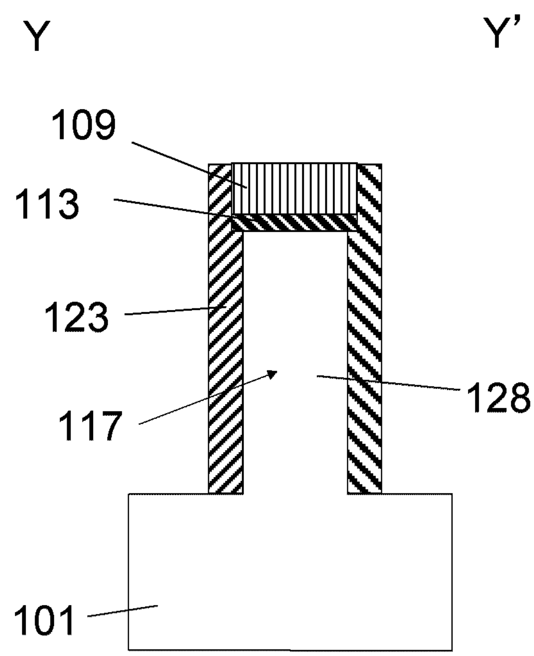
FIG. 11C is a cross-sectional view taken along line Y-Y' of FIG. 11A.

Subsequently, referring to FIGS. 11A to 11C, oxide film side walls 122, 123, 124, and 125 are formed on the outer peripheral wall surfaces of the island-shaped semiconductors 116, 117, 118, and 119 by etching the oxide film 121.

Figure 12A:
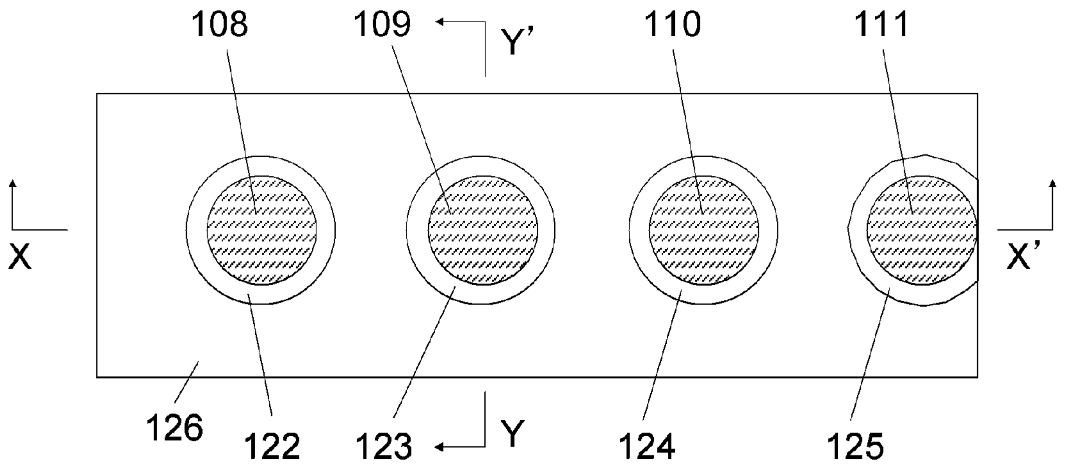
FIG. 12A is a plan view illustrating the method for manufacturing the nonvolatile semiconductor memory according to the embodiment of the present invention.
Figure 12B:
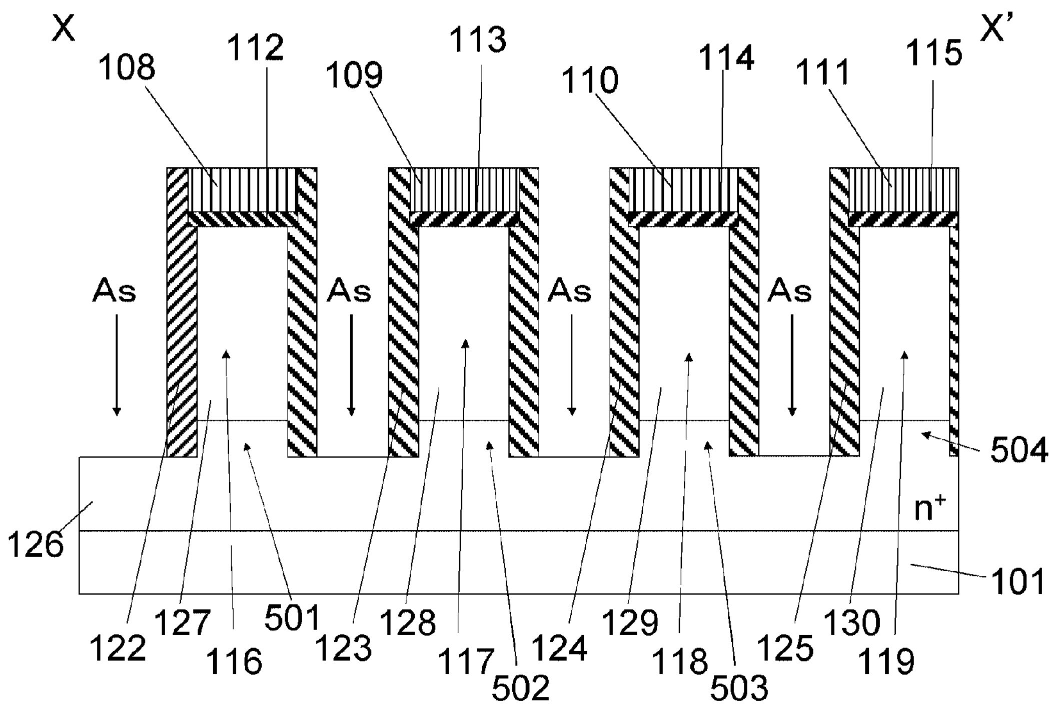
FIG. 12B is a cross-sectional view taken along line X-X' of FIG. 12A.
Figure 12C:
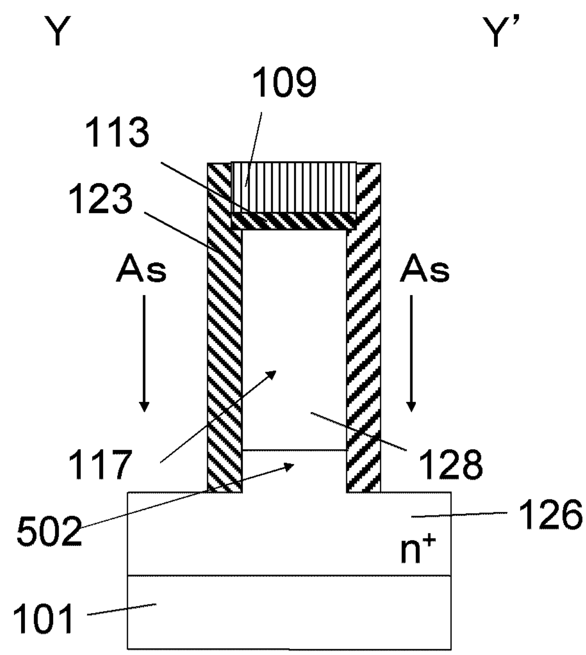
FIG. 12C is a cross-sectional view taken along line Y-Y' of FIG. 12A.

Subsequently, referring to FIGS. 12A to 12C, arsenic (see arrows As) is injected into the silicon substrate 101 to form a first source line 126 that is an n-type (second conductivity type) semiconductor on the surface of the silicon substrate 101. Further, source regions 501, 502, 503, and 504 are formed in lower portions of the island-shaped semiconductors 116, 117, 118, and 119 so as to be electrically connected to the first source line 126. At this time, channel regions 127, 128, 129, and 130 are formed between the source region 501 and the nitride film 108 and the oxide film 112, between the source region 502 and the nitride film 109 and the oxide film 113, between the source region 503 and the nitride film 110 and the oxide film 114, and between the source region 504 and the nitride film 111 and the oxide film 115, respectively.

Figure 13A:
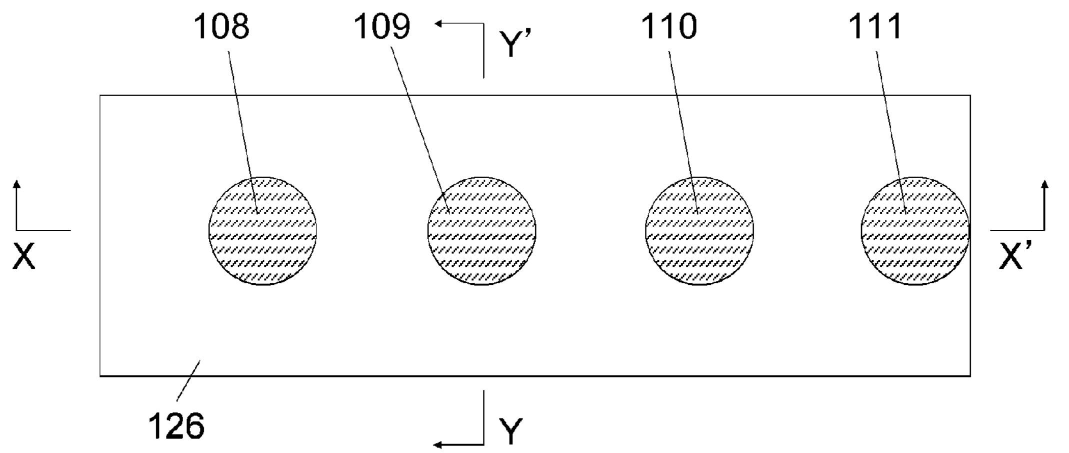
FIG. 13A is a plan view illustrating the method for manufacturing the nonvolatile semiconductor memory according to the embodiment of the present invention.
Figure 13B:
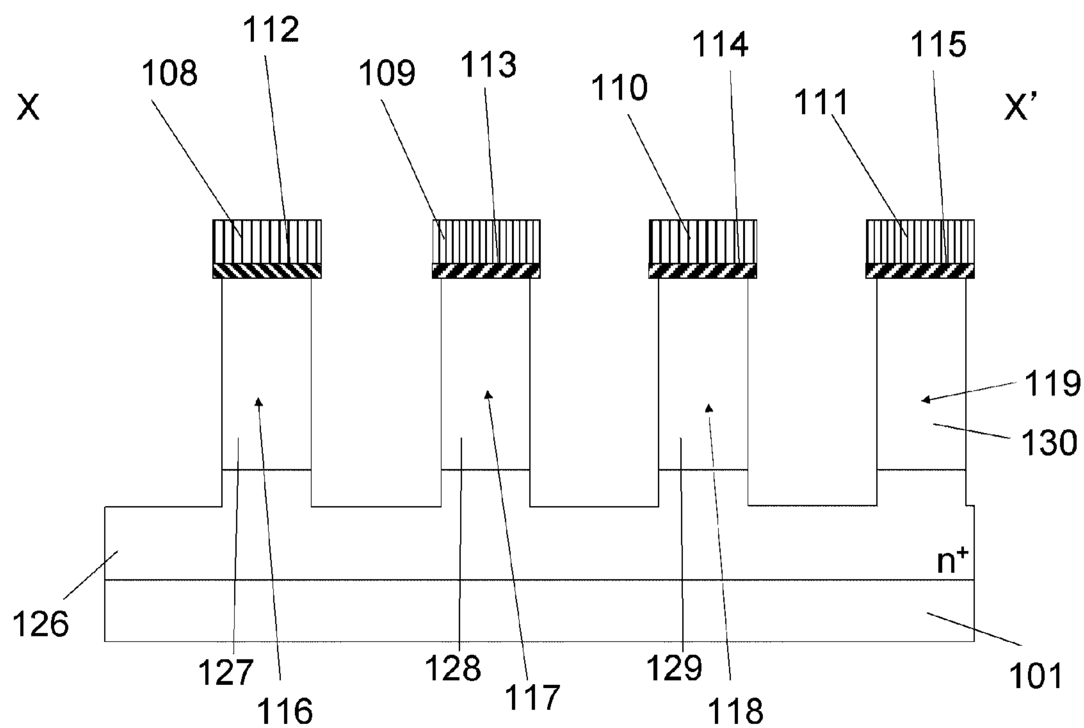
FIG. 13B is a cross-sectional view taken along line X-X' of FIG. 13A.
Figure 13C:
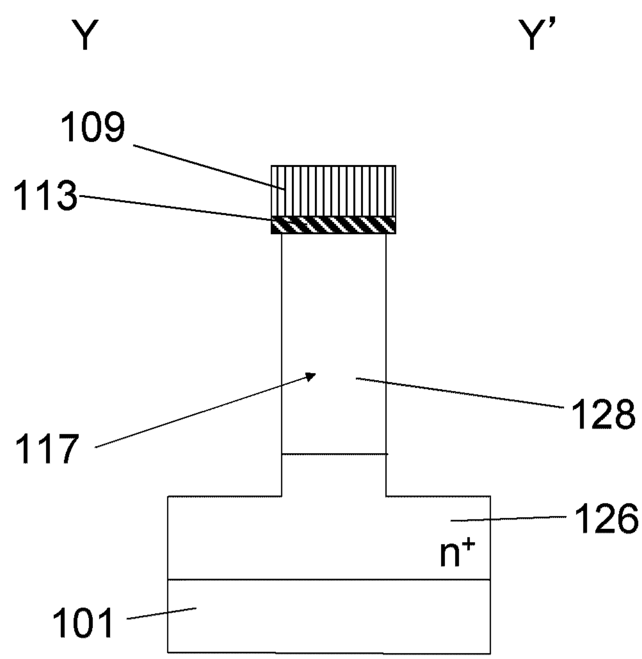
FIG. 13C is a cross-sectional view taken along line Y-Y' of FIG. 13A.

Subsequently, referring to FIGS. 13A to 13C, the oxide film side walls 122, 123, 124, and 125 are removed by etching.

Figure 14A:
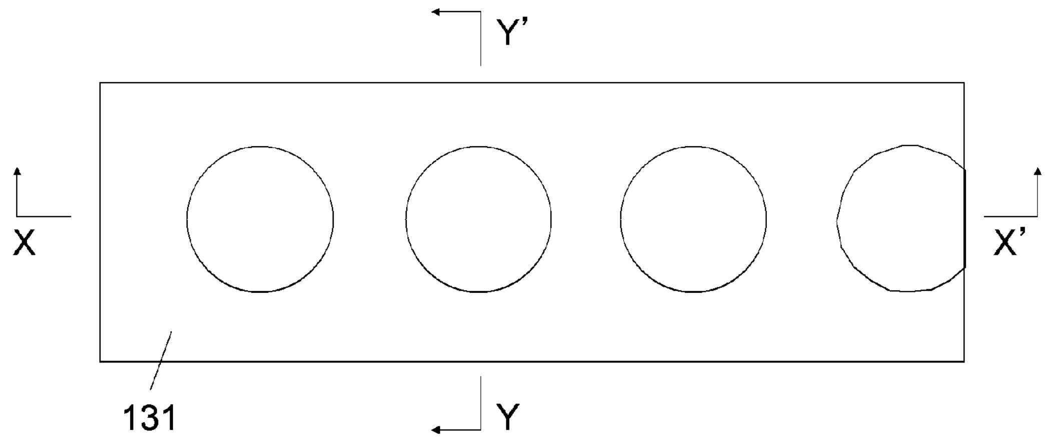
FIG. 14A is a plan view illustrating the method for manufacturing the nonvolatile semiconductor memory according to the embodiment of the present invention.
Figure 14B:
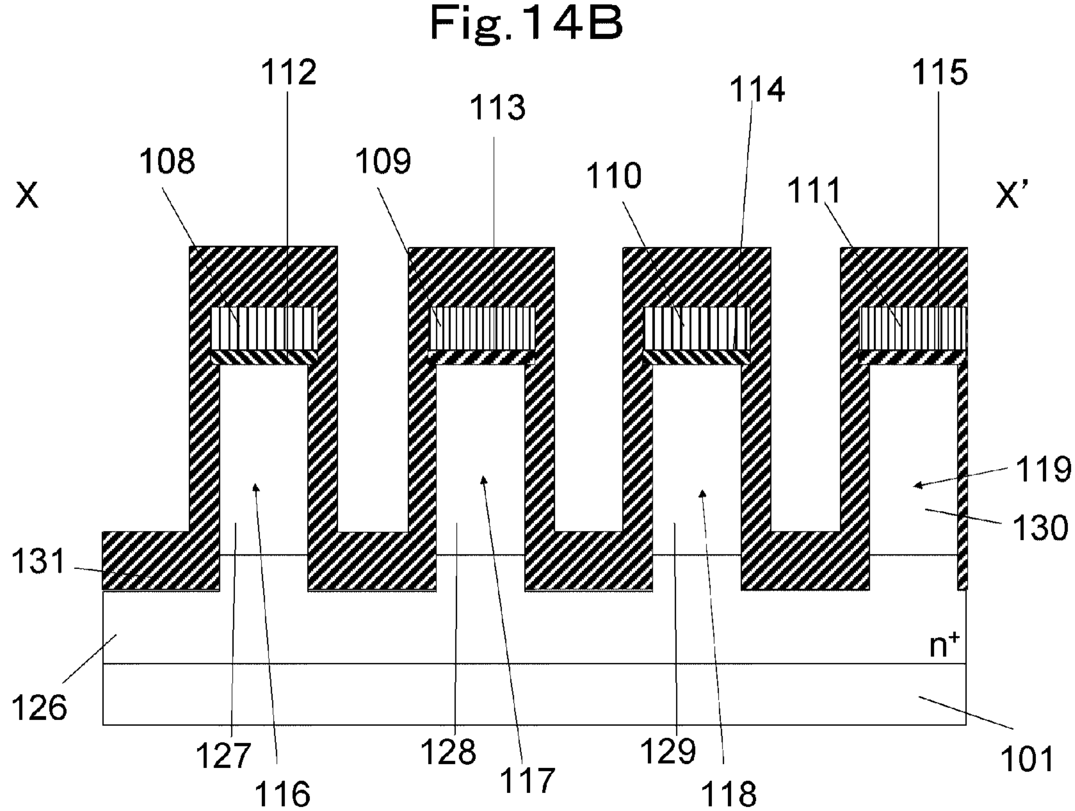
FIG. 14B is a cross-sectional view taken along line X-X' of FIG. 14A.
Figure 14C:
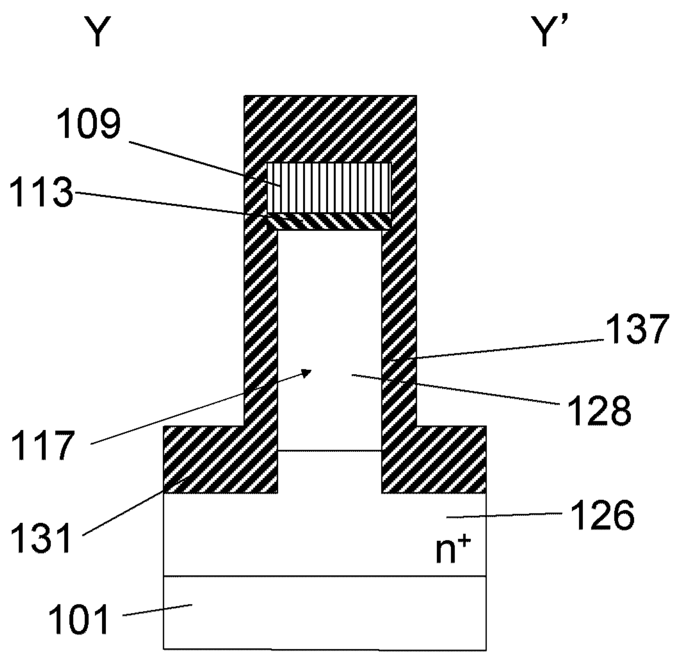
FIG. 14C is a cross-sectional view taken along line Y-Y' of FIG. 14A.

Subsequently, referring to FIGS. 14A to 14C, an oxide film 131 is deposited on the top of the first source line 126, on the top of the nitride films 108, 109, 110, and 111, and on the outer peripheral wall surfaces of the island-shaped semiconductors 116, 117, 118, and 119 so that the oxide film 131 on the top of the nitride films 108, 109, 110, and 111 has a large thickness while the oxide film 131 on the outer peripheral wall surfaces has a small thickness.

Figure 15A:
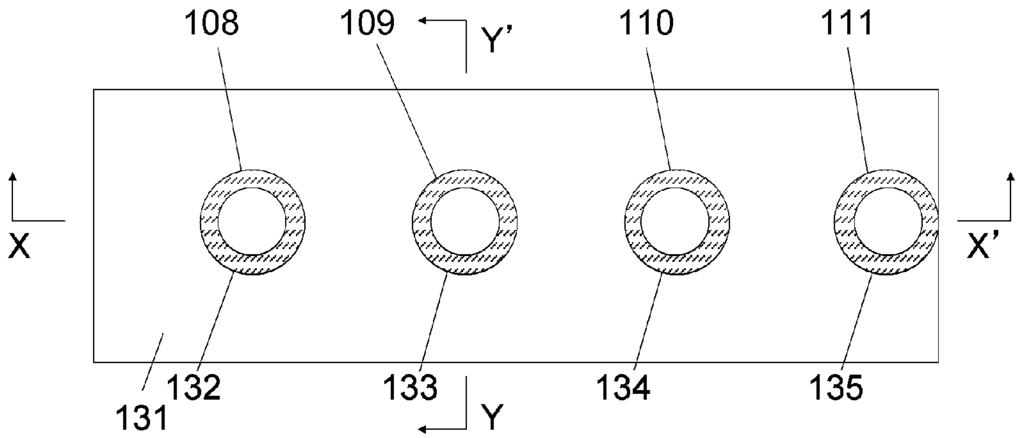
FIG. 15A is a plan view illustrating the method for manufacturing the nonvolatile semiconductor memory according to the embodiment of the present invention.
Figure 15B:
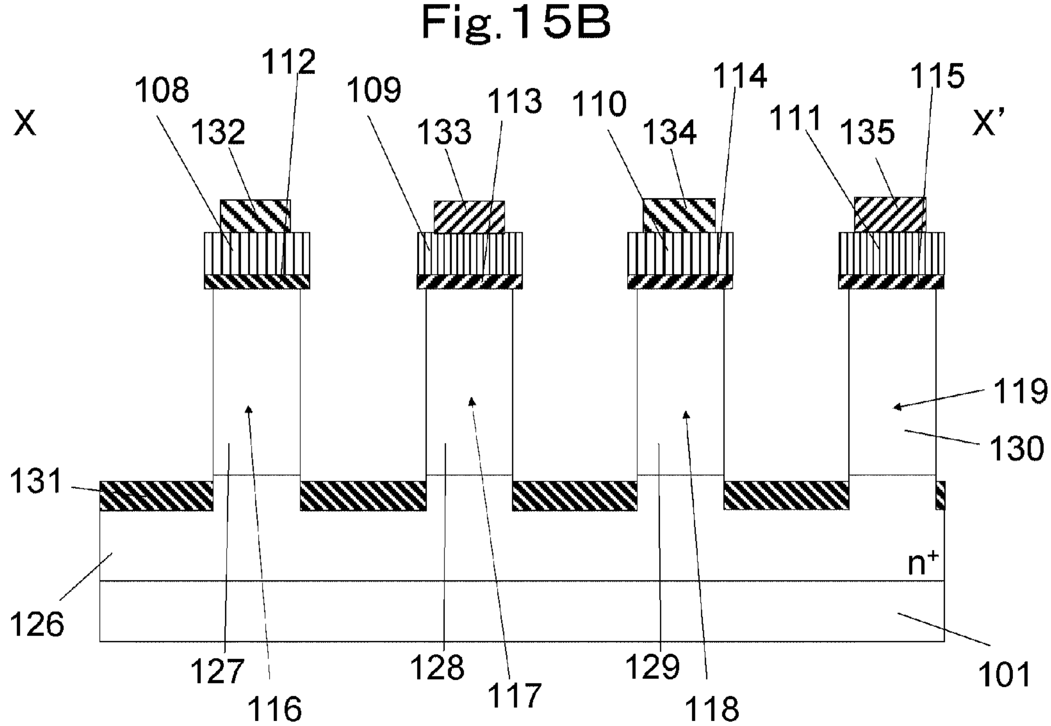
FIG. 15B is a cross-sectional view taken along line X-X' of FIG. 15A.
Figure 15C:
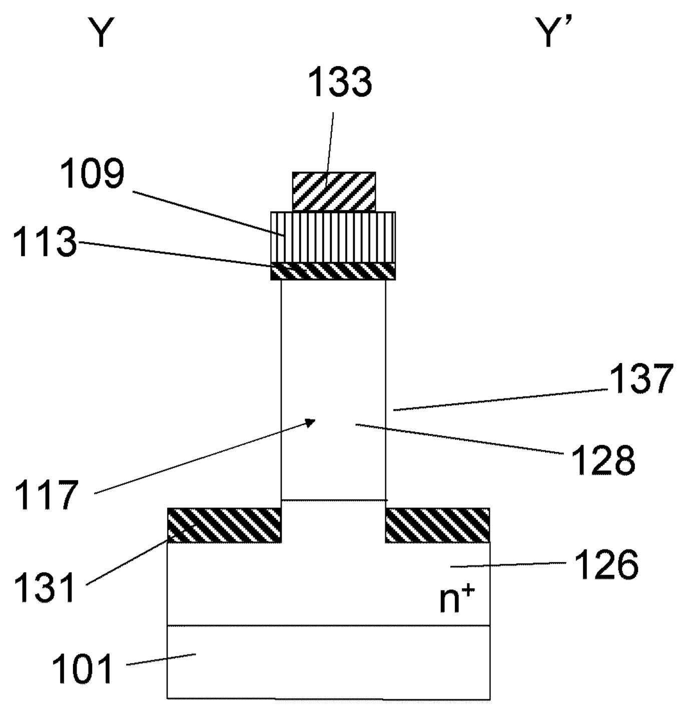
FIG. 15C is a cross-sectional view taken along line Y-Y' of FIG. 15A.

Subsequently, referring to FIGS. 15A to 15C, the oxide film 131 deposited on the outer peripheral wall surfaces of the island-shaped semiconductors 116, 117, 118, and 119 is etched by isotropic etching. Therefore, even after the removal of the oxide film 131 on the outer peripheral wall surfaces of the island-shaped semiconductors 116, 117, 118, and 119 by etching, the oxide film 131 remains on the top of the first source line 126. Further, oxide films 132, 133, 134, and 135 remain in a disk shape on the top of the nitride films 108, 109, 110, 111, respectively. In this manner, the oxide film 131 remains as the oxide films 132, 133, 134, and 135 because of the following reason: Referring to FIGS. 14A to 14C, the oxide film 131 is deposited on the top of the first source line 126, on the top of the nitride films 108, 109, 110, and 111, and on the outer peripheral wall surfaces of the island-shaped semiconductors 116, 117, 118, and 119 so that the oxide film 131 on the top of the nitride films 108, 109, 110, and 111 has a large thickness while the oxide film 131 on the outer peripheral wall surfaces has a small thickness, and, additionally, the oxide film 131 has been subjected to isotropic etching in which etching progresses at the same speed in all directions. The oxide film 131 remaining on the top of the first source line 126 becomes first insulating films 171, 172, 173, and 174 in resulting nonvolatile semiconductor memory transistors 212, 213, 214, and 215 (see FIGS. 2B to 2D), and contributes to the reduction in the capacitance between the floating gates 153, 154, 155, and 156 and the first source line 126.

Figure 16A:
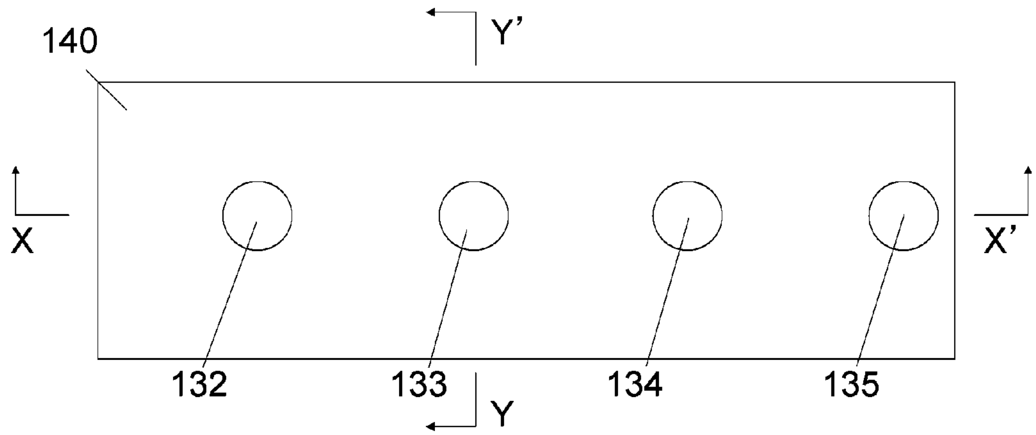
FIG. 16A is a plan view illustrating the method for manufacturing the nonvolatile semiconductor memory according to the embodiment of the present invention.
Figure 16B:
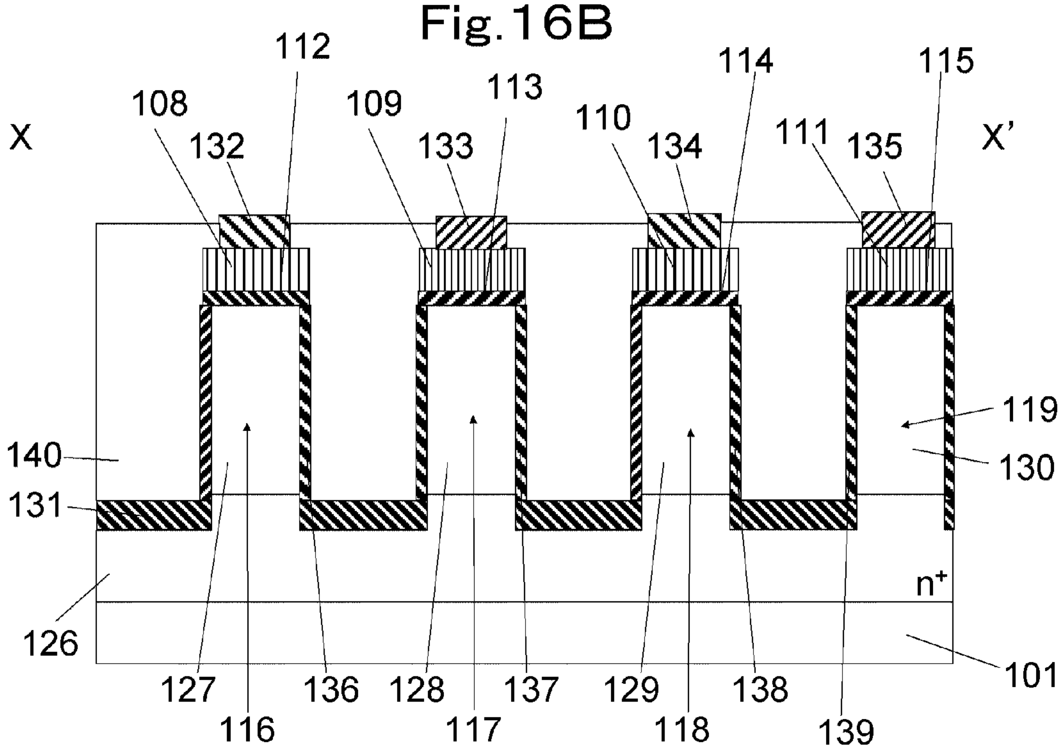
FIG. 16B is a cross-sectional view taken along line X-X' of FIG. 16A.
Figure 16C:
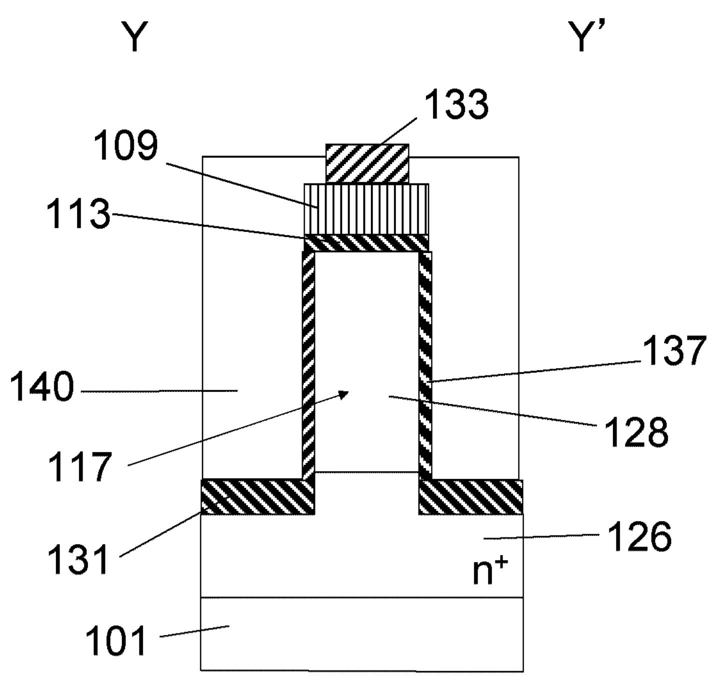
FIG. 16C is a cross-sectional view taken along line Y-Y' of FIG. 16A.

Subsequently, referring to FIGS. 16A to 16C, tunnel insulating films 136, 137, 138, and 139 are formed into a side wall spacer shape on the outer peripheral wall surfaces of the island-shaped semiconductors 116, 117, 118, and 119 by gate oxidation. After that, a polysilicon layer 140 is deposited between the nitride film 108 and the island-shaped semiconductor 116, and the nitride film 109 and the island-shaped semiconductor 117, between the nitride film 109 and the island-shaped semiconductor 117, and the nitride film 110 and the island-shaped semiconductor 118, between the nitride film 110 and the island-shaped semiconductor 118, and the nitride film 111 and the island-shaped semiconductor 119, and between the nitride film 108 and the island-shaped semiconductor 116, and the corresponding edge of the silicon substrate 101 so that the disk-shaped oxide films 132, 133, 134, and 135 are buried up to the tips thereof. After that, the tip portions of the oxide films 132, 133, 134, and 135 are exposed by performing planarization using CMP (Chemical Mechanical Polishing).

Figure 17A:
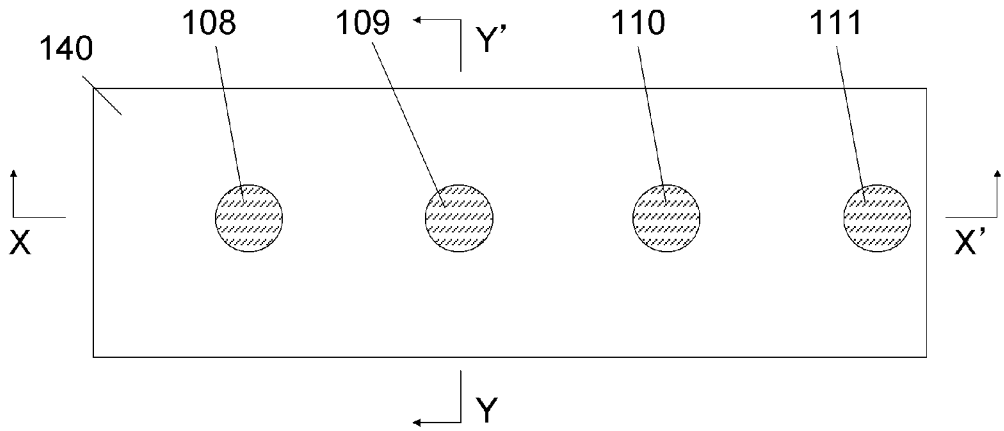
FIG. 17A is a plan view illustrating the method for manufacturing the nonvolatile semiconductor memory according to the embodiment of the present invention.
Figure 17B:
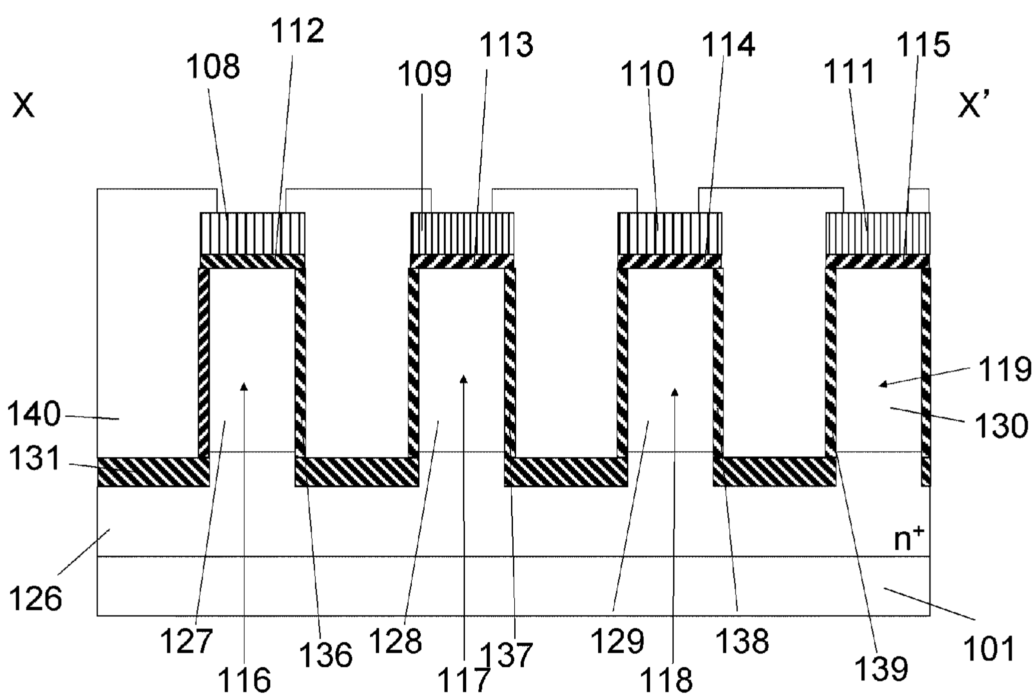
FIG. 17B is a cross-sectional view taken along line X-X' of FIG. 17A.
Figure 17C:
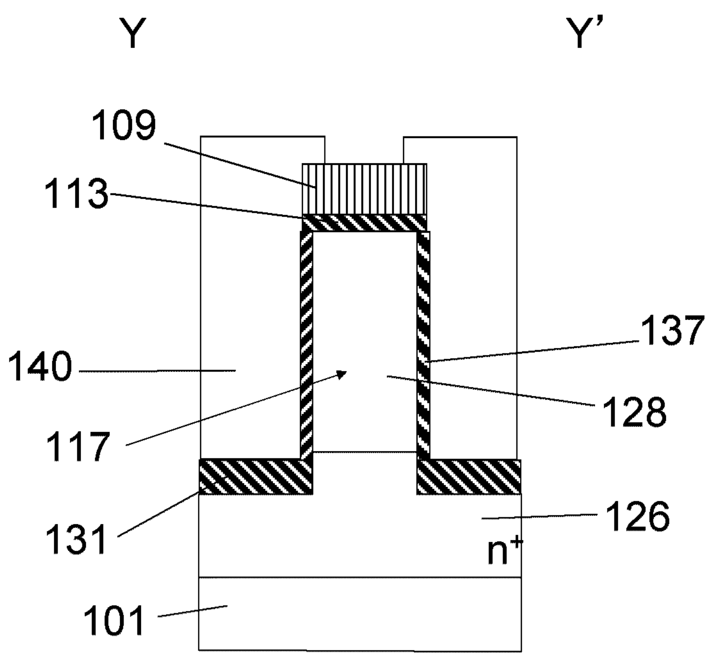
FIG. 17C is a cross-sectional view taken along line Y-Y' of FIG. 17A.

Subsequently, referring to FIGS. 17A to 17C, the oxide films 132, 133, 134, and 135 are removed by etching.

Figure 18A:
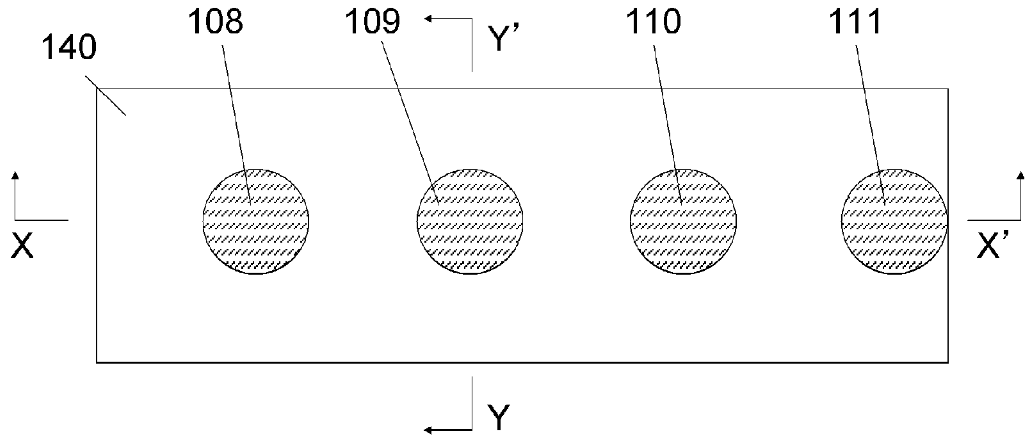
FIG. 18A is a plan view illustrating the method for manufacturing the nonvolatile semiconductor memory according to the embodiment of the present invention.
Figure 18B:
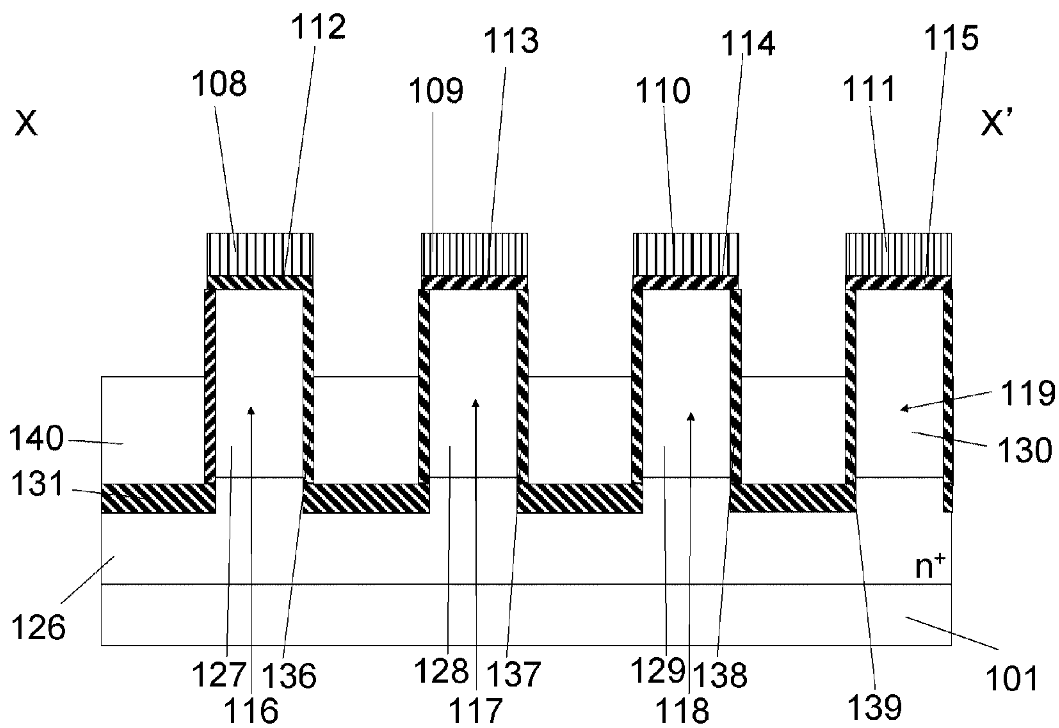
FIG. 18B is a cross-sectional view taken along line X-X' of FIG. 18A.
Figure 18C:
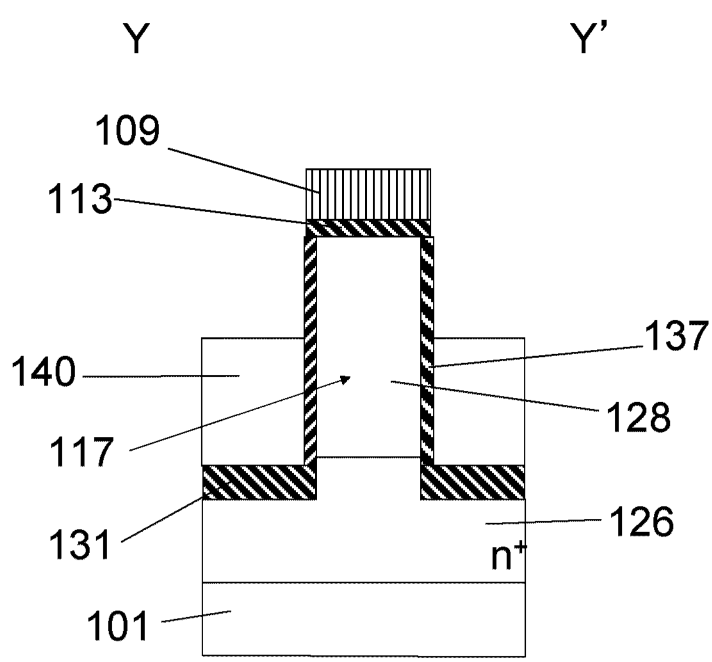
FIG. 18C is a cross-sectional view taken along line Y-Y' of FIG. 18A.

Subsequently, referring to FIGS. 18A to 18C, the polysilicon layer 140 is etched back to a predetermined depth by etching, and the gate length is determined.

Figure 19A:
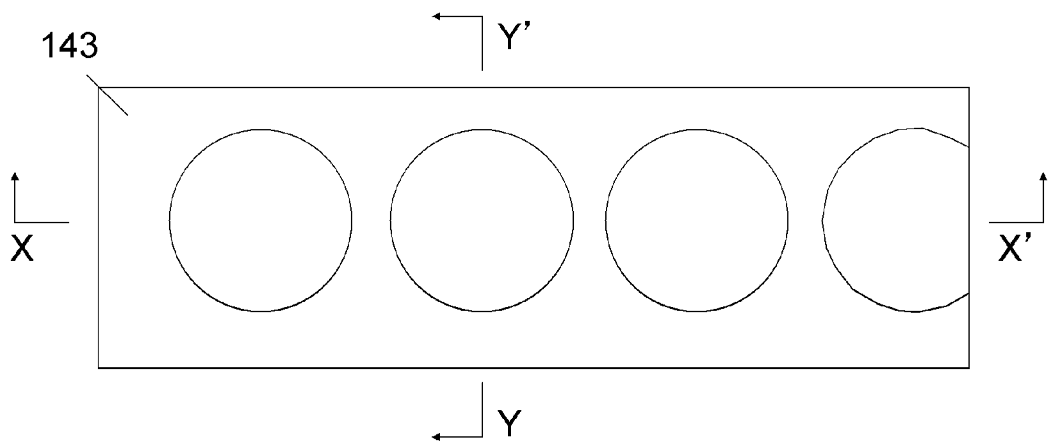
FIG. 19A is a plan view illustrating the method for manufacturing the nonvolatile semiconductor memory according to the embodiment of the present invention.
Figure 19B:
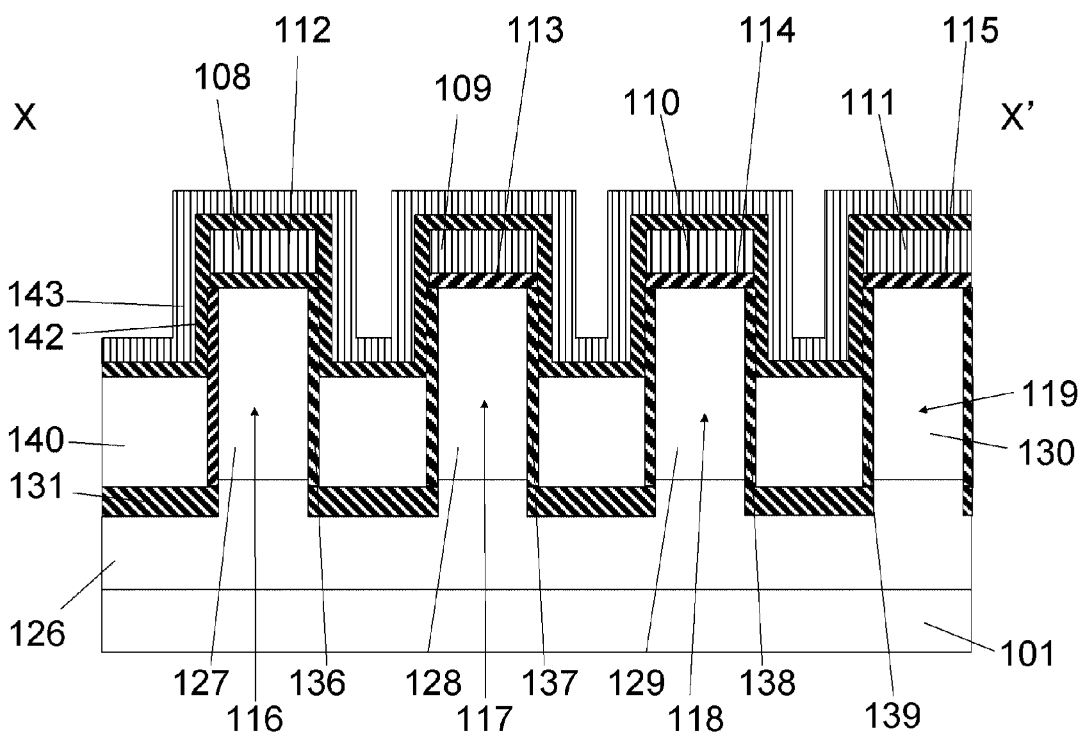
FIG. 19B is a cross-sectional view taken along line X-X' of FIG. 19A.
Figure 19C:
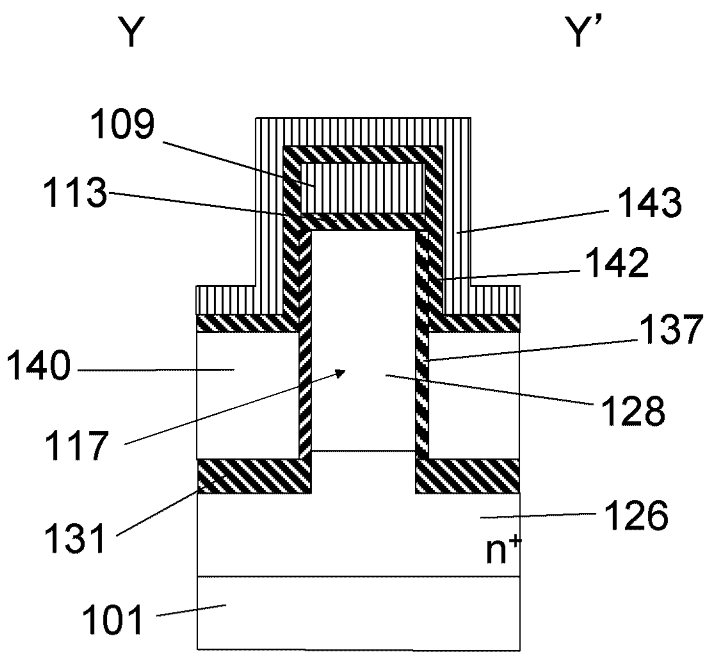
FIG. 19C is a cross-sectional view taken along line Y-Y' of FIG. 19A.

Subsequently, referring to FIGS. 19A to 19C, an oxide film 142 is deposited from above the polysilicon layer 140, the tunnel insulating films 136, 137, 138, and 139, and the nitride films 108, 109, 110, and 111. After that, a nitride film 143 is deposited from above the oxide film 142.

Figure 20A:
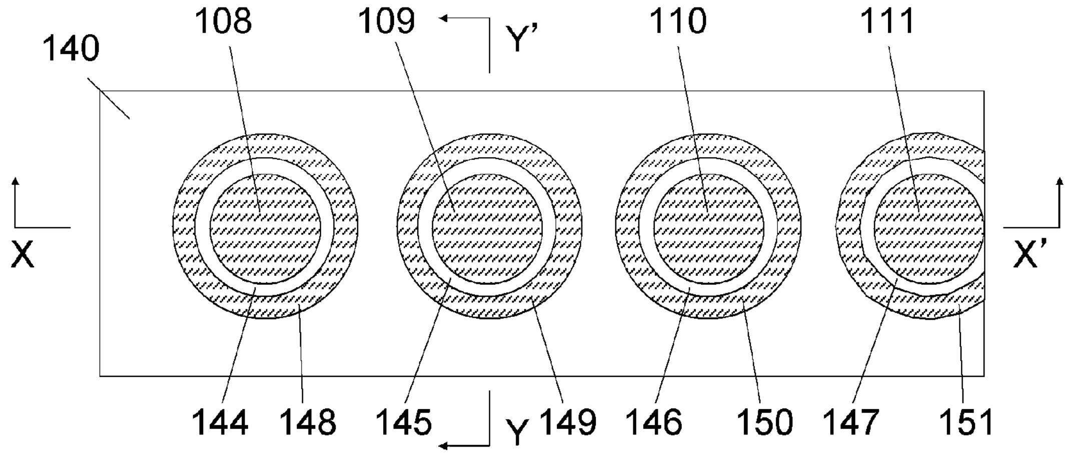
FIG. 20A is a plan view illustrating the method for manufacturing the nonvolatile semiconductor memory according to the embodiment of the present invention.
Figure 20B:
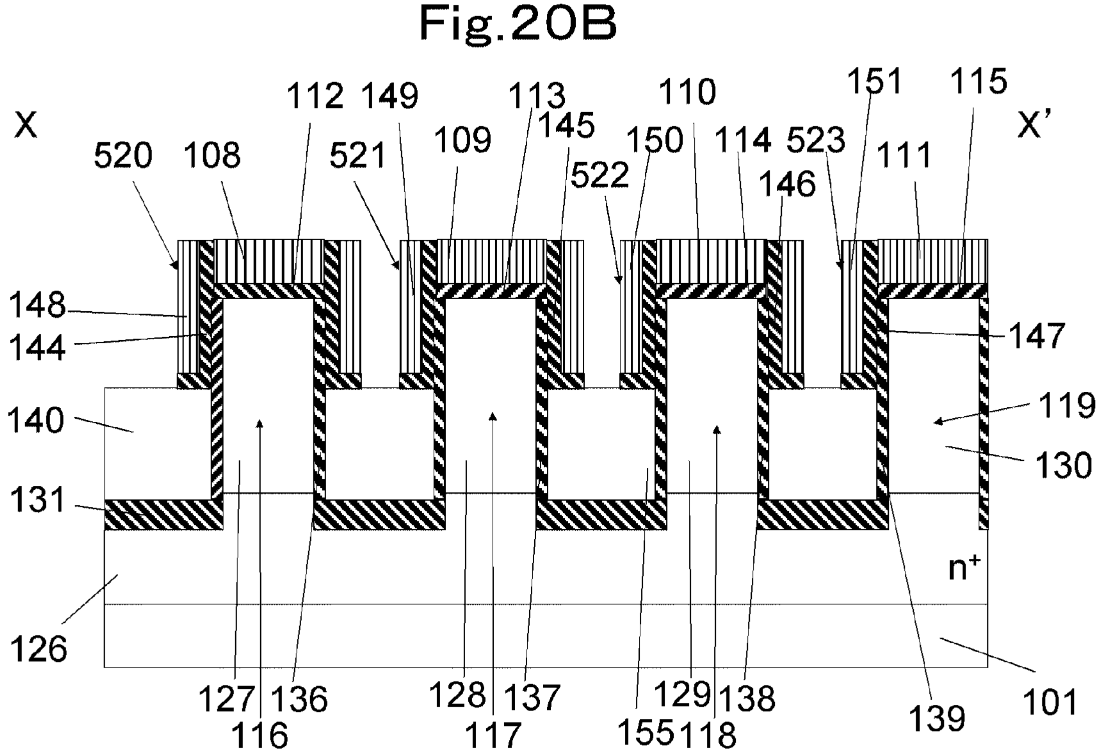
FIG. 20B is a cross-sectional view taken along line X-X' of FIG. 20A.
Figure 20C:
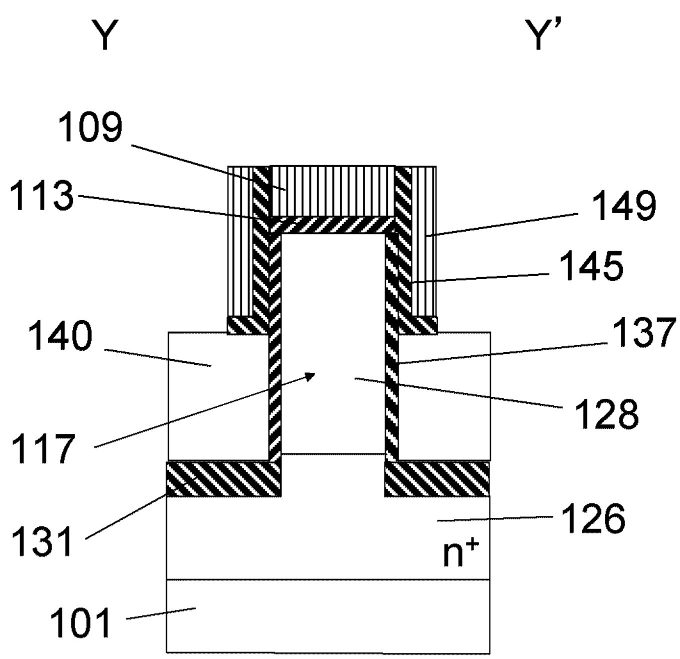
FIG. 20C is a cross-sectional view taken along line Y-Y' of FIG. 20A.

Subsequently, referring to FIGS. 20A to 20C, the nitride film 143 and the oxide film 142 are etched by anisotropic etching. The nitride film 143 and the oxide film 142 remain in a side wall shape on the outer peripheral wall surfaces of the island-shaped semiconductors 116, 117, 118, and 119, the nitride film 108, the oxide film 112, the nitride film 109, the oxide film 113, the nitride film 110, the oxide film 114, the nitride film 111, and the oxide film 115. Therefore, an insulating film side wall 520 made of a nitride film 148 (the nitride film 143) and an oxide film 144 (the oxide film 142), an insulating film side wall 521 made of a nitride film 149 and an oxide film 145, an insulating film side wall 522 made of a nitride film 150 and an oxide film 146, and an insulating film side wall 523 made of a nitride film 151 and an oxide film 147 are formed.

Figure 21A:
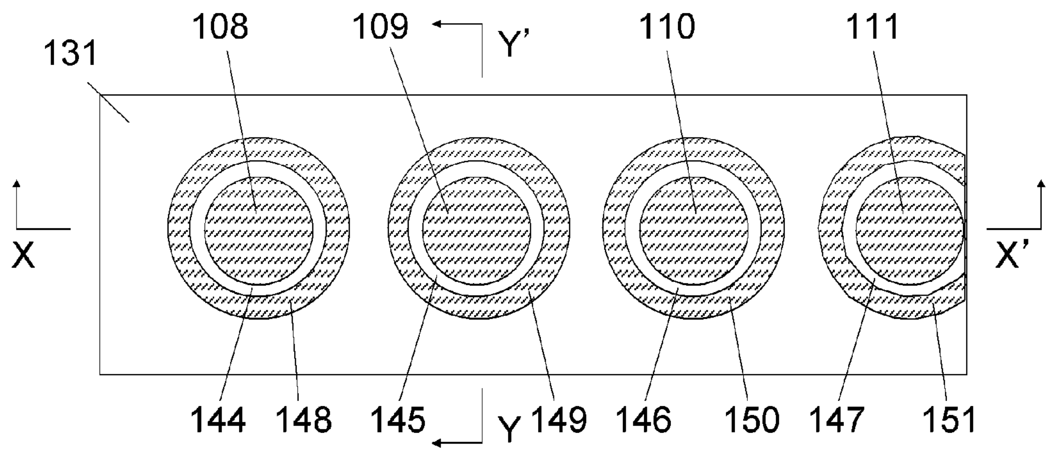
FIG. 21A is a plan view illustrating the method for manufacturing the nonvolatile semiconductor memory according to the embodiment of the present invention.
Figure 21B:
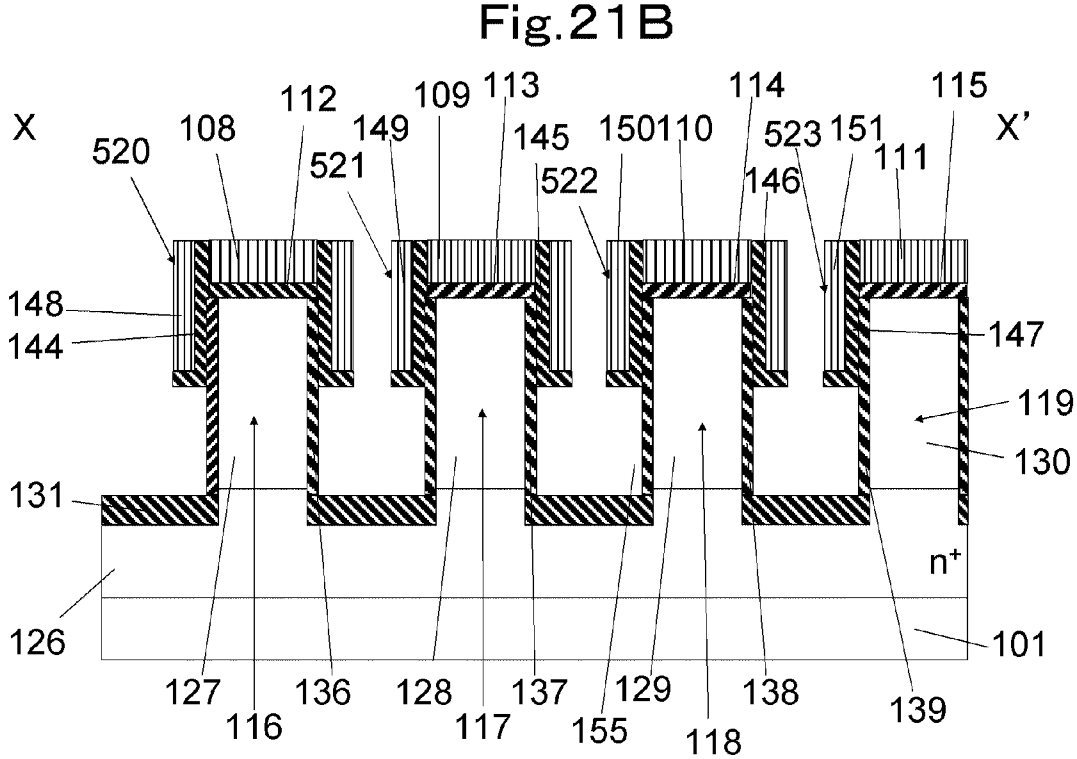
FIG. 21B is a cross-sectional view taken along line X-X' of FIG. 21A.
Figure 21C:
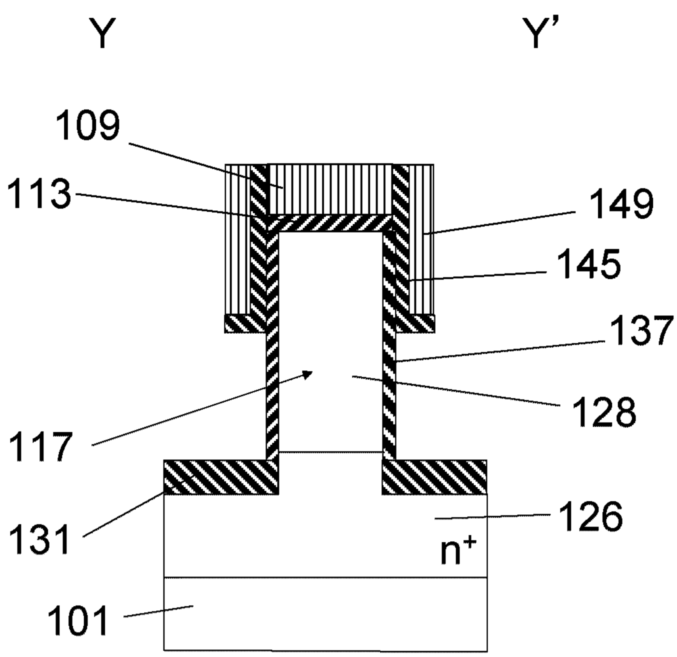
FIG. 21C is a cross-sectional view taken along line Y-Y' of FIG. 21A.

Subsequently, referring to FIGS. 21A to 21C, the polysilicon layer 140 is removed by etching. Therefore, a space surrounded by the oxide film 131, the island-shaped semiconductors 116, 117, 118, and 119 (the tunnel insulating films 136, 137, 138, and 139), and the insulating film side walls 520, 521, 522, and 523 is formed on the top of the silicon substrate 101.

Figure 22A:
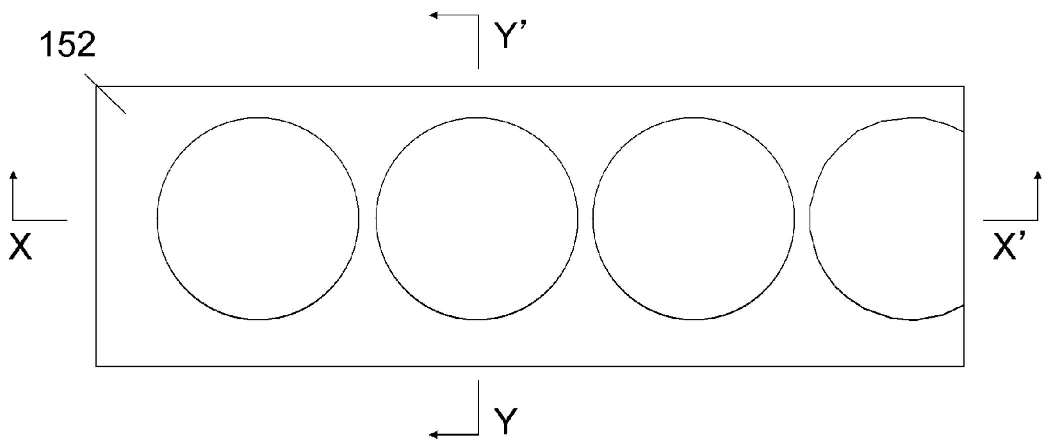
FIG. 22A is a plan view illustrating the method for manufacturing the nonvolatile semiconductor memory according to the embodiment of the present invention.
Figure 22B:
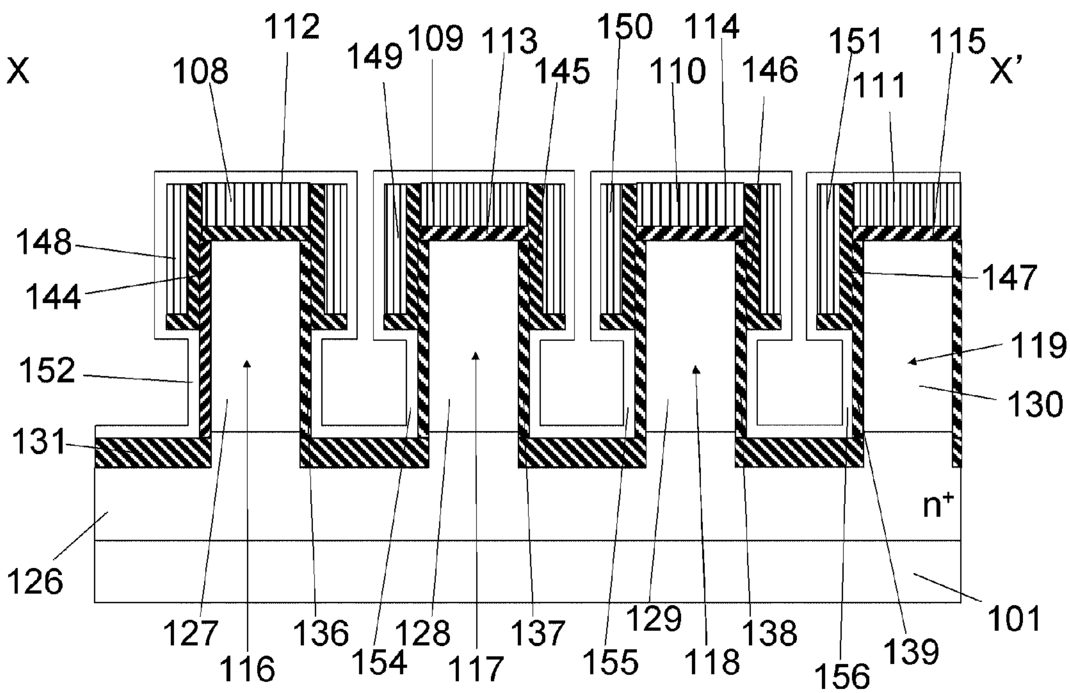
FIG. 22B is a cross-sectional view taken along line X-X' of FIG. 22A.
Figure 22C:
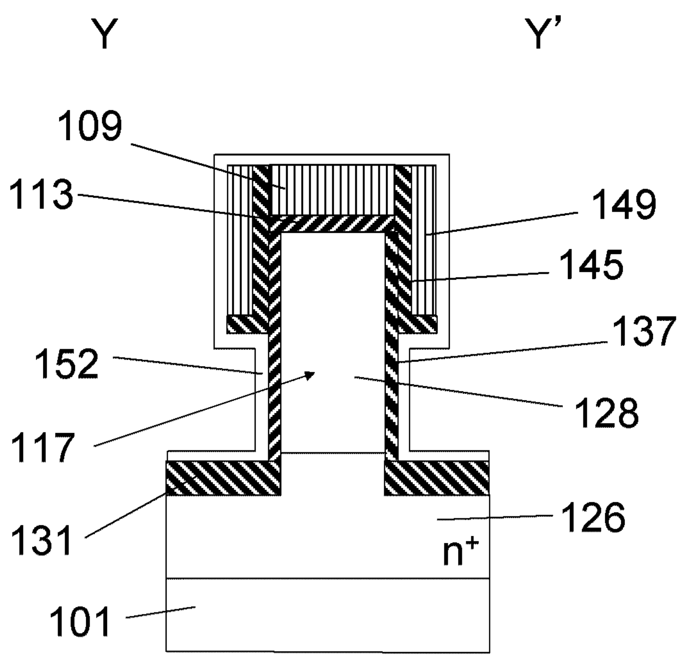
FIG. 22C is a cross-sectional view taken along line Y-Y' of FIG. 22A.

Subsequently, referring to FIGS. 22A to 22C, a polysilicon layer 152 serving as a floating gate film is deposited from above the oxide film 131, the island-shaped semiconductors 116, 117, 118, and 119 (the tunnel insulating films 136, 137, 138, and 139), and the insulating film side walls 520, 521, 522, and 523. If the tunnel insulating films 136, 137, 138, and 139 are damaged during the etching of the polysilicon layer 140, in order to compensate for the damage, a new tunnel insulating film can also be deposited before the deposition of the polysilicon layer 152 after the tunnel insulating films 136, 137, 138, and 139 have been removed.

Figure 23A:
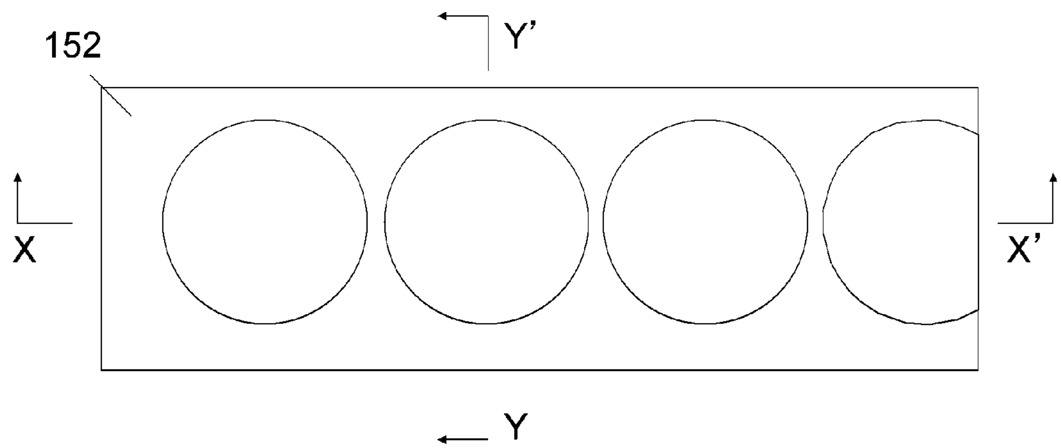
FIG. 23A is a plan view illustrating the method for manufacturing the nonvolatile semiconductor memory according to the embodiment of the present invention.
Figure 23B:
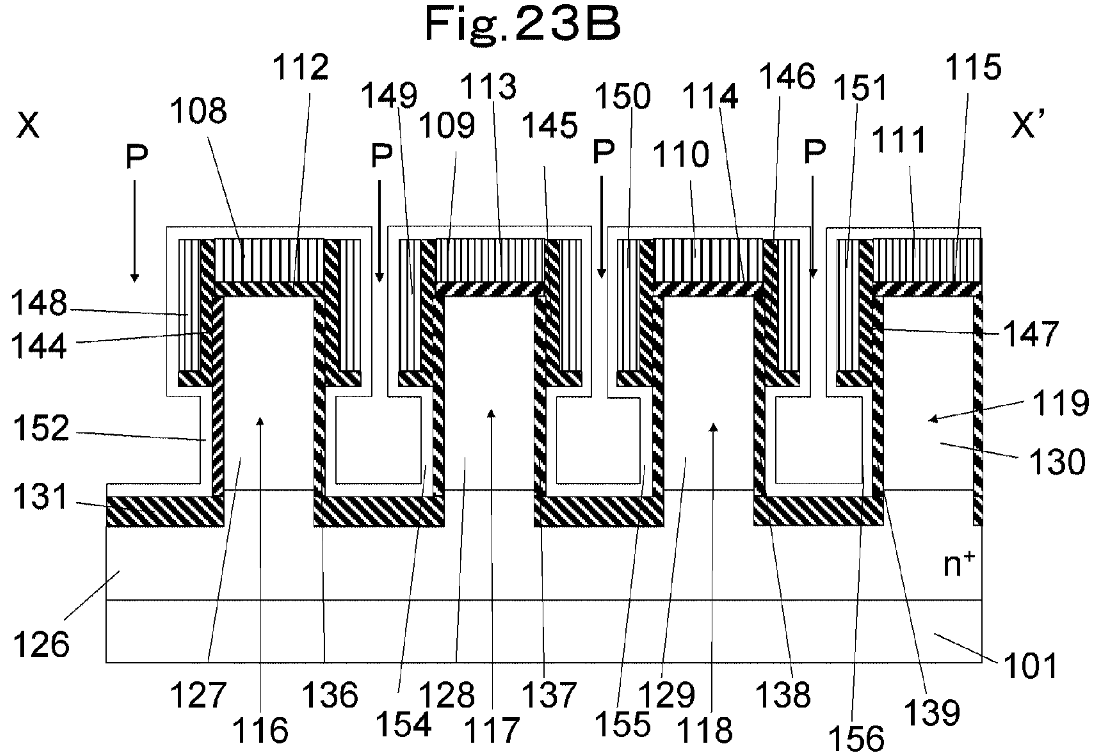
FIG. 23B is a cross-sectional view taken along line X-X' of FIG. 23A.
Figure 23C:
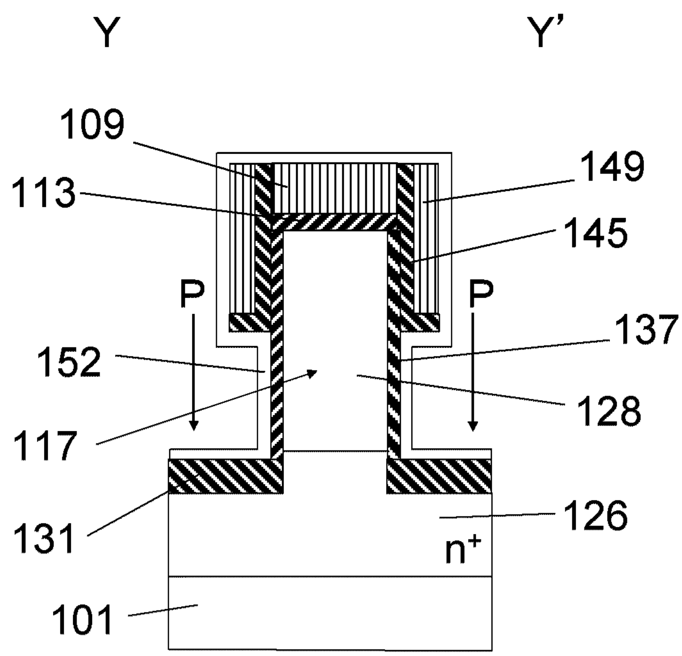
FIG. 23C is a cross-sectional view taken along line Y-Y' of FIG. 23A.

Subsequently, referring to FIGS. 23A to 23C, phosphor (see arrows P) is injected into the polysilicon layer 152, and heat treatment is performed to diffuse the phosphor into the polysilicon layer 152.

Figure 24A:
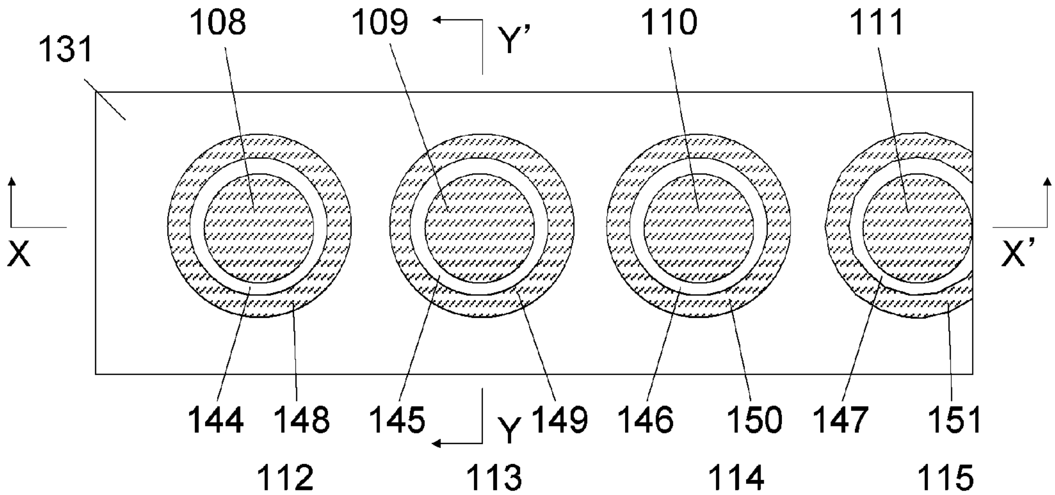
FIG. 24A is a plan view illustrating the method for manufacturing the nonvolatile semiconductor memory according to the embodiment of the present invention.
Figure 24B:
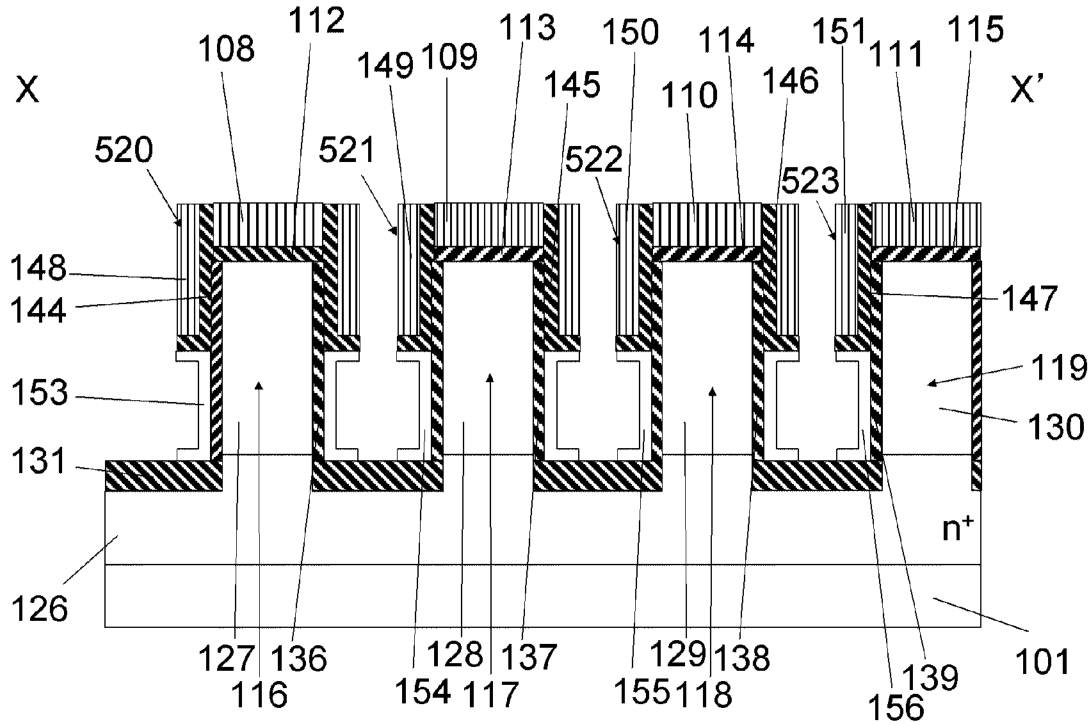
FIG. 24B is a cross-sectional view taken along line X-X' of FIG. 24A.
Figure 24C:
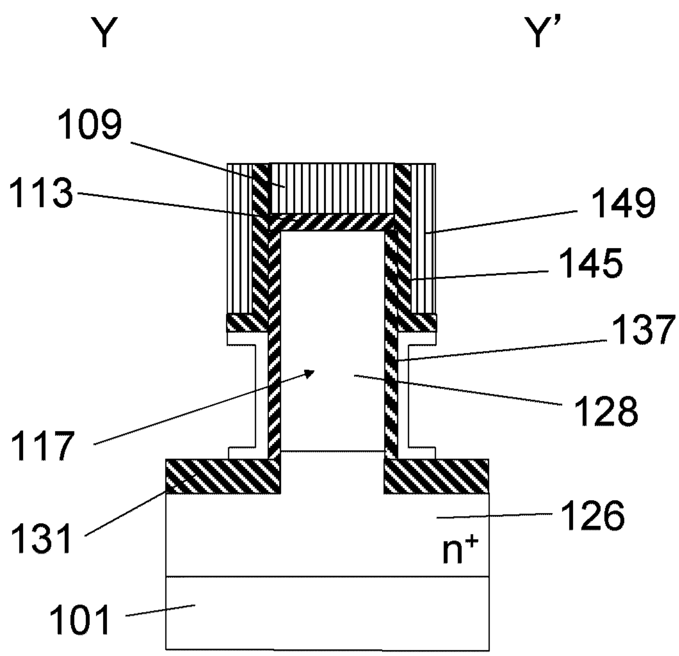
FIG. 24C is a cross-sectional view taken along line Y-Y' of FIG. 24A.

Subsequently, referring to FIGS. 24A to 24C, the polysilicon layer 152 that is formed as an N+ polysilicon layer is subjected to anisotropic etching using the insulating film side walls 520, 521, 522, and 523 as masks, and floating gates 153, 154, 155, and 156 in the resulting nonvolatile semiconductor memory transistors 212, 213, 214, and 215 are formed on the outer peripheral wall surfaces of the island-shaped semiconductors 116, 117, 118, and 119 (the tunnel insulating films 136, 137, 138, and 139). The floating gates 153, 154, 155, and 156 are formed between the lower surfaces of the insulating film side walls 520, 521, 522, and 523 and the upper surfaces of the oxide films 131 on the first source line 126.

Figure 25A:
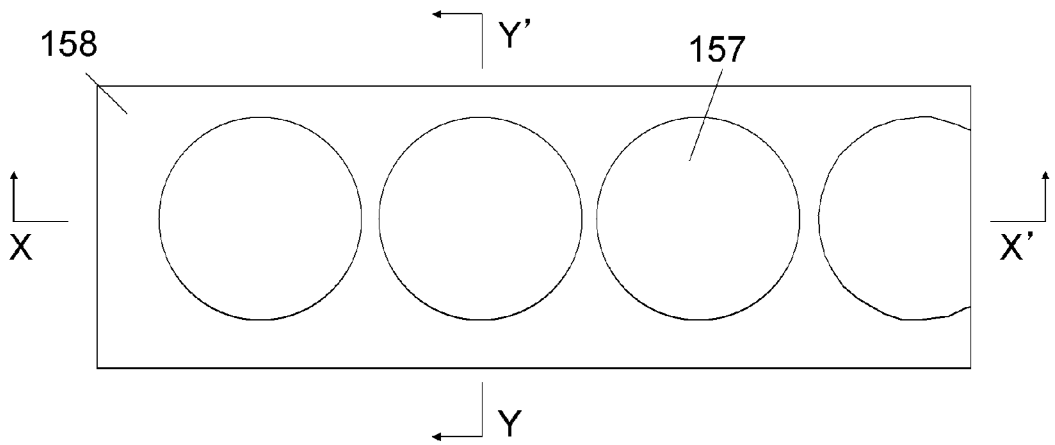
FIG. 25A is a plan view illustrating the method for manufacturing the nonvolatile semiconductor memory according to the embodiment of the present invention.
Figure 25B:
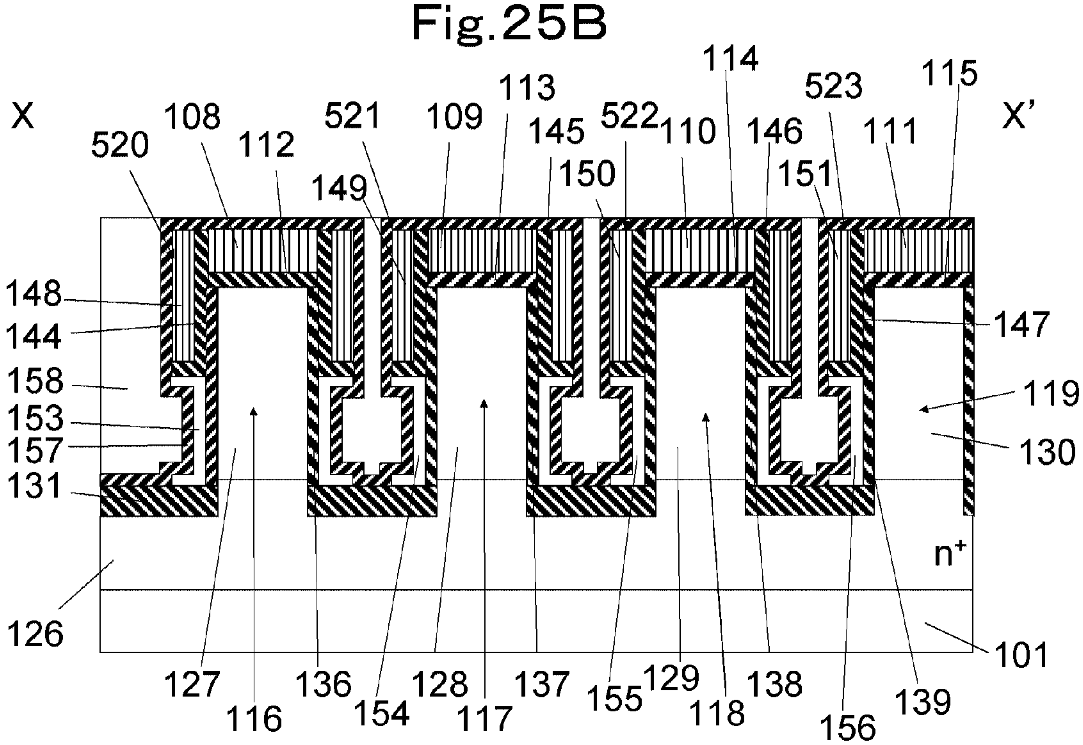
FIG. 25B is a cross-sectional view taken along line X-X' of FIG. 25A.
Figure 25C:
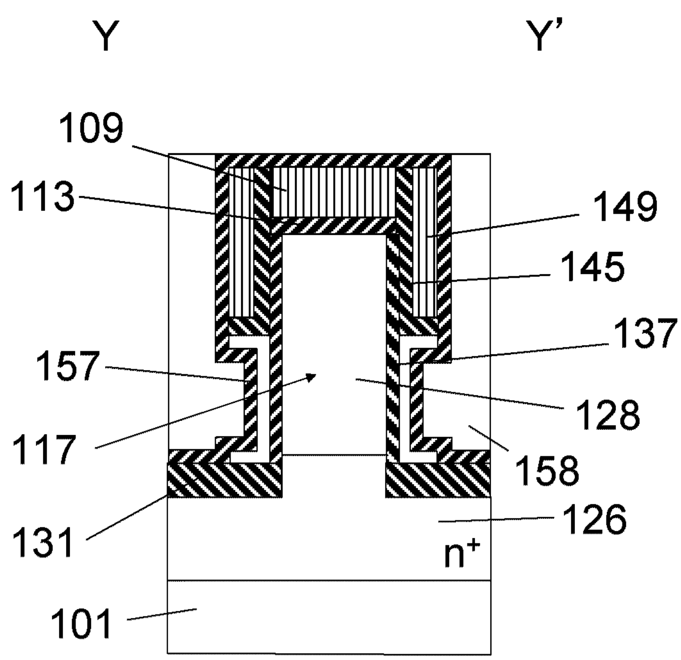
FIG. 25C is a cross-sectional view taken along line Y-Y' of FIG. 25A.

Subsequently, referring to FIGS. 25A to 25C, an inter-polysilicon insulating film 157 is formed from above the oxide films 131 on the top of the first source line 126, the floating gates 153, 154, 155, and 156, the insulating film side walls 520, 521, 522, and 523, and the nitride films 108, 109, 110, and 111. After that, a polysilicon layer 158 is deposited on the top of the inter-polysilicon insulating film 157, and the surface thereof is planarized using CMP. Here, the inter-polysilicon insulating film 157 may be formed of either a layered structure of an oxide film, an oxide film, a nitride film, and an oxide film or a high dielectric film.

Figure 26A:
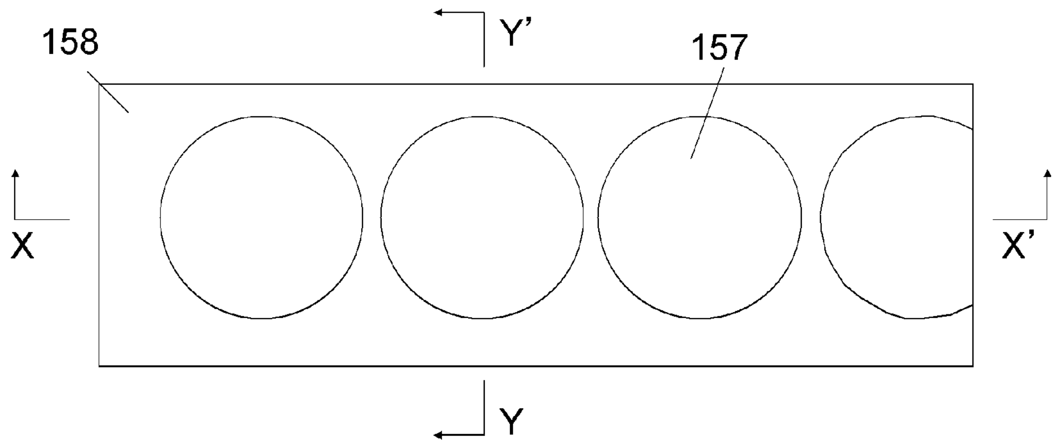
FIG. 26A is a plan view illustrating the method for manufacturing the nonvolatile semiconductor memory according to the embodiment of the present invention.
Figure 26B:
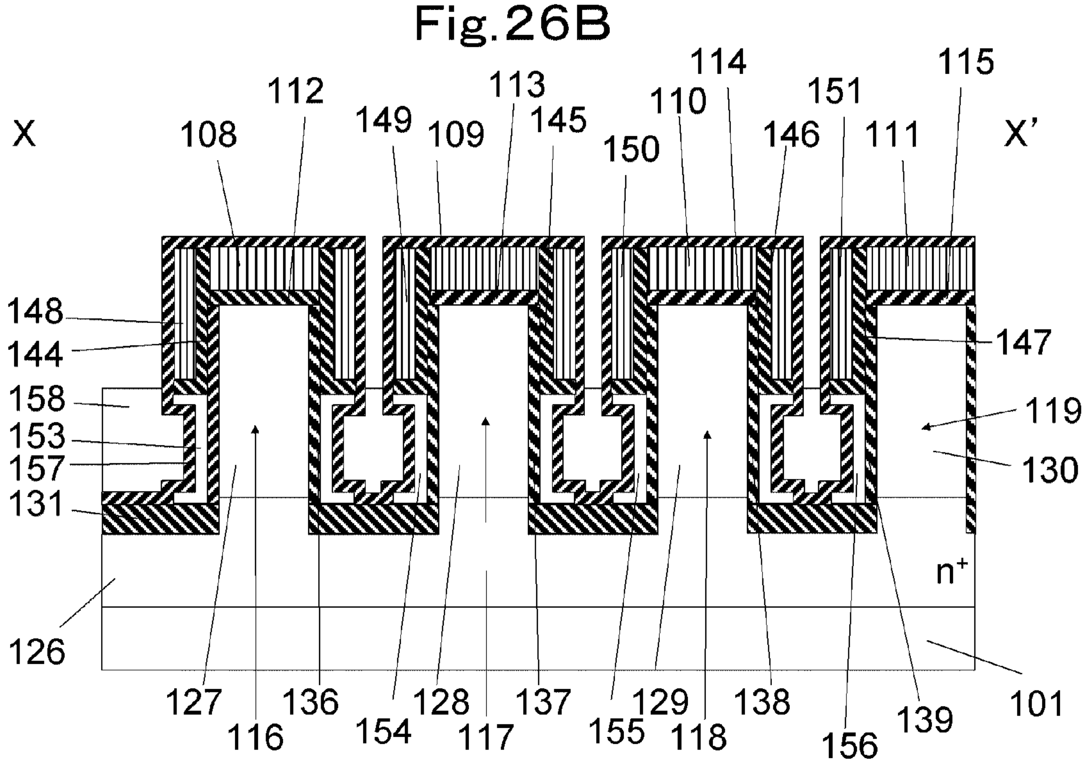
FIG. 26B is a cross-sectional view taken along line X-X' of FIG. 26A.
Figure 26C:
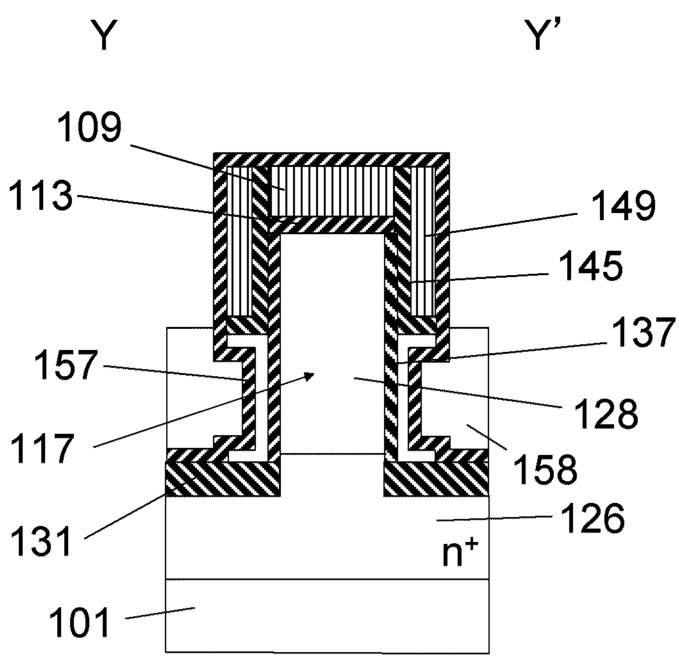
FIG. 26C is a cross-sectional view taken along line Y-Y' of FIG. 26A.

Subsequently, referring to FIGS. 26A to 26C, the polysilicon layer 158 is etched back to a predetermined depth by etching. The polysilicon layer 158 becomes control gates 163, 164, 165, and 166 in the resulting nonvolatile semiconductor memory transistors 212, 213, 214, and 215.

Figure 27A:
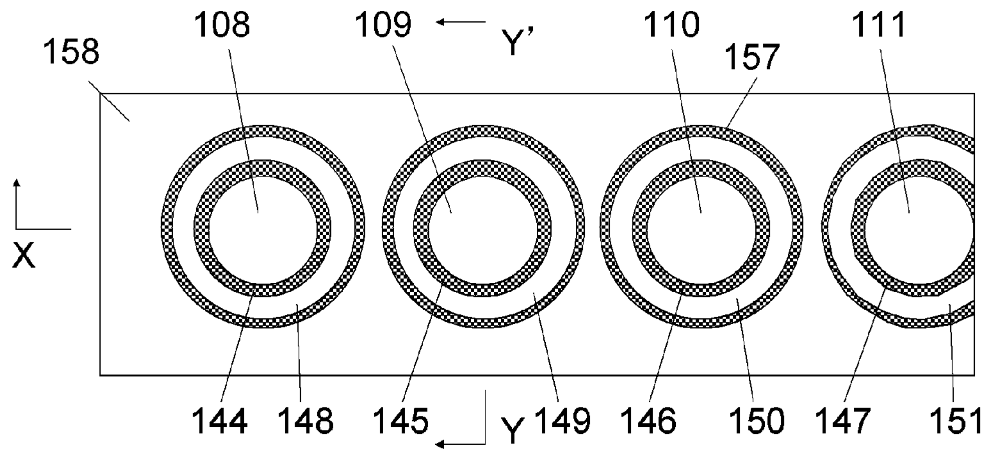
FIG. 27A is a plan view illustrating the method for manufacturing the nonvolatile semiconductor memory according to the embodiment of the present invention.
Figure 27B:
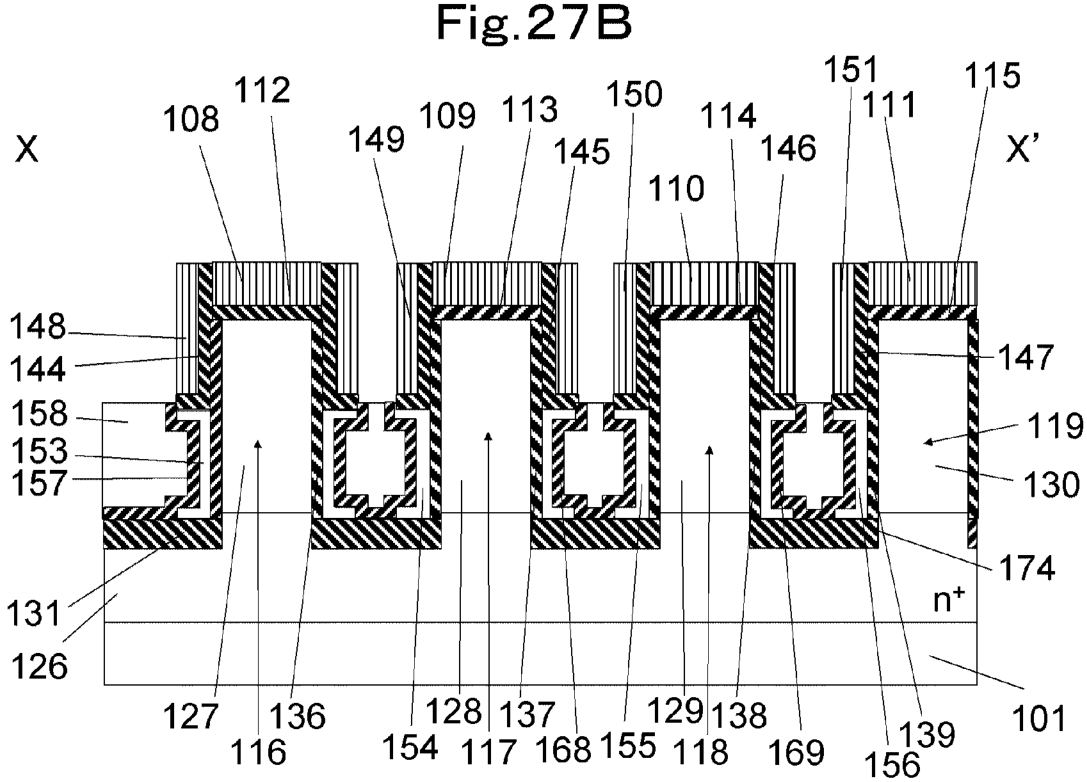
FIG. 27B is a cross-sectional view taken along line X-X' of FIG. 27A.
Figure 27C:
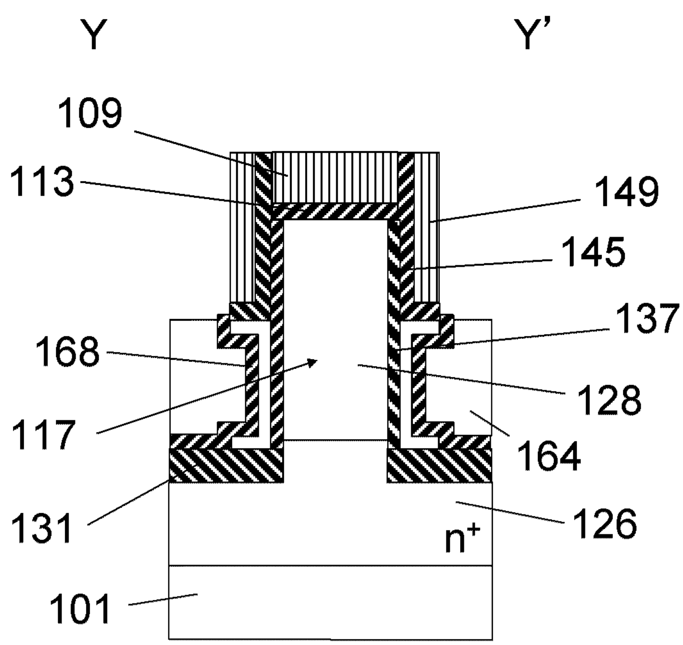
FIG. 27C is a cross-sectional view taken along line Y-Y' of FIG. 27A.

Subsequently, referring to FIGS. 27A to 27C, the inter-polysilicon insulating film 157 is etched, and the portions of the inter-polysilicon insulating film 157 on the top of the nitride films 148, 149, 150, and 151, the oxide films 144, 145, 146, and 147, and the nitride films 108, 109, 110, and 111 are removed.

Figure 28A:
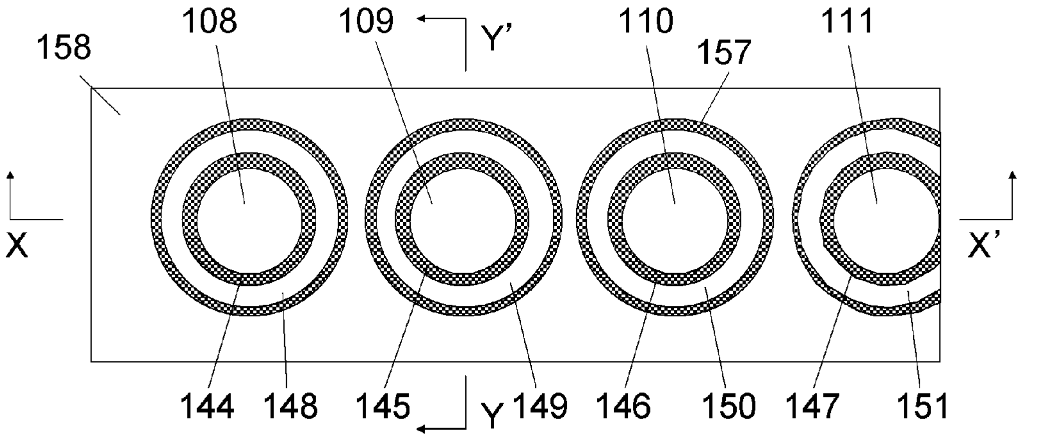
FIG. 28A is a plan view illustrating the method for manufacturing the nonvolatile semiconductor memory according to the embodiment of the present invention.
Figure 28B:
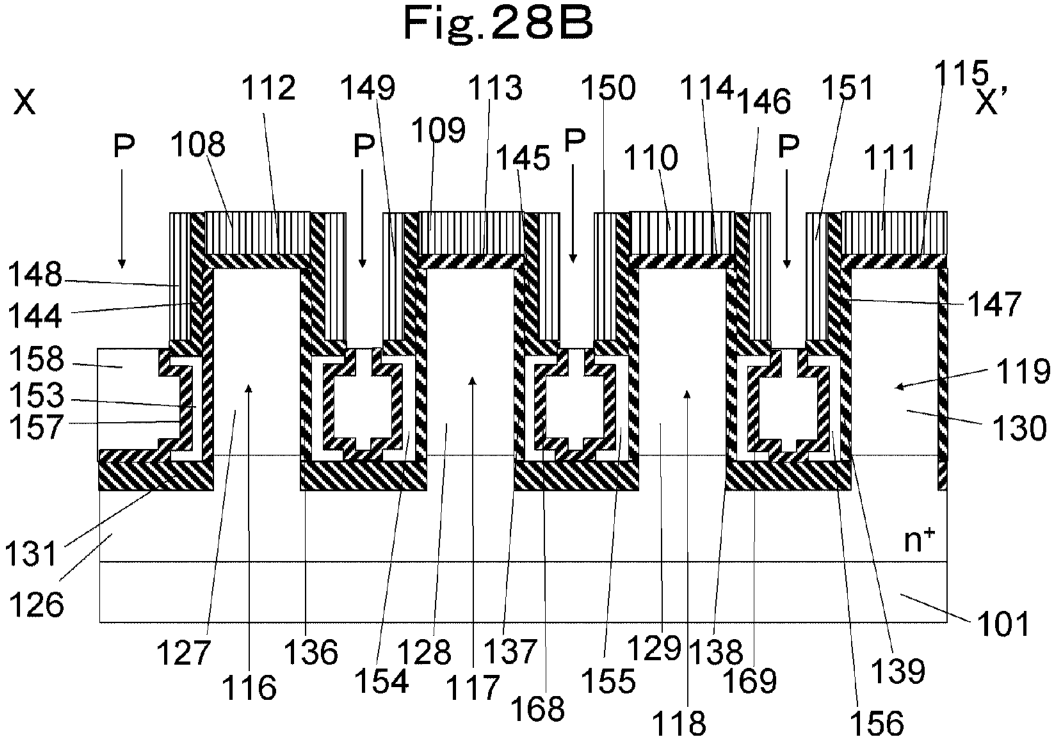
FIG. 28B is a cross-sectional view taken along line X-X' of FIG. 28A.
Figure 28C:
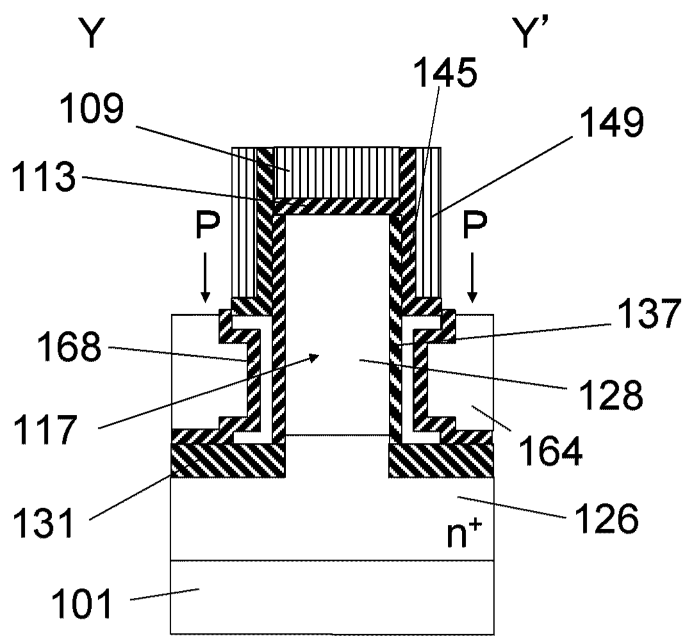
FIG. 28C is a cross-sectional view taken along line Y-Y' of FIG. 28A.

Subsequently, referring to FIGS. 28A to 28C, phosphor (see arrows P) is injected into the polysilicon layer 158 so that the polysilicon layer 158 is formed as a p-type (first conductivity type) silicon layer.

Figure 29A:
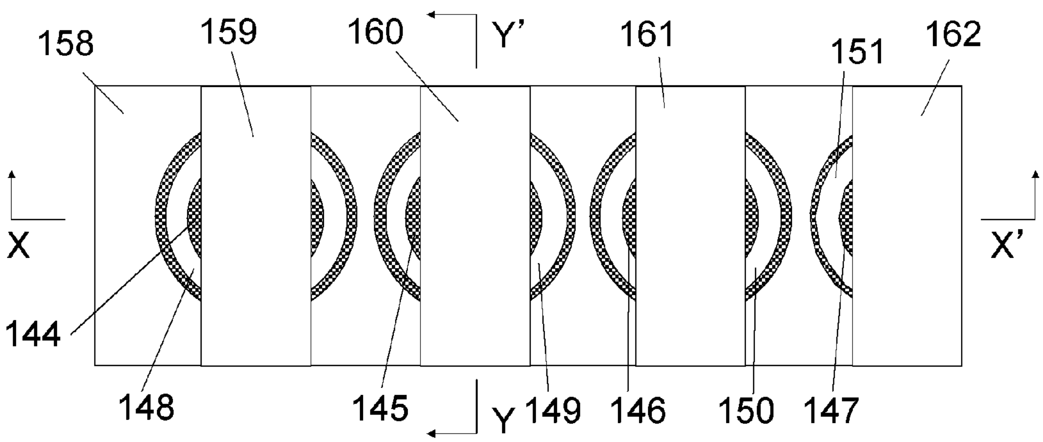
FIG. 29A is a plan view illustrating the method for manufacturing the nonvolatile semiconductor memory according to the embodiment of the present invention.
Figure 29B:
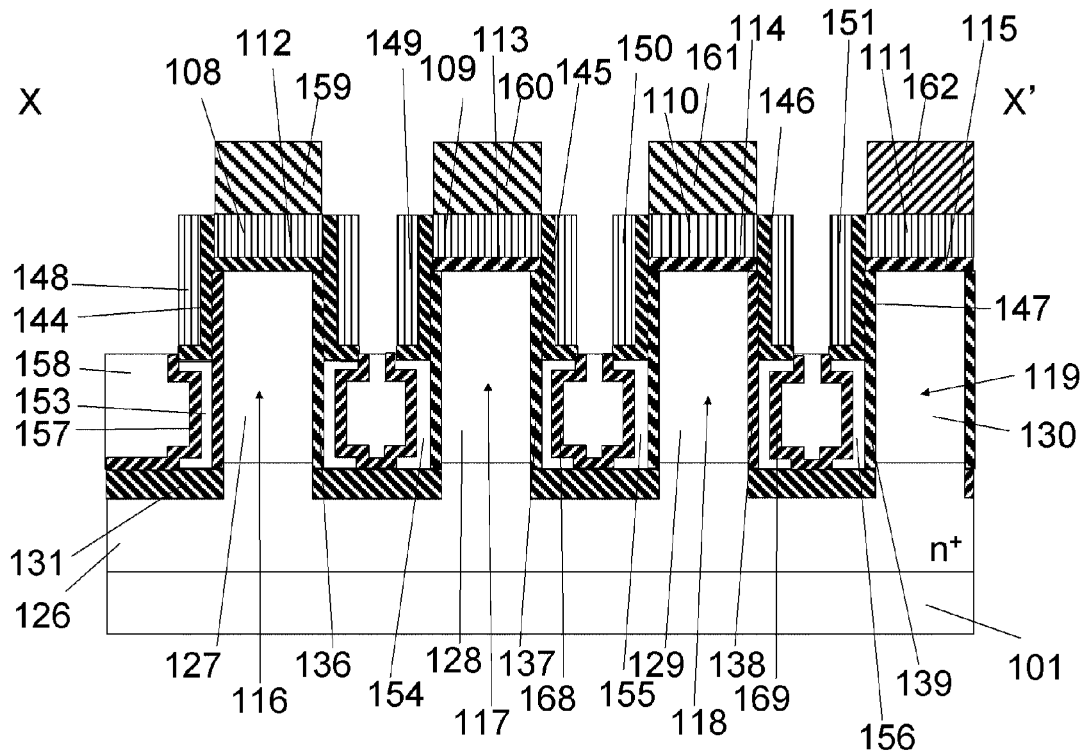
FIG. 29B is a cross-sectional view taken along line X-X' of FIG. 29A.
Figure 29C:
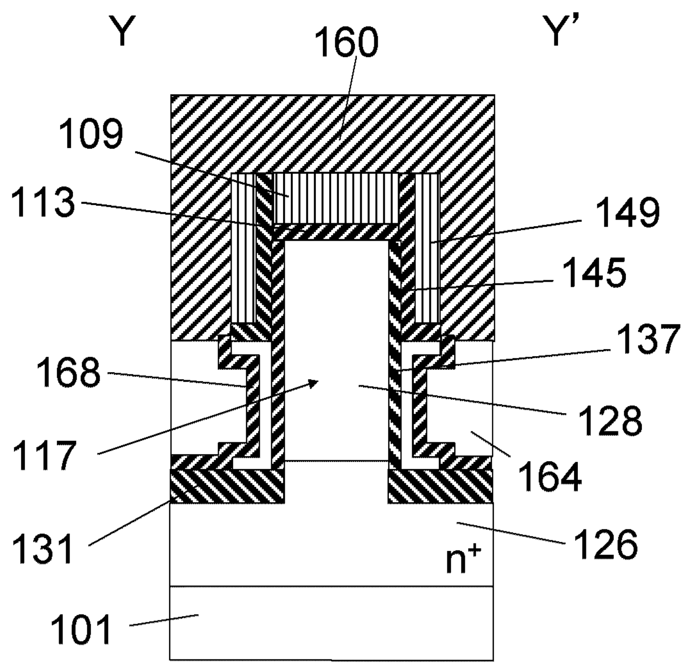
FIG. 29C is a cross-sectional view taken along line Y-Y' of FIG. 29A.

Subsequently, referring to FIGS. 29A to 29C, resists 159, 160, 161, and 162 for forming control gates 163, 164, 165, and 166 are formed so as to extend in the column direction on the top of the nitride films 108, 109, 110, and 111, respectively.

Figure 30A:
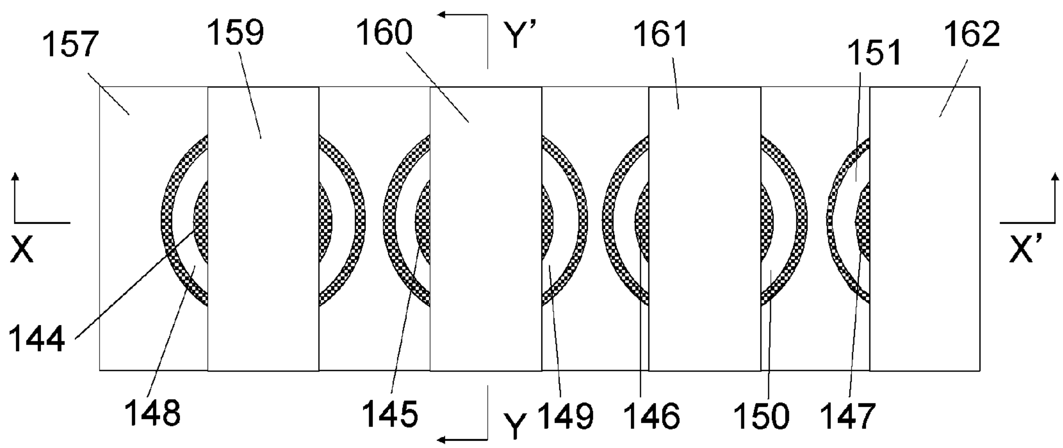
FIG. 30A is a plan view illustrating the method for manufacturing the nonvolatile semiconductor memory according to the embodiment of the present invention.
Figure 30B:
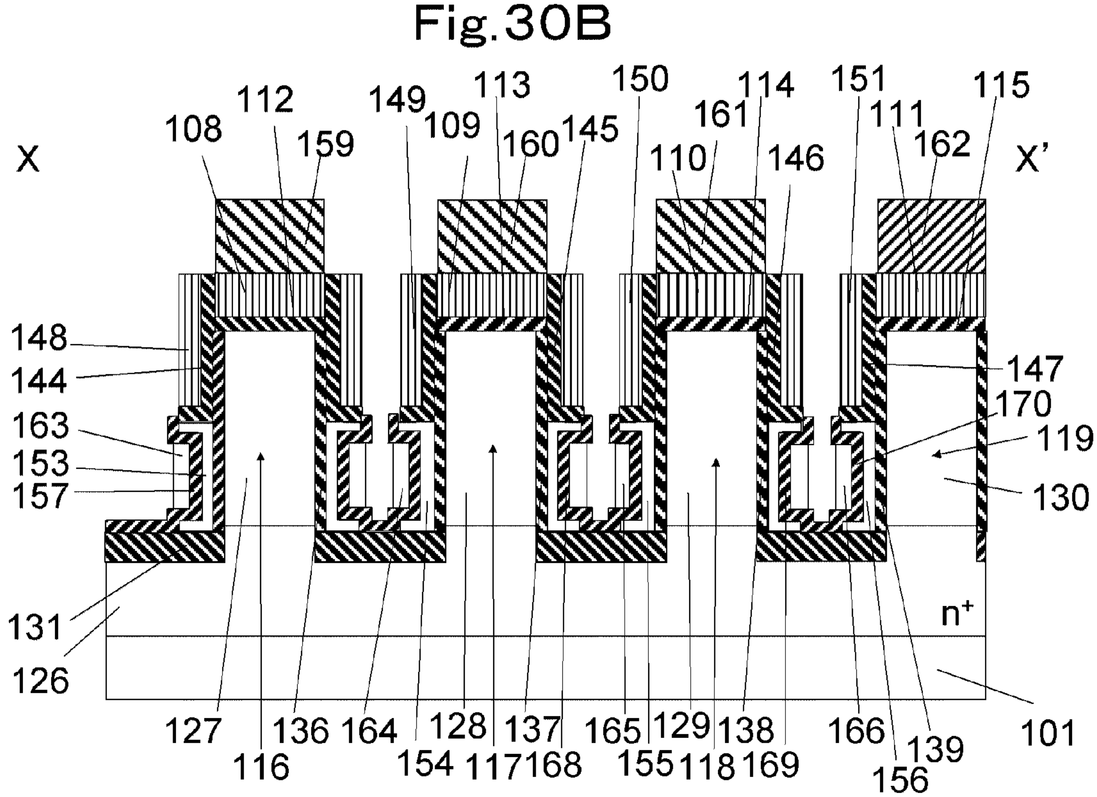
FIG. 30B is a cross-sectional view taken along line X-X' of FIG. 30A.
Figure 30C:
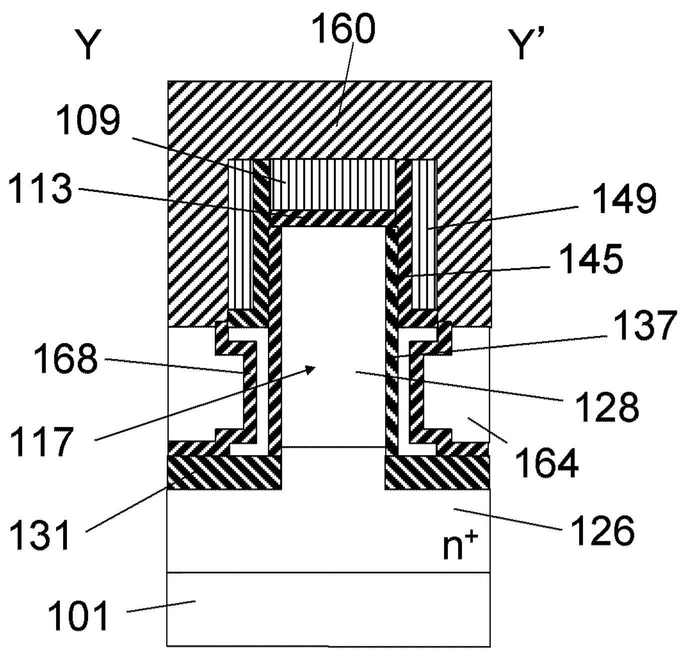
FIG. 30C is a cross-sectional view taken along line Y-Y' of FIG. 30A.

Subsequently, referring to FIGS. 30A to 30C, the polysilicon layer 158 is etched using the insulating film side walls 520, 521, 522, and 523, and the resists 159, 160, 161, and 162 as masks to form the control gates 163, 164, 165, and 166 in the column direction. Thus, a structure is formed in which the hollow pillar-shaped floating gates 153, 154, 155, and 156 face the upper, lower, and inner side surfaces of the hollow pillar-shaped control gates 163, 164, 165, and 166 with the inter-polysilicon insulating film 157 interposed therebetween.

Figure 31A:
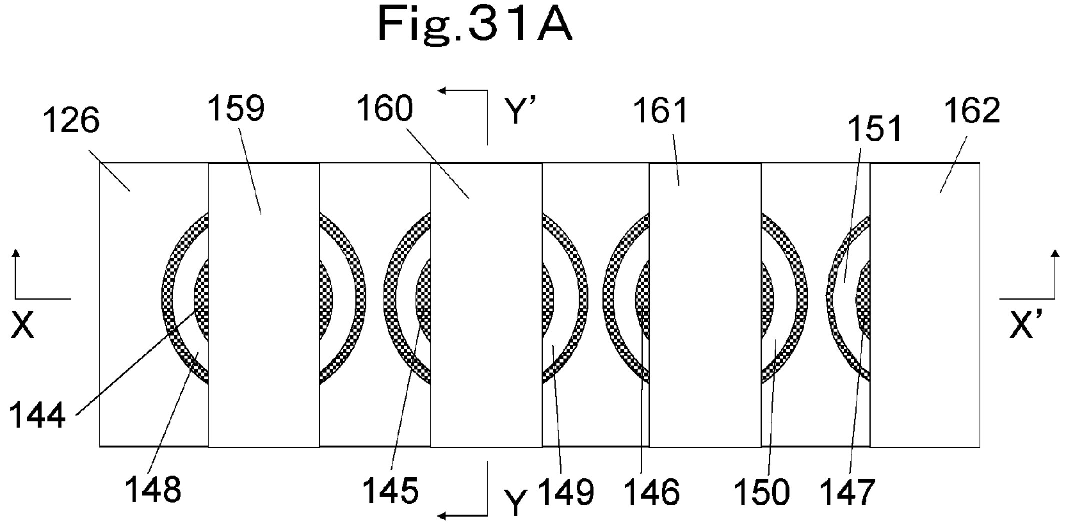
FIG. 31A is a plan view illustrating the method for manufacturing the nonvolatile semiconductor memory according to the embodiment of the present invention.
Figure 31B:
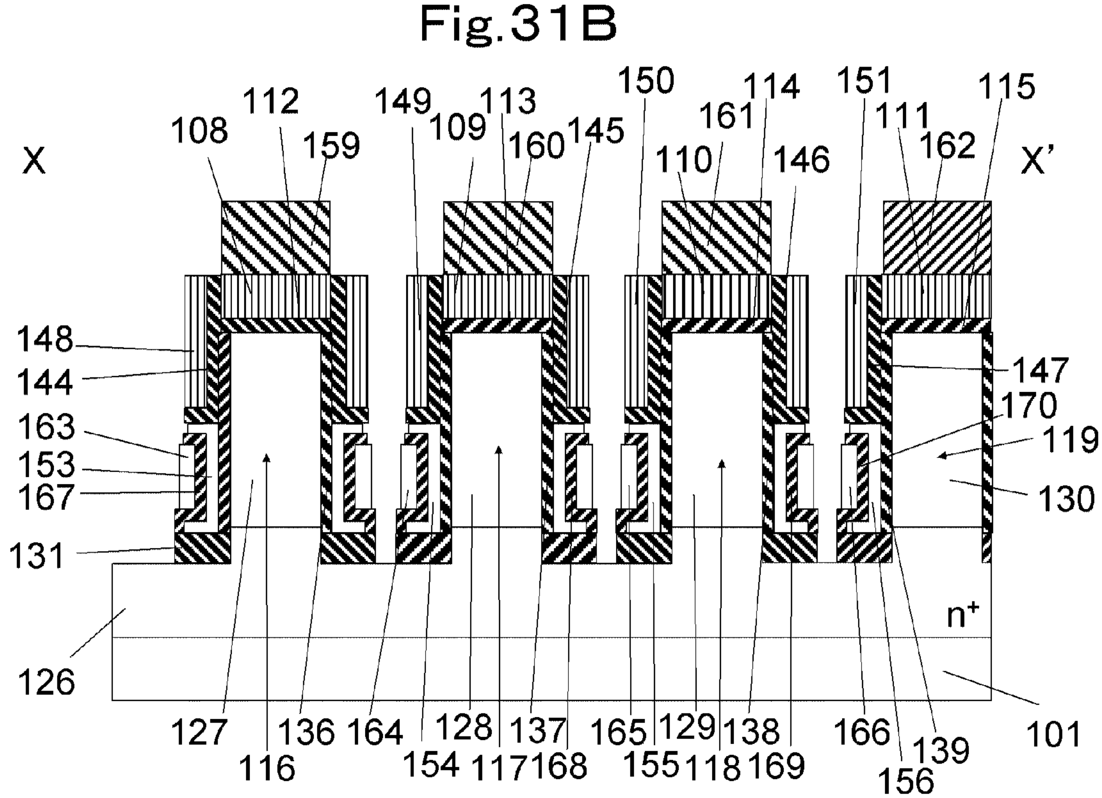
FIG. 31B is a cross-sectional view taken along line X-X' of FIG. 31A.
Figure 31C:
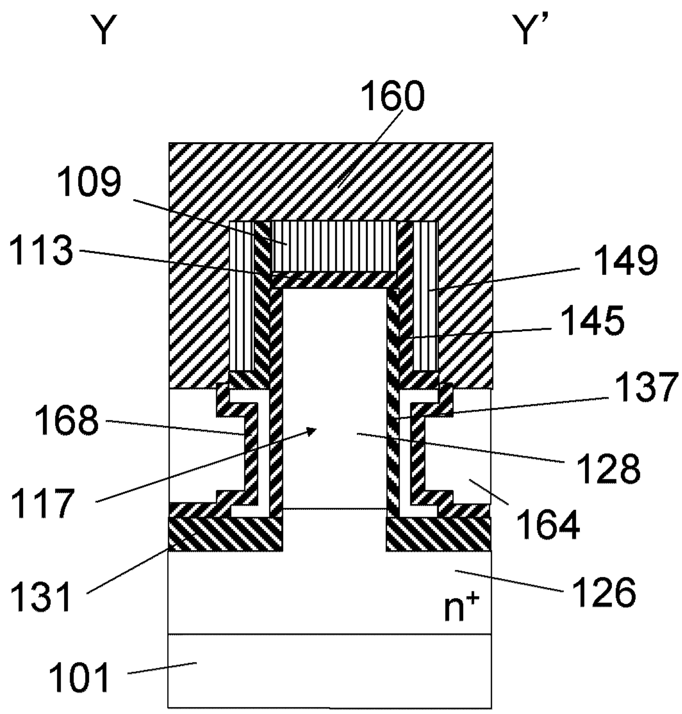
FIG. 31C is a cross-sectional view taken along line Y-Y' of FIG. 31A.

Subsequently, referring to FIGS. 31A to 31C, the inter-polysilicon insulating film 157 is etched to remove the portions thereof which are positioned on the upper surfaces of the control gates 163, 164, 165, and 166 and the upper surface of the oxide film 131, and inter-polysilicon insulating films 167, 168, 169, and 170 are formed. After that, the exposed portions of the oxide film 131 are etched to form first insulating films 171, 172, 173, and 174.

Figure 32A:
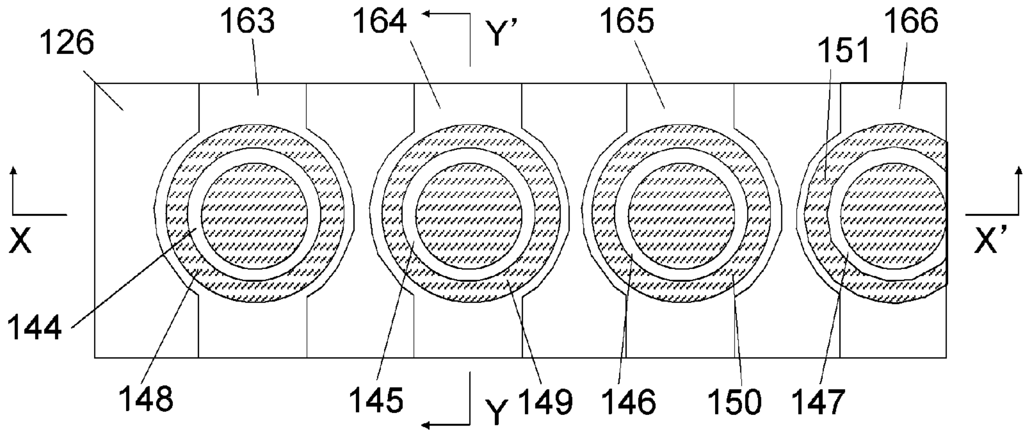
FIG. 32A is a plan view illustrating the method for manufacturing the nonvolatile semiconductor memory according to the embodiment of the present invention.
Figure 32B:
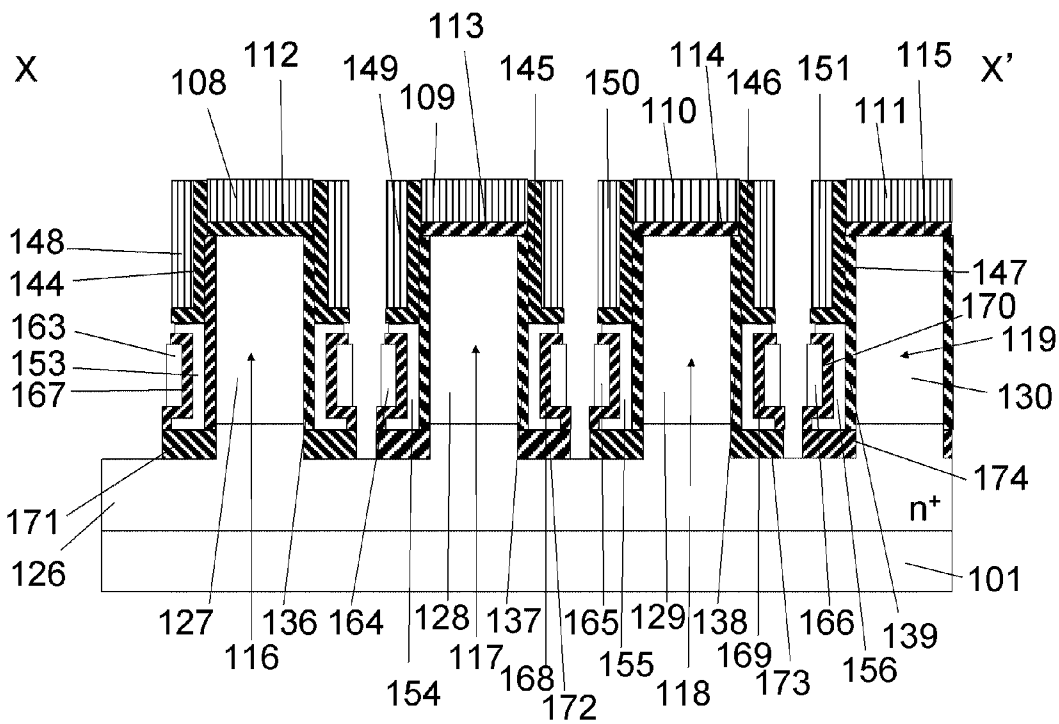
FIG. 32B is a cross-sectional view taken along line X-X' of FIG. 32A.
Figure 32C:
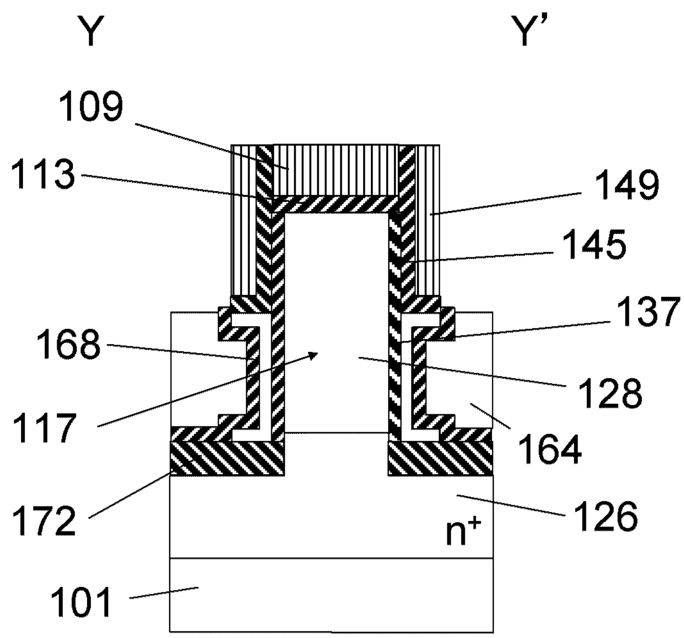
FIG. 32C is a cross-sectional view taken along line Y-Y' of FIG. 32A.

Subsequently, referring to FIGS. 32A to 32C, the resists 159, 160, 161, and 162 are stripped from the nitride films 108, 109, 110, and 111, respectively.

Figure 33A:
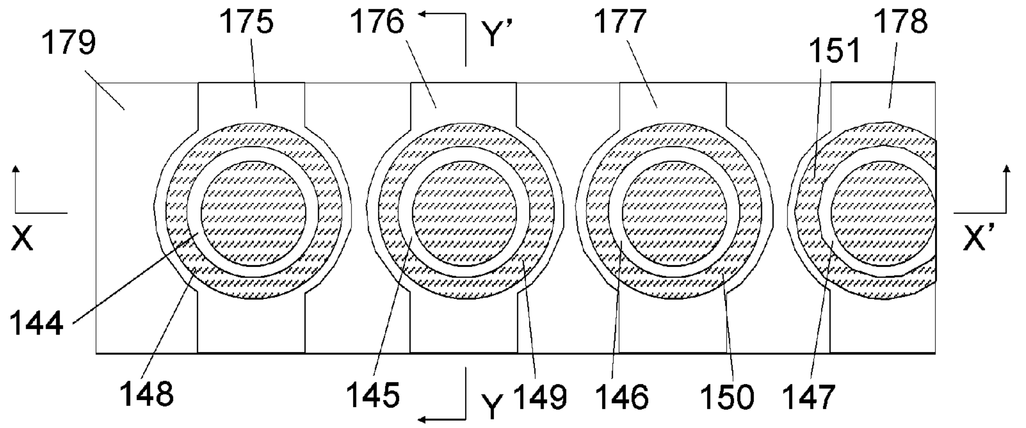
FIG. 33A is a plan view illustrating the method for manufacturing the nonvolatile semiconductor memory according to the embodiment of the present invention.
Figure 33B:
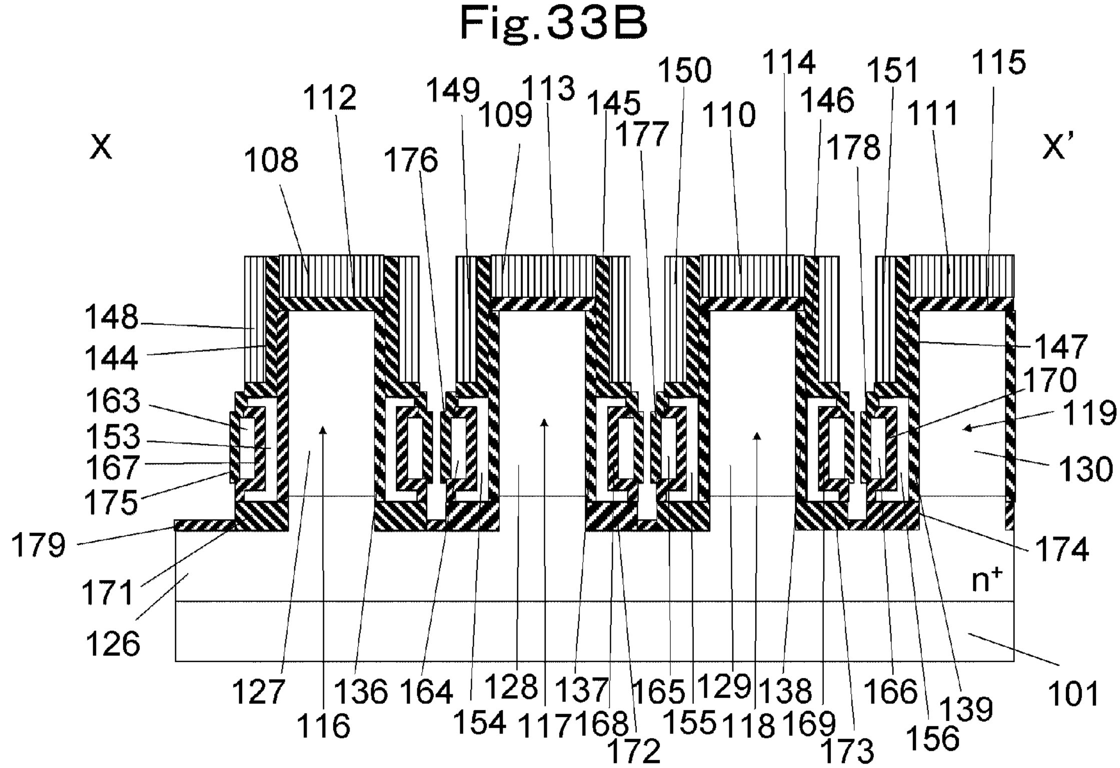
FIG. 33B is a cross-sectional view taken along line X-X' of FIG. 33A.
Figure 33C:
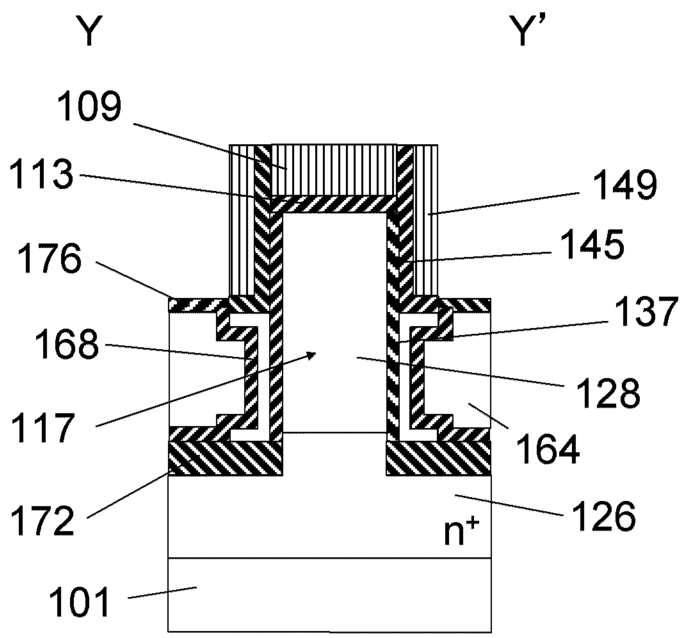
FIG. 33C is a cross-sectional view taken along line Y-Y' of FIG. 33A.

Subsequently, referring to FIGS. 33A to 33C, the surface layer portions of the control gates 163, 164, 165, and 166, the inter-polysilicon insulating films 167, 168, 169, and 170, and the floating gates 153, 154, 155, and 156 are oxidized, and oxide films 175, 176, 177, 178, and 179 are formed on the top of the floating gates 153, 154, 155, and 156, the control gates 163, 164, 165, and 166, and the first source line 126.

Figure 34A:
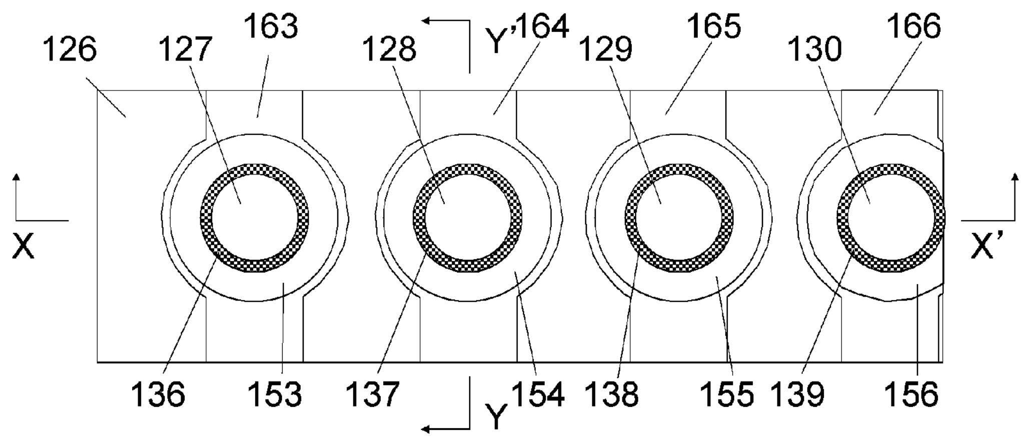
FIG. 34A is a plan view illustrating the method for manufacturing the nonvolatile semiconductor memory according to the embodiment of the present invention.
Figure 34B:
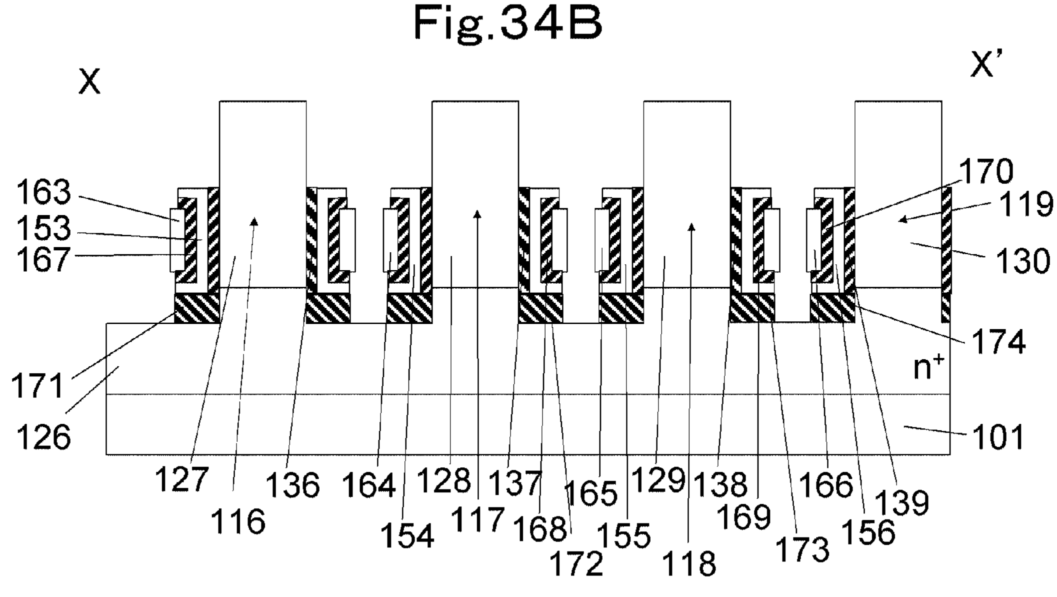
FIG. 34B is a cross-sectional view taken along line X-X' of FIG. 34A.
Figure 34C:
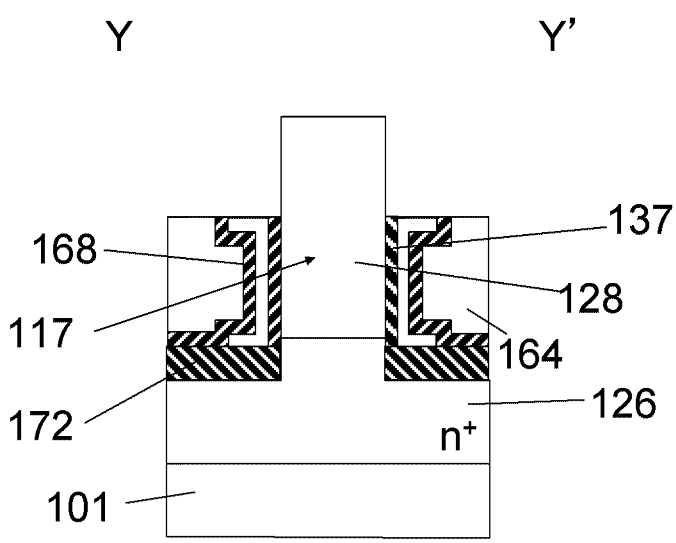
FIG. 34C is a cross-sectional view taken along line Y-Y' of FIG. 34A.

Subsequently, referring to FIGS. 34A to 34C, the nitride films 108, 109, 110, and 111 and the nitride films 148, 149, 150, and 151 are stripped, and the oxide films 112, 113, 114, and 115, the oxide films 144, 145, 146, and 147, and the oxide films 175, 176, 177, 178, and 179 are also stripped.

Figure 35A:
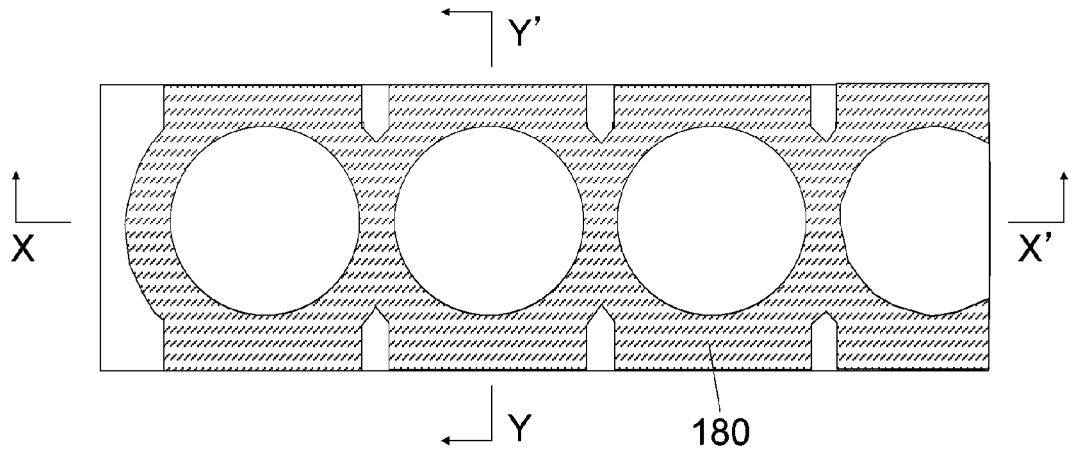
FIG. 35A is a plan view illustrating the method for manufacturing the nonvolatile semiconductor memory according to the embodiment of the present invention.
Figure 35B:
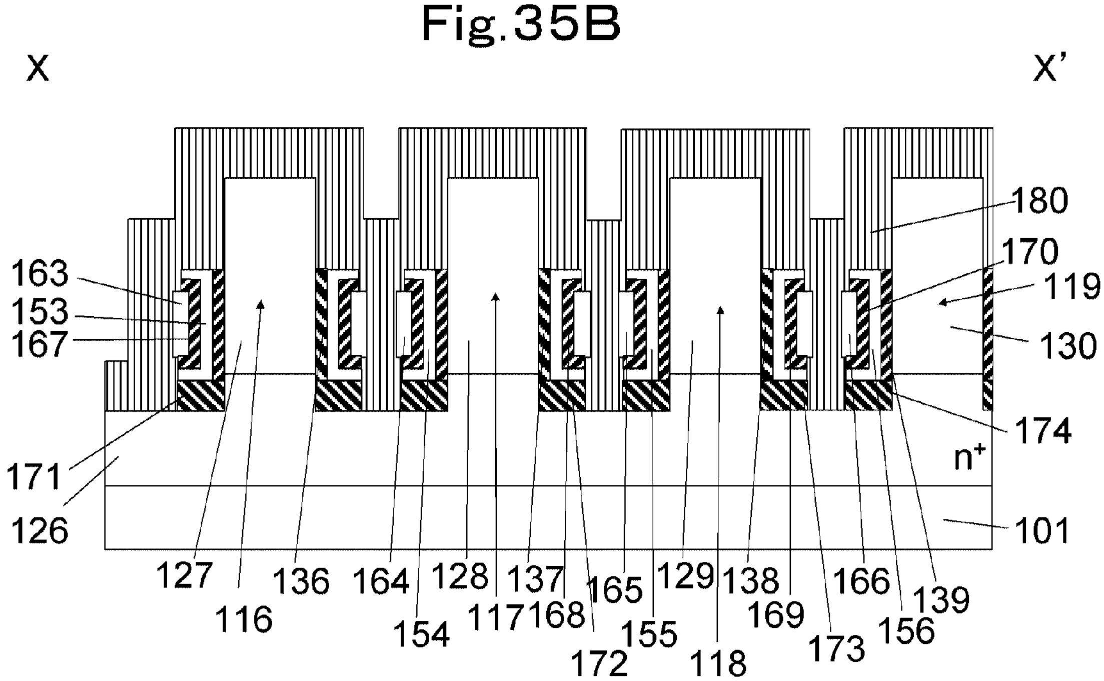
FIG. 35B is a cross-sectional view taken along line X-X' of FIG. 35A.
Figure 35C:
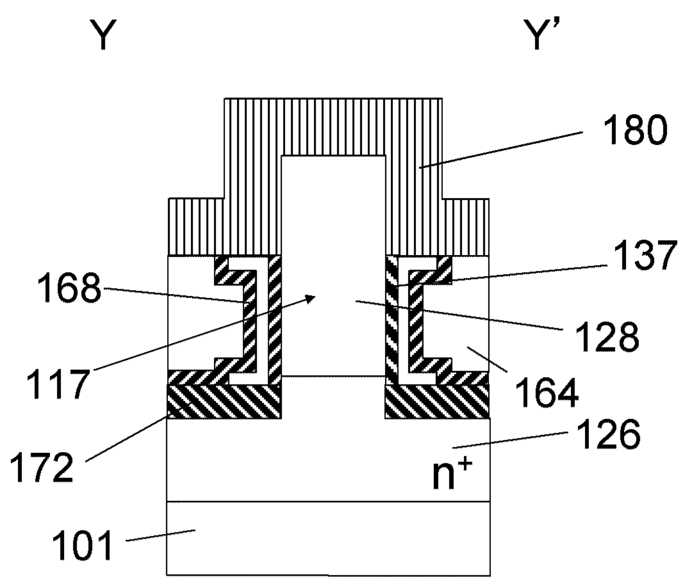
FIG. 35C is a cross-sectional view taken along line Y-Y' of FIG. 35A.

Subsequently, referring to FIGS. 35A to 35C, a nitride film 180 is deposited so as to cover the island-shaped semiconductors 116, 117, 118, and 119 and the first source line 126. Before this step, arsenic may be injected into the top layer portions of the island-shaped semiconductors 116, 117, 118, and 119.

Figure 36A:
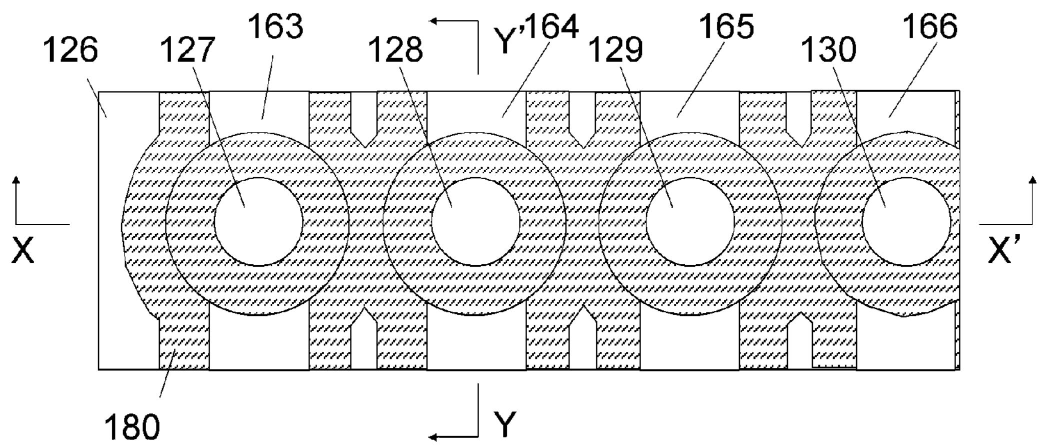
FIG. 36A is a plan view illustrating the method for manufacturing the nonvolatile semiconductor memory according to the embodiment of the present invention.
Figure 36B:
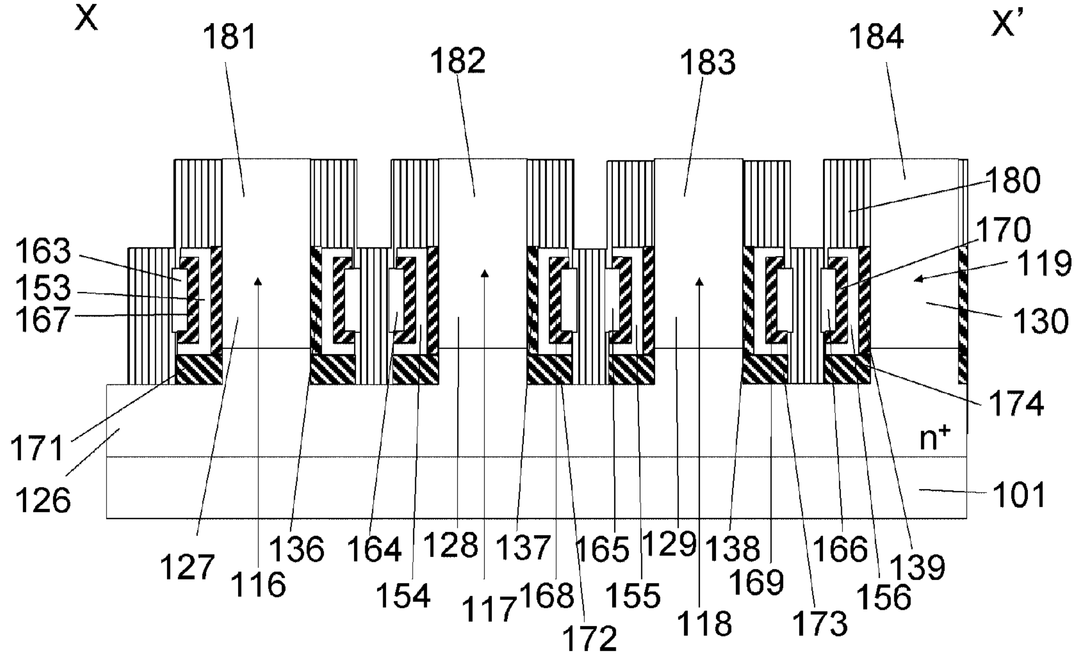
FIG. 36B is a cross-sectional view taken along line X-X' of FIG. 36A.
Figure 36C:
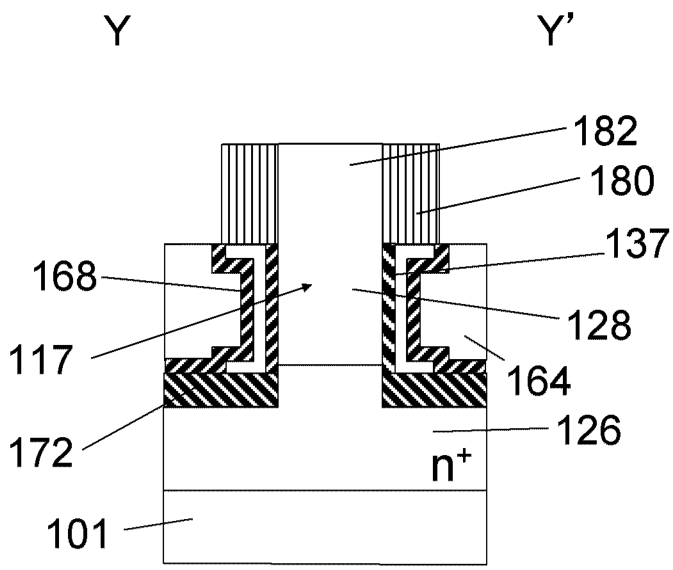
FIG. 36C is a cross-sectional view taken along line Y-Y' of FIG. 36A.

Subsequently, referring to FIGS. 36A to 36C, the nitride film 180 is etched so as to remain in a side wall shape on the side walls of the island-shaped semiconductors 116, 117, 118, and 119.

Figure 37A:
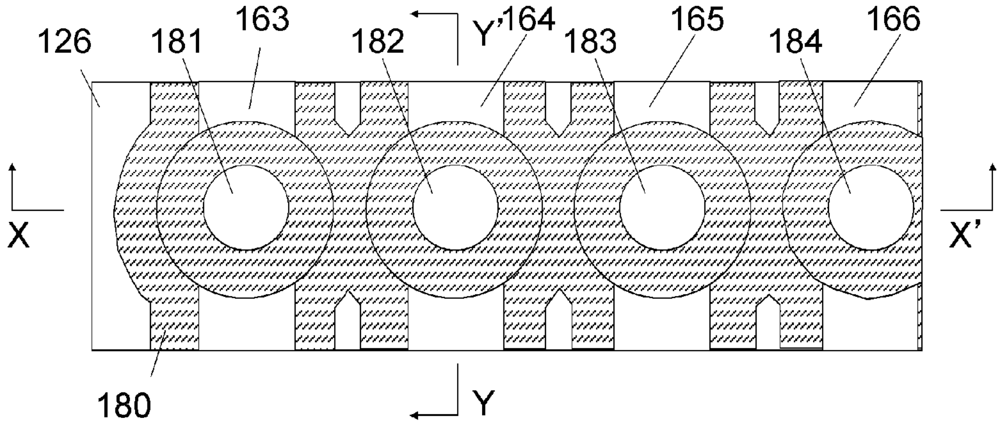
FIG. 37A is a plan view illustrating the method for manufacturing the nonvolatile semiconductor memory according to the embodiment of the present invention.
Figure 37B:
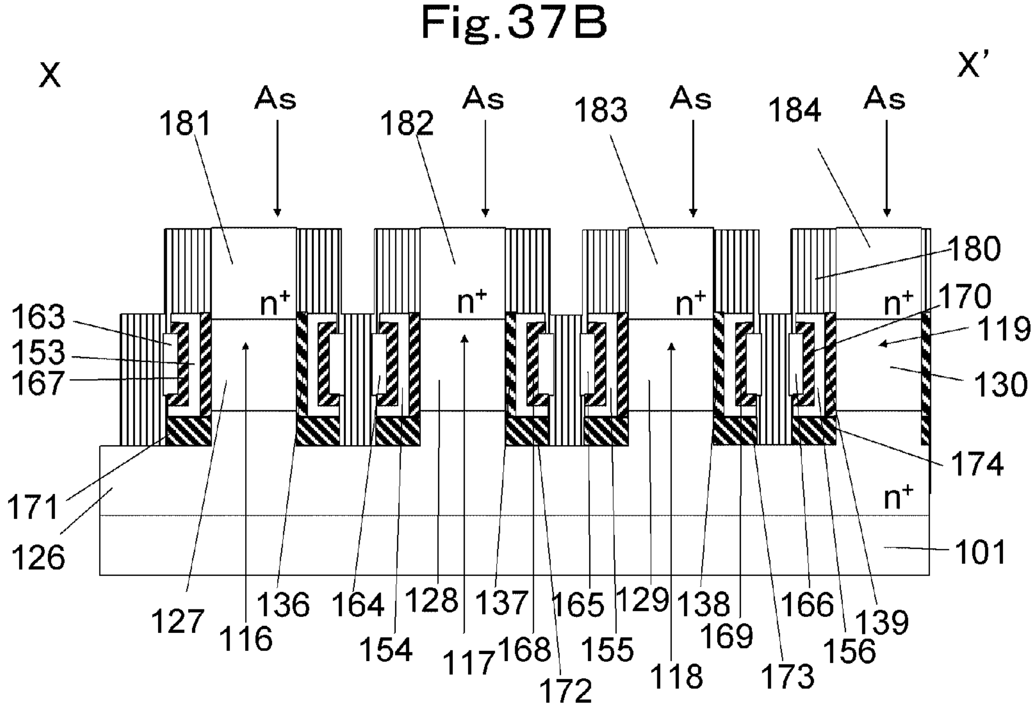
FIG. 37B is a cross-sectional view taken along line X-X' of FIG. 37A.
Figure 37C:
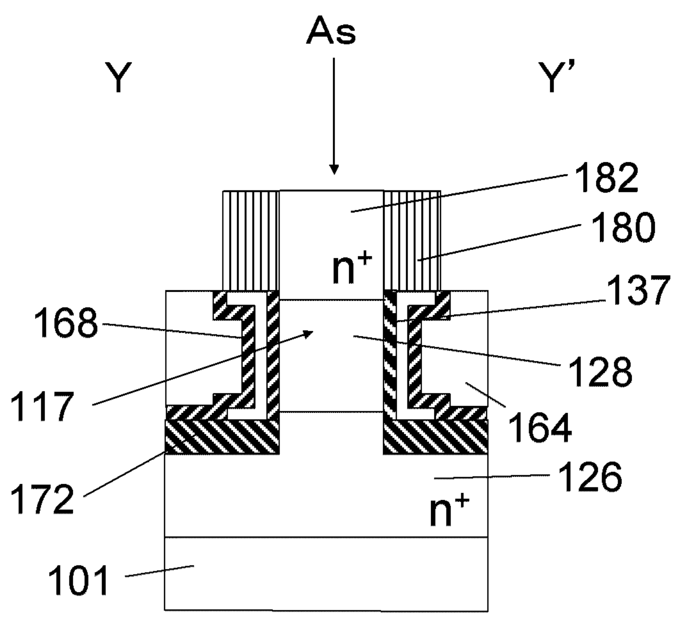
FIG. 37C is a cross-sectional view taken along line Y-Y' of FIG. 37A.

Subsequently, referring to FIGS. 37A to 37C, arsenic (see arrows As) is injected into the top layer portions of the island-shaped semiconductors 116, 117, 118, and 119 to form drain regions 181, 182, 183, and 184 which are n-type semiconductors. After that, in order to reduce the resistance, the island-shaped semiconductors 116, 117, 118, and 119, the control gates 163, 164, 165, and 166, and the first source line 126 may be subjected to a silicide process using a metal material.

Figure 38A:
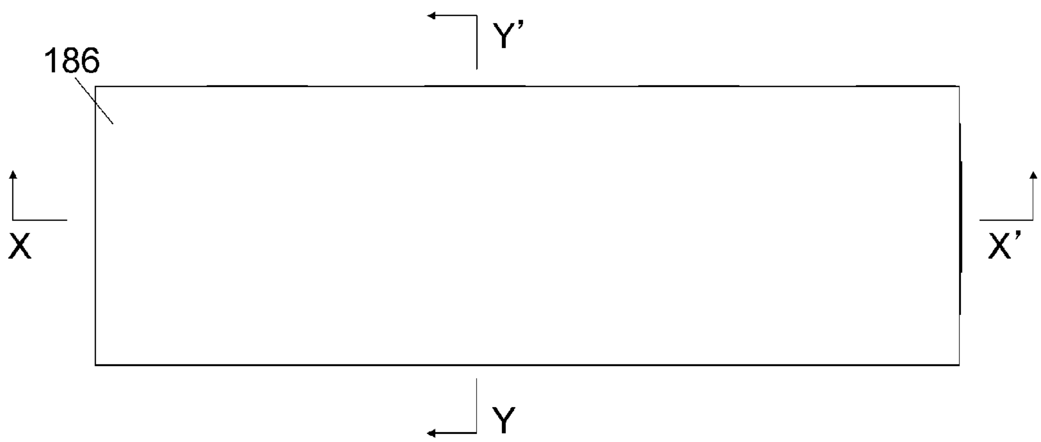
FIG. 38A is a plan view illustrating the method for manufacturing the nonvolatile semiconductor memory according to the embodiment of the present invention.
Figure 38B:
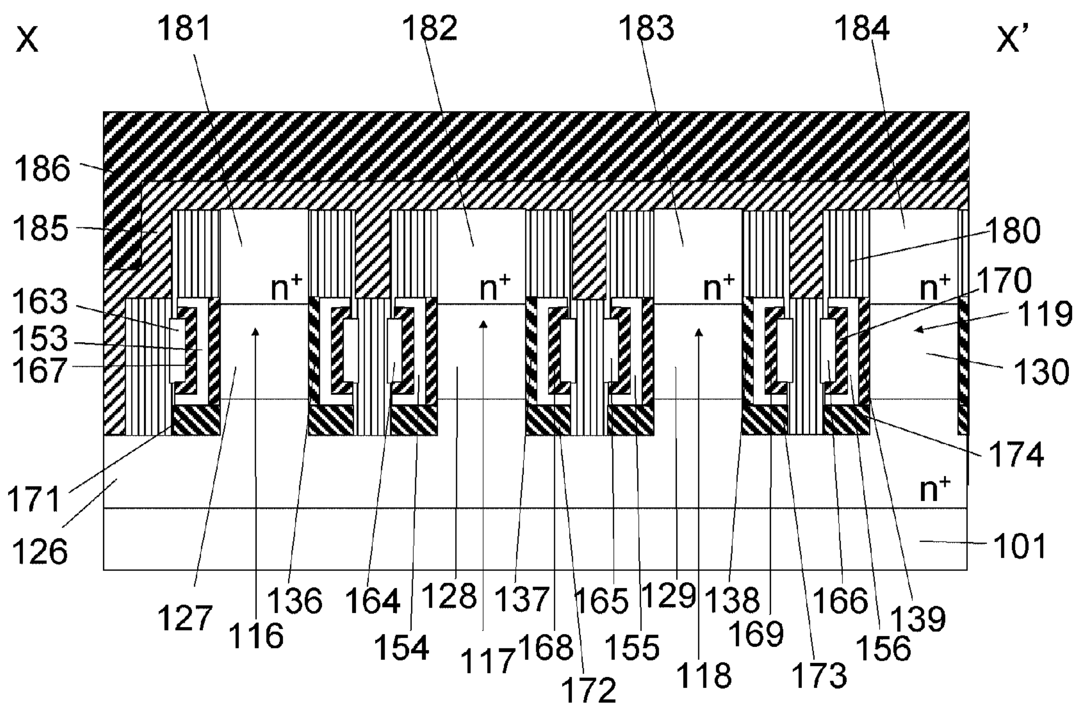
FIG. 38B is a cross-sectional view taken along line X-X' of FIG. 38A.
Figure 38C:
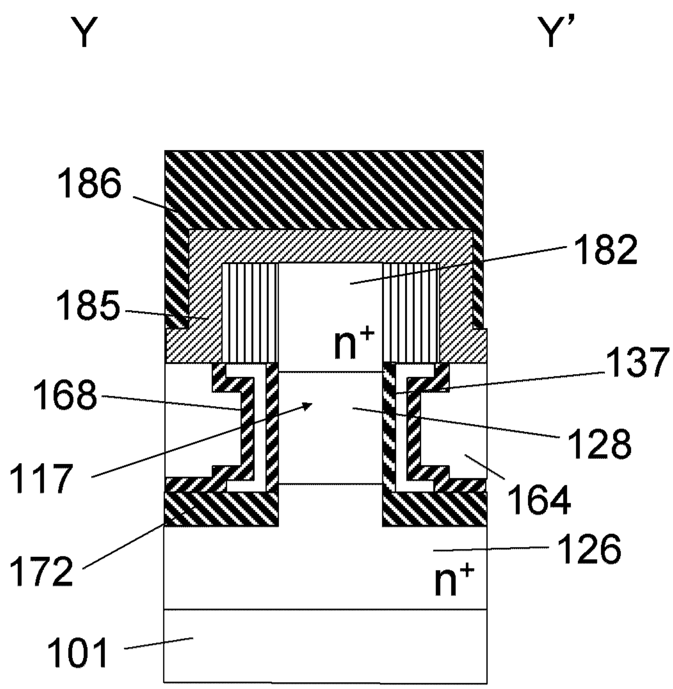
FIG. 38C is a cross-sectional view taken along line Y-Y' of FIG. 38A.

Subsequently, referring to FIGS. 38A to 38C, a contact stopper 185 is deposited using an insulating material so as to cover the island-shaped semiconductors 116, 117, 118, and 119 and the nitride film 180, and, additionally, an interlayer film 186 is deposited on the top layer of the contact stopper 185. Thereafter, planarization is performed using CMP.

Figure 39A:
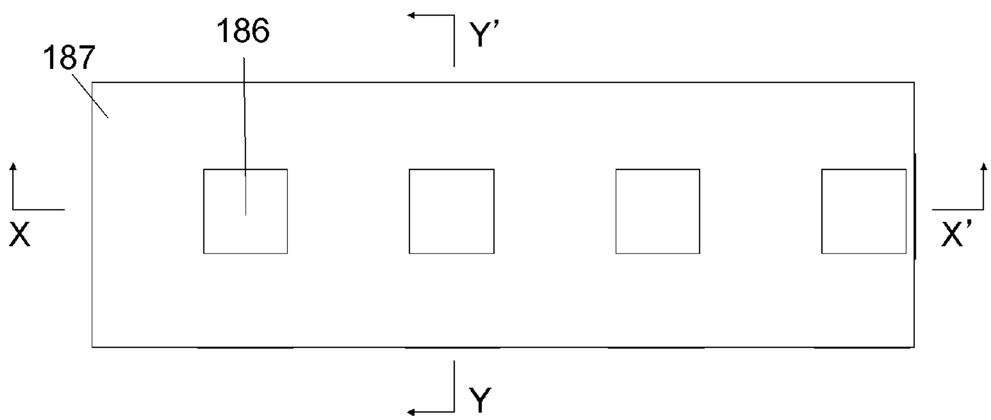
FIG. 39A is a plan view illustrating the method for manufacturing the nonvolatile semiconductor memory according to the embodiment of the present invention.
Figure 39B:
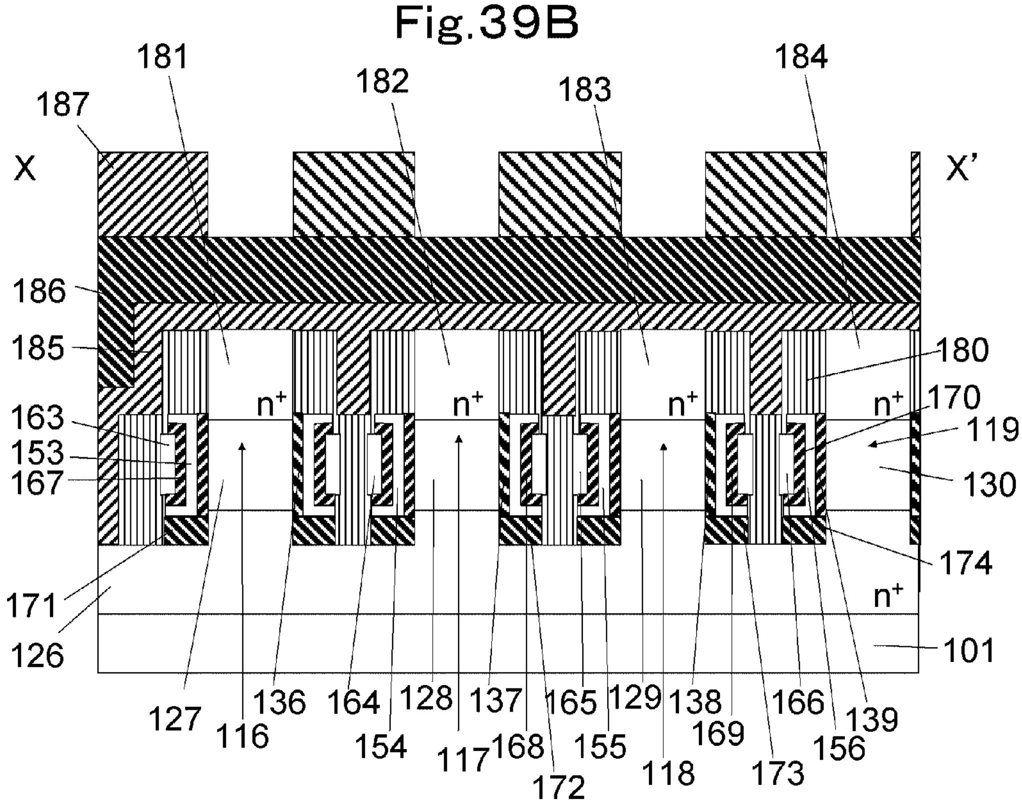
FIG. 39B is a cross-sectional view taken along line X-X' of FIG. 39A.
Figure 39C:
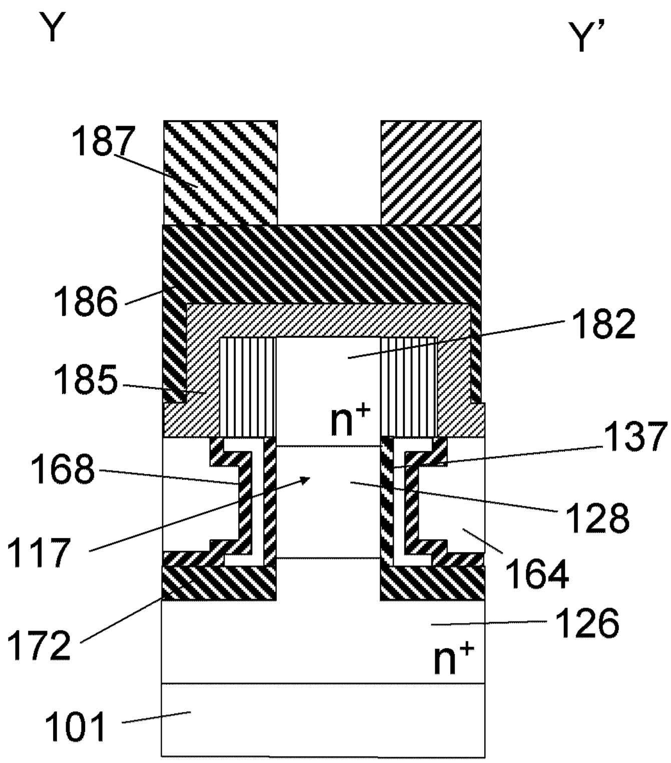
FIG. 39C is a cross-sectional view taken along line Y-Y' of FIG. 39A.

Subsequently, referring to FIGS. 39A to 39C, a resist 187 for forming contact holes 188, 189, 190, and 191 (see FIGS. 40A and 40B) is formed at a predetermined position on the interlayer film 186.

Figure 40A:
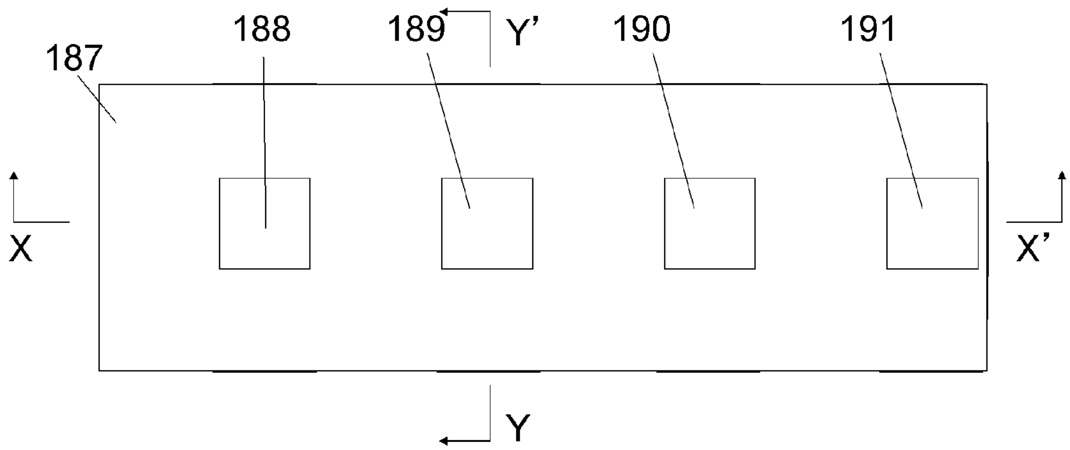
FIG. 40A is a plan view illustrating the method for manufacturing the nonvolatile semiconductor memory according to the embodiment of the present invention.
Figure 40B:
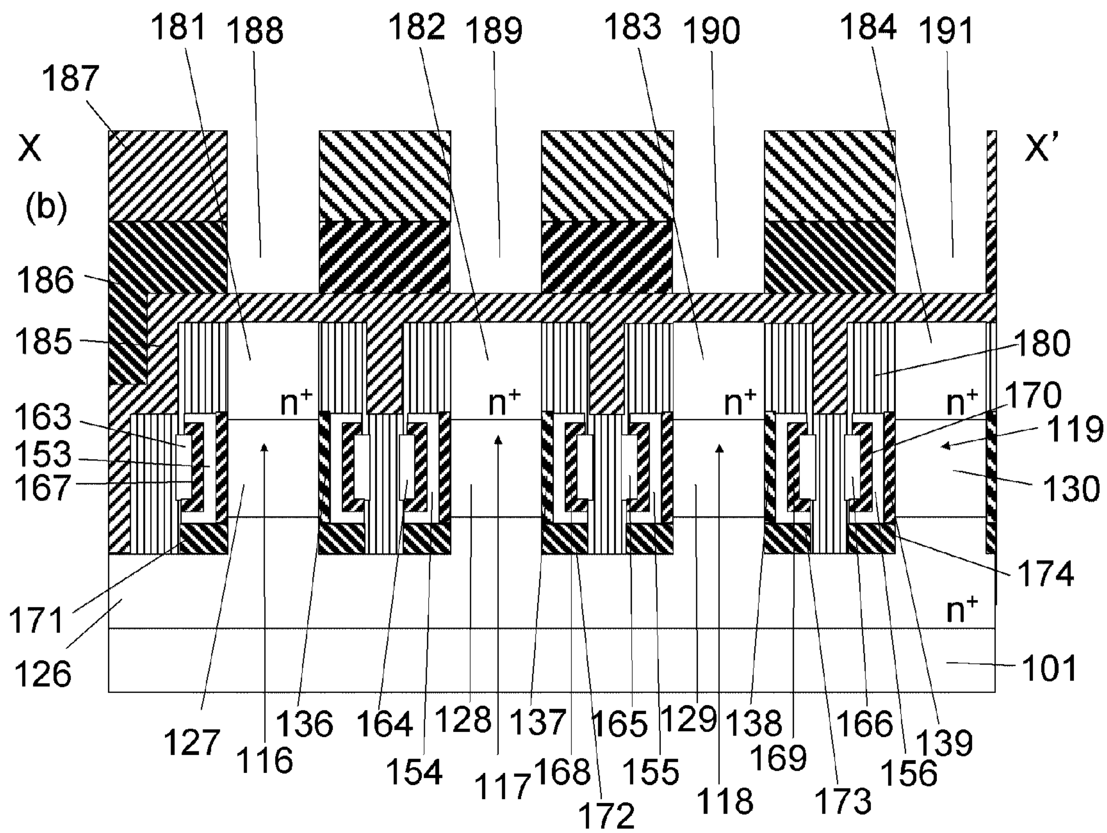
FIG. 40B is a cross-sectional view taken along line X-X' of FIG. 40A.
Figure 40C:
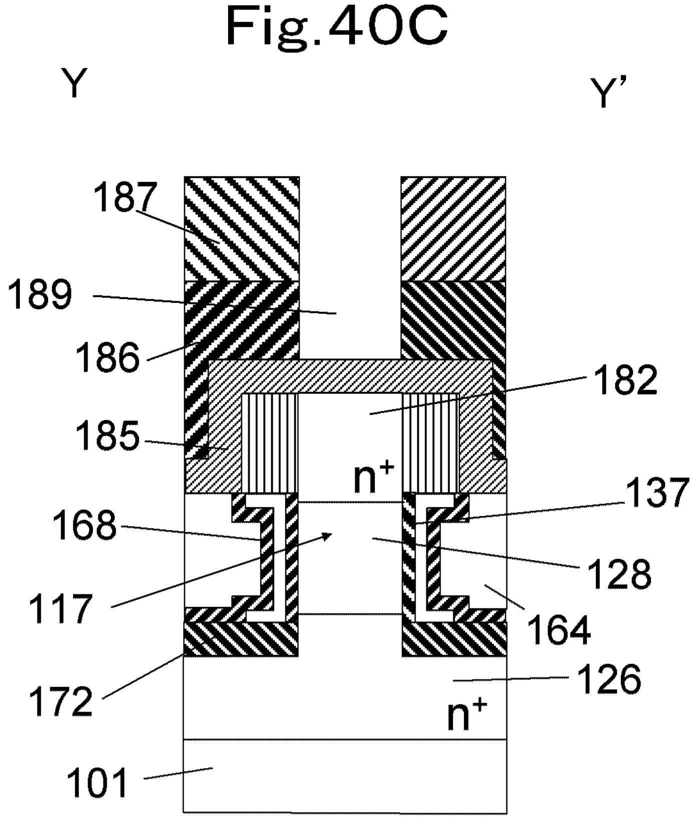
FIG. 40C is a cross-sectional view taken along line Y-Y' of FIG. 40A.

Subsequently, referring to FIGS. 40A to 40C, the interlayer film 186 is etched using the resist 187 as a mask to form the contact holes 188, 189, 190, and 191, and the portions of the surface of the contact stopper 185 are exposed.

Figure 41A:
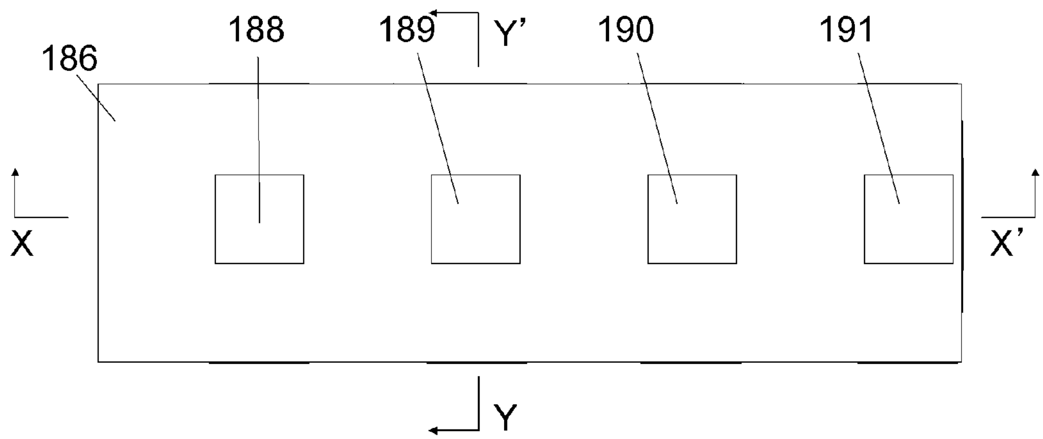
Figure 41B:
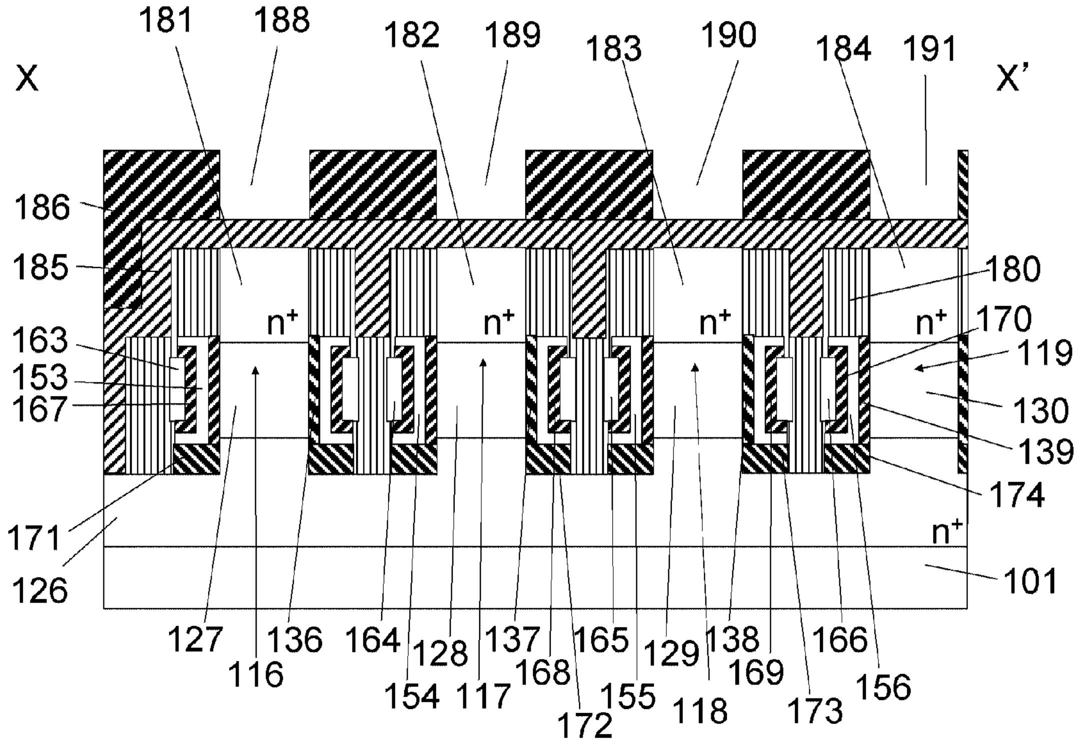
Figure 41C:
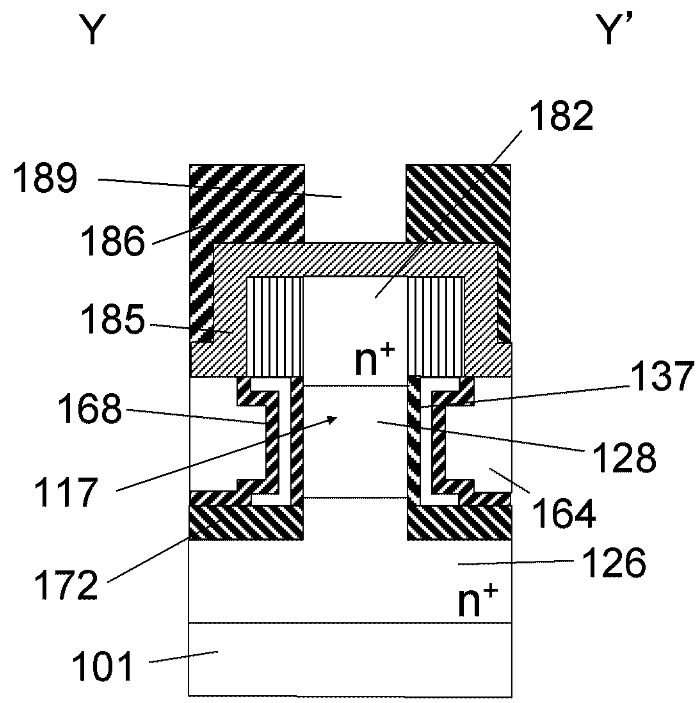

Subsequently, referring to FIGS. 41A to 41C, the resist 187 is stripped.

Figure 42A:
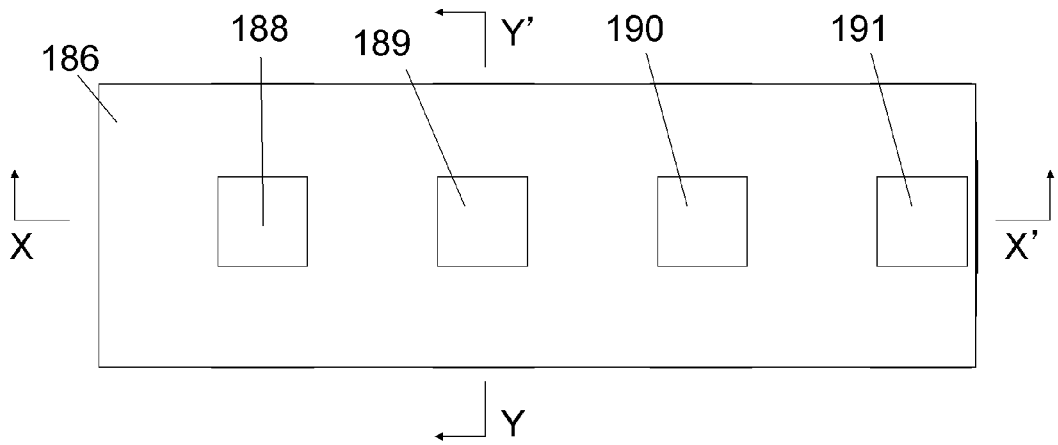
Figure 42B:
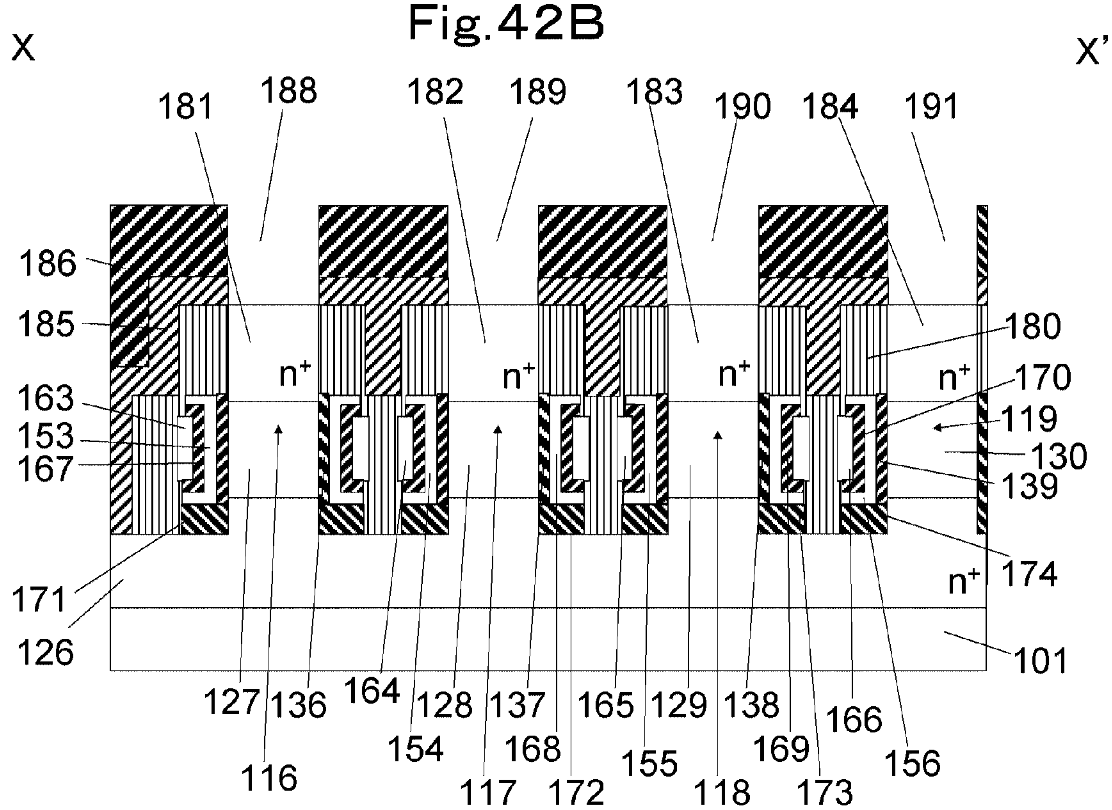
Figure 42C:
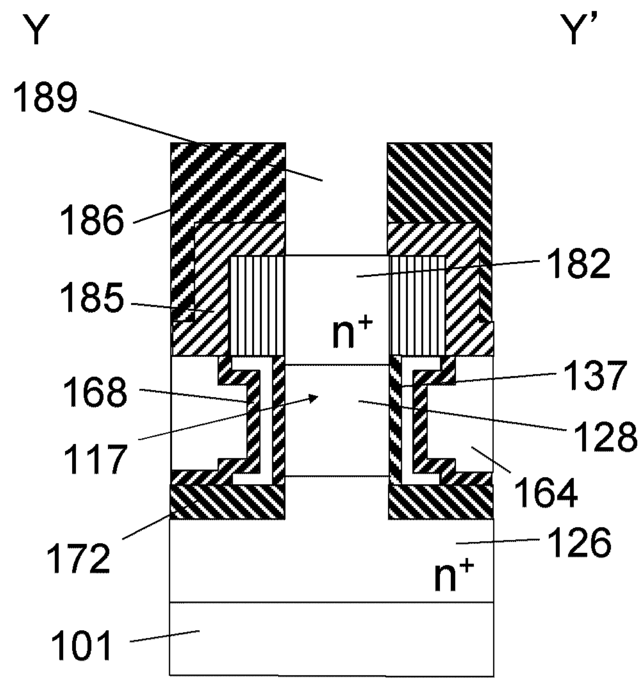

Subsequently, referring to FIGS. 42A to 42C, the portions of the contact stopper 185 that are located on the bottom portions of the contact holes 188, 189, 190, and 191 are removed by etching.

Figure 43A:
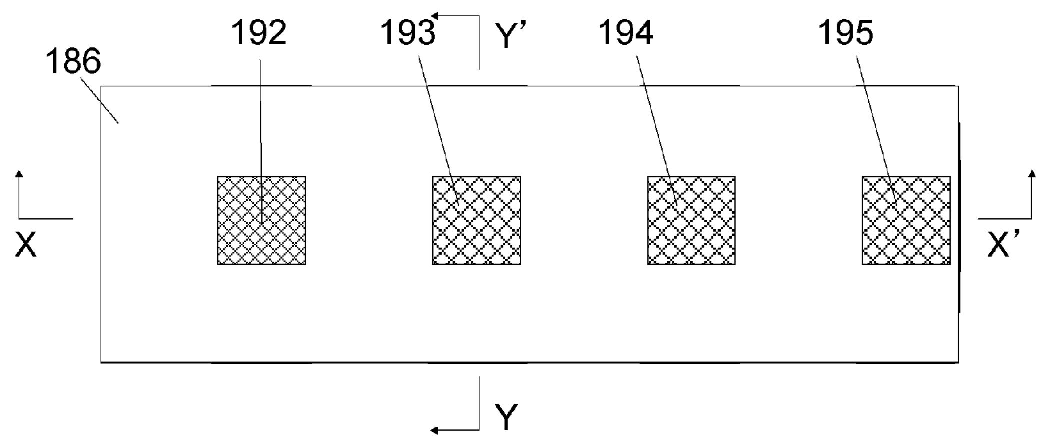
Figure 43B:
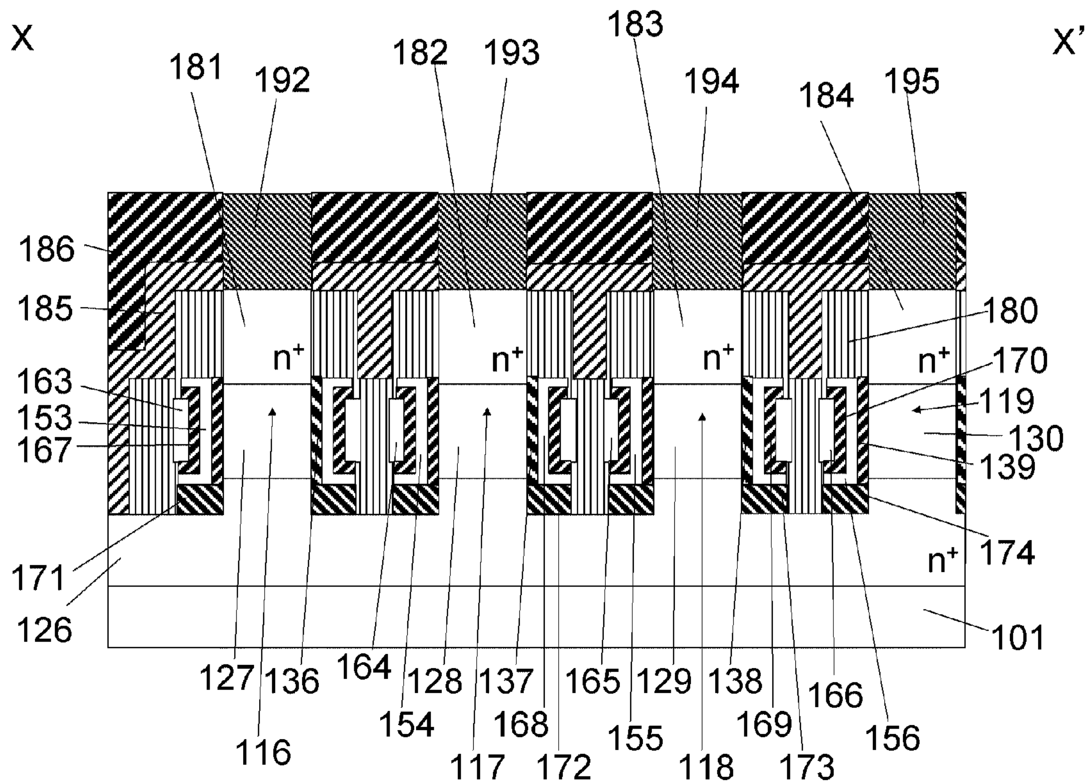
Figure 43C:
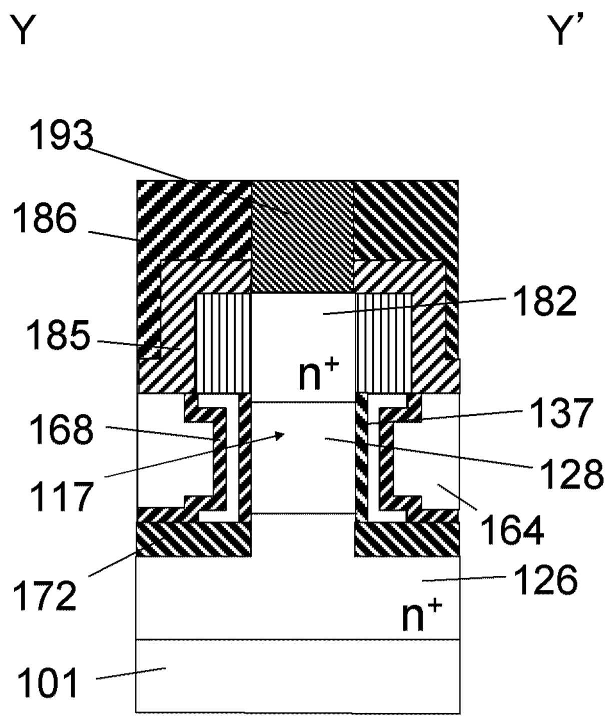

Subsequently, referring to FIGS. 43A to 43C, contacts 192, 193, 194, and 195 are formed using a conductive material in the contact holes 188, 189, 190, and 191, respectively, and are electrically connected to the drain regions 181, 182, 183, and 184 of the island-shaped semiconductors 116, 117, 118, and 119, respectively.

Figure 44A:
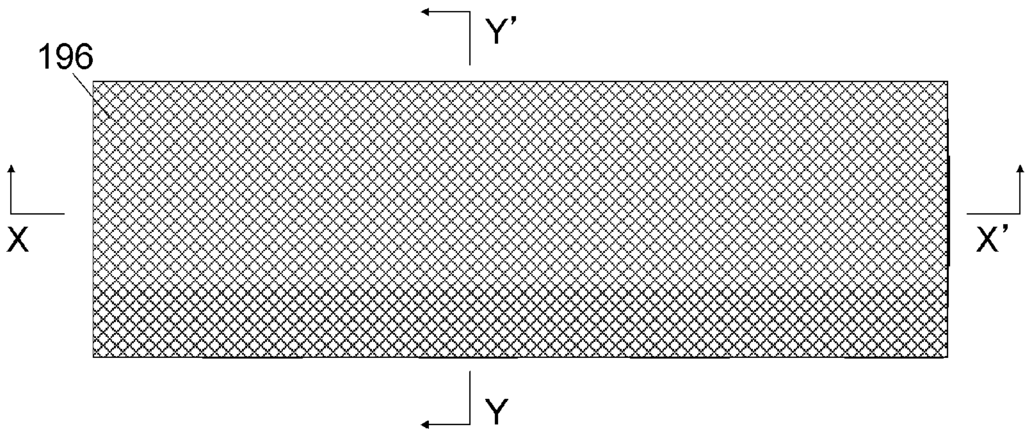
Figure 44B:
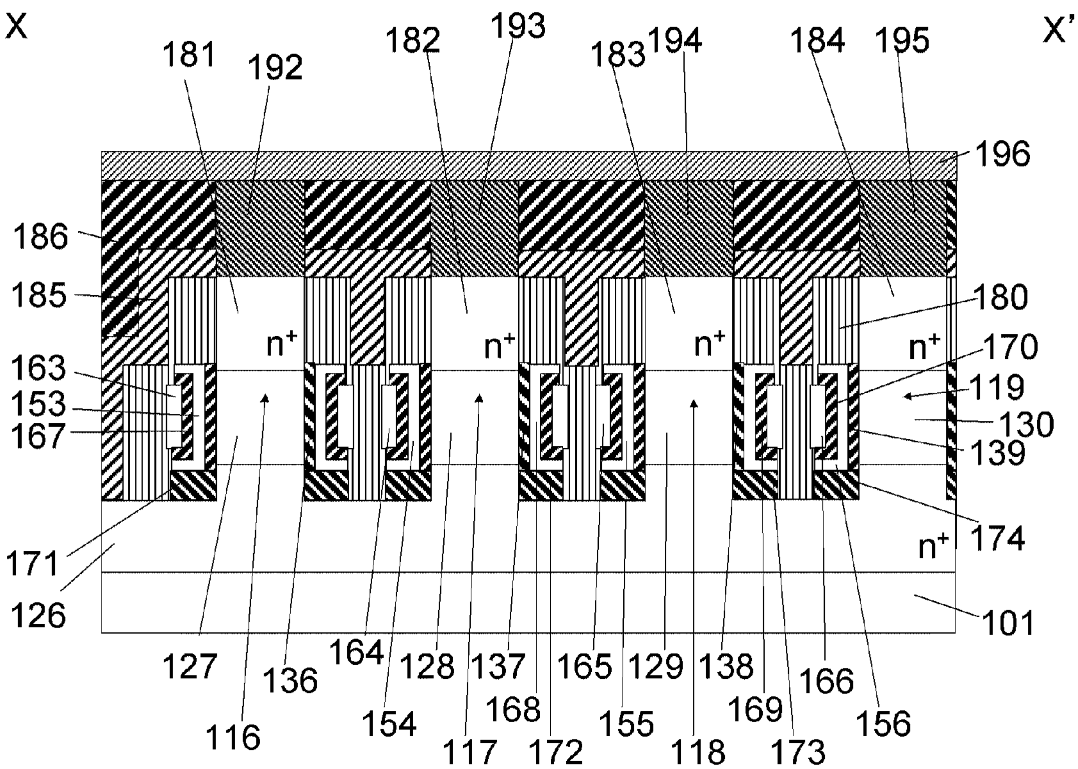
Figure 44C:
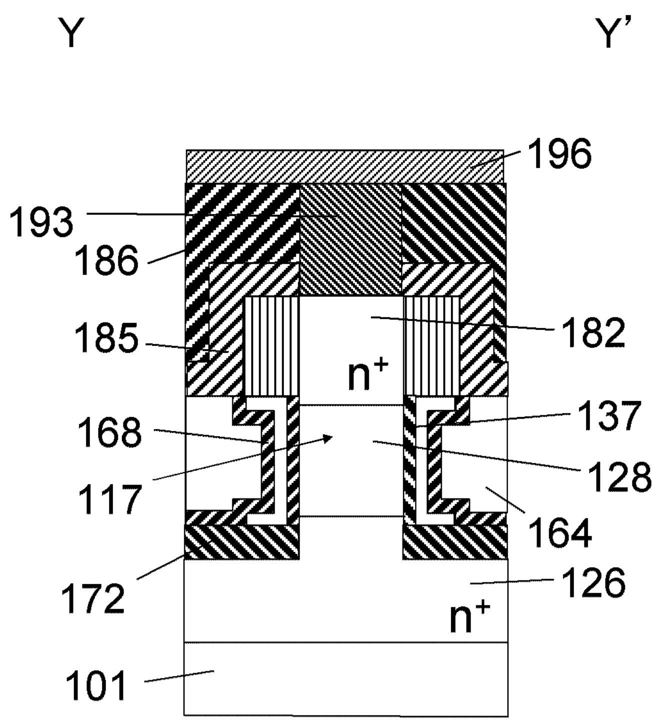

Subsequently, referring to FIGS. 44A to 44C, a metal 196 is deposited using a metal material on the top of the interlayer film 186 and the contacts 192, 193, 194, and 195.

Subsequently, referring to FIGS. 45A to 45C, resists 197, 198, and 199 for forming main metal wiring lines 200 and 202 and a second source line 201 are formed on the top of the metal 196.

Subsequently, referring to FIGS. 46A to 46C, the metal 196 is etched using the resists 197, 198, and 199 as masks, and the main metal wiring lines 200 and 202 and the second source line 201 are formed. In this case, the second source line 201 is arranged in the column direction.

Subsequently, referring to FIGS. 47A to 47C, the resists 197, 198, and 199 are stripped.

Subsequently, referring to FIGS. 48A to 48C, an interlayer film 203 is deposited on the top of the main metal wiring lines 200 and 202, the second source line 201, and the interlayer film 186 using an insulating material.

Subsequently, referring to FIGS. 49A to 49C, a resist 204 for forming via holes 205 and 206 (see FIGS. 50A and 50B) is formed on the top of the interlayer film 203.

Subsequently, referring to FIGS. 50A to 50C, the interlayer film 203 is etched using the resist 204 as a mask, and the via holes 205 and 206 are formed so that portions of the main metal wiring lines 200 and 202 are exposed.

Subsequently, referring to FIGS. 51A to 51C, the resist 204 is stripped.

Subsequently, referring to FIGS. 52A to 52C, vias 207 and 208 are formed in the via holes 205 and 206 using a conductive material.

Subsequently, referring to FIGS. 53A to 53C, a metal 209 is deposited on the top of the interlayer film 203 and the vias 207 and 208 using a conductive material.

Subsequently, referring to FIGS. 54A to 54C, a resist 210 for forming a sub-metal wiring line 211 (see FIGS. 55B and 55C) is formed at a predetermined position on the metal 209.

Subsequently, referring to FIGS. 55A to 55C, the metal 209 is etched using the resist 210 as a mask, and the sub-metal wiring line 211 is formed. The sub-metal wiring line 211 is electrically connected to the main metal wiring lines 200 and 202 via the vias 207 and 208, respectively, and becomes as a bit line.

Subsequently, referring to FIGS. 56A to 56C, the resist 210 is stripped. Therefore, the formation of the nonvolatile semiconductor memory illustrated in FIGS. 2A to 2D is completed.

In the foregoing embodiment, the island-shaped semiconductor 301 having the source region 303, the channel region 304, and the drain region 302 has a cylindrical shape. The island-shaped semiconductor 301 may have, for example, a rectangular pillar shape so long as the advantageous effects of the present invention are achievable, or may also have a non-cylindrical pillar shape having a polygonal cross-sectional shape such as a hexagonal or octagonal cross-sectional shape. Further, the island-shaped semiconductor 301 is shaped so as to have substantially equal cross-sectional areas in the thickness direction. However, of course, the island-shaped semiconductor 301 may be shaped so as to have, for example, a small cross-sectional area at the center in the thickness direction so long as the advantageous effects of the present invention are achievable.

In the foregoing embodiment, the floating gate 306, the control gate 308, the tunnel insulating film 305 between the floating gate 306 and the channel region 304, and the inter-polysilicon insulating film 307 between the control gate 308 and the floating gate 306 have a hollow pillar-shaped shape. They may have, for example, a hollow pillar-shaped shape or a hollow pillar shape having a polygonal cross-sectional shape such as a hexagonal or octagonal cross-sectional shape so long as the advantageous effects of the present invention are achievable. Further, the floating gate 306, the control gate 308, the tunnel insulating film 305, and the inter-polysilicon insulating film 307 are shaped so as to have substantially equal cross-sectional areas in the thickness direction. However, of course, they may be shaped so as to have, for example, a small cross-sectional area at the center in the thickness direction so long as the advantageous effects of the present invention are achievable.

In the foregoing embodiment, the floating gate 306, the control gate 308, the tunnel insulating film 305 between the floating gate 306 and the channel region 304, and the inter-polysilicon insulating film 307 between the control gate 308 and the floating gate 306 have a hollow pillar-like shape that continuously surrounds the outer periphery of the island-shaped semiconductor 301. The floating gate 306, the control gate 308, the tunnel insulating film 305 between the floating gate 306 and the channel region 304, and the inter-polysilicon insulating film 307 between the control gate 308 and the floating gate 306 may have a discontinuous hollow pillar shape, for example, a shape in which a plurality of plate-like bodies cooperate with each other to surround the outer periphery of the island-shaped semiconductor 301 (for the control gate 308, preferably, a plurality of plate-like bodies that are its constituent elements are electrically connected to each other). Even such a discontinuous hollow pillar shape is included in examples of the hollow pillar-shape described in the present invention.

It is to be understood that the present invention can embrace various embodiments and modifications without departing from the broad spirit and scope of the present invention. In addition, the foregoing embodiment is used to describe an example of the present invention, and is not intended to limit the scope of the present invention.

What is claimed is:

1. A nonvolatile semiconductor memory transistor comprising:

an island-shaped semiconductor having a source region, a channel region, and a drain region in order from surface of a substrate;

a hollow pillar-shaped floating gate surrounding an outer periphery of the channel region and a tunnel insulating film between the floating gate and the channel region, the hollow pillar-shaped floating gate having a circumferential recess therein; and a hollow pillar-shaped control gate surrounding an outer periphery of the floating gate and at least partially within the circumferential recess; and an inter-polysilicon insulating film residing in the circumferential recess between the control gate and the floating gate, wherein the inter-polysilicon insulating film resides between the floating gate and an upper surface, a lower surface, and a lateral side surface of the control gate, wherein the control gate faces the floating gate in the recess and the lateral side surface of the control gate does not face the island-shaped semiconductor in a vertical direction, and wherein the upper surface of the floating gate does not face the island-shaped semiconductor in the vertical direction.

2. The nonvolatile semiconductor memory transistor according to claim 1, further comprising a first insulating film on the substrate below the floating gate, wherein the first insulating film has a thickness that is greater than a thickness of at least one of the tunnel oxide film and the inter-polysilicon insulating film.

3. A nonvolatile semiconductor memory comprising the nonvolatile semiconductor memory transistor according to claim 1, wherein the nonvolatile semiconductor memory transistor includes a plurality of nonvolatile semiconductor memory transistors in a row direction among row and column directions of the substrate, and wherein a drain region of at least one of the plurality of nonvolatile semiconductor memory transistors is electrically connected to a second source line in a column direction among the row and column directions of the substrate.

* * * * *